United States Patent
Lin et al.

(10) Patent No.: US 12,389,664 B2
(45) Date of Patent: *Aug. 12, 2025

(54) TRANSISTOR GATES AND METHODS OF FORMING THEREOF

(71) Applicant: Taiwan Semiconductor Manufacturing Co., Ltd., Hsinchu (TW)

(72) Inventors: Shih-Yao Lin, New Taipei (TW); Chih-Han Lin, Hsinchu (TW); Shu-Uei Jang, Hsinchu (TW); Ya-Yi Tsai, Hsinchu (TW); Shu-Yuan Ku, Zhubei (TW)

(73) Assignee: Taiwan Semiconductor Manufacturing Co., Ltd., Hsinchu (TW)

(*) Notice: Subject to any disclaimer, the term of this patent is extended or adjusted under 35 U.S.C. 154(b) by 0 days.

This patent is subject to a terminal disclaimer.

(21) Appl. No.: 18/401,866

(22) Filed: Jan. 2, 2024

(65) Prior Publication Data
US 2024/0153827 A1 May 9, 2024

Related U.S. Application Data

(60) Continuation of application No. 17/869,590, filed on Jul. 20, 2022, now Pat. No. 11,894,277, which is a
(Continued)

(51) Int. Cl.
*H10D 84/03* (2025.01)
*H01L 21/28* (2025.01)
(Continued)

(52) U.S. Cl.
CPC ..... *H10D 84/038* (2025.01); *H01L 21/28123* (2013.01); *H10D 30/0243* (2025.01);
(Continued)

(58) Field of Classification Search
CPC ....... H01L 21/823864; H01L 21/28123; H01L 21/823821; H01L 21/823828;
(Continued)

(56) References Cited

U.S. PATENT DOCUMENTS 9,064,932 B1 6/2015 Pham et al.
9,105,490 B2 8/2015 Wang et al.
(Continued)

FOREIGN PATENT DOCUMENTS

CN 106409913 A 2/2017
CN 110600471 A 12/2019
(Continued)

*Primary Examiner* — Christine A Enad
(74) *Attorney, Agent, or Firm* — Slater Matsil, LLP

(57) ABSTRACT

A device includes a semiconductor substrate and a first gate stack over the semiconductor substrate, the first gate stack being between a first gate spacer and a second gate spacer. The device further includes a second gate stack over the semiconductor substrate between the first gate spacer and the second gate spacer and a dielectric material separating the first gate stack from the second gate stack. The dielectric material is at least partially between the first gate spacer and the second gate spacer, a first width of an upper portion of the dielectric material is greater than a second width of a lower portion of the dielectric material, and a third width of an upper portion of the first gate spacer is less than a fourth width of a lower portion of the first gate spacer.

20 Claims, 57 Drawing Sheets

Related U.S. Application Data division of application No. 16/871,514, filed on May 11, 2020, now Pat. No. 11,437,287.

(60) Provisional application No. 62/968,681, filed on Jan. 31, 2020.

(51) Int. Cl.
  *H10D 30/01* (2025.01)
  *H10D 64/01* (2025.01)
  *H10D 64/66* (2025.01)
  *H10D 84/01* (2025.01)
  *H10D 84/85* (2025.01)

(52) U.S. Cl.
  CPC ......... *H10D 64/017* (2025.01); *H10D 64/021* (2025.01); *H10D 64/671* (2025.01); *H10D 84/0172* (2025.01); *H10D 84/0184* (2025.01); *H10D 84/0193* (2025.01); *H10D 84/853* (2025.01)

(58) Field of Classification Search
  CPC ............. H01L 27/0924; H01L 29/4983; H01L 29/66545; H01L 29/6656; H01L 29/6681; H10D 30/0243; H10D 84/0181; H10D 84/0188
  See application file for complete search history.

(56) References Cited

U.S. PATENT DOCUMENTS

| | | | |
|---|---|---|---|
| 9,236,267 B2 | 1/2016 | De et al. | |
| 9,236,300 B2 | 1/2016 | Liaw | |
| 9,406,804 B2 | 8/2016 | Huang et al. | |
| 9,443,769 B2 | 9/2016 | Wang et al. | |
| 9,520,482 B1 | 12/2016 | Chang et al. | |
| 9,548,366 B1 | 1/2017 | Ho et al. | |
| 9,576,814 B2 | 2/2017 | Wu et al. | |
| 9,831,183 B2 | 11/2017 | Lin et al. | |
| 9,859,386 B2 | 1/2018 | Ho et al. | |
| 10,043,879 B1 | 8/2018 | Kim et al. | |
| 10,163,640 B1* | 12/2018 | Hsieh | H01L 21/823437 |
| 10,930,749 B2 | 2/2021 | Jeon et al. | |
| 11,437,287 B2* | 9/2022 | Lin | H01L 27/088 |
| 2011/0104894 A1 | 5/2011 | Kim et al. | |
| 2018/0138092 A1 | 5/2018 | Lee et al. | |
| 2018/0190652 A1 | 7/2018 | Ching et al. | |
| 2018/0240891 A1 | 8/2018 | Yu et al. | |
| 2018/0308949 A1 | 10/2018 | Lin et al. | |
| 2019/0067120 A1 | 2/2019 | Ching et al. | |
| 2019/0103325 A1* | 4/2019 | Huang | H01L 21/32134 |
| 2019/0164765 A1 | 5/2019 | Yeoh et al. | |
| 2019/0221431 A1 | 7/2019 | Hsieh et al. | |
| 2019/0252383 A1* | 8/2019 | Lin | H01L 21/823431 |
| 2019/0304976 A1 | 10/2019 | Zhu et al. | |
| 2019/0305099 A1 | 10/2019 | Jo et al. | |
| 2019/0363009 A1 | 11/2019 | Joe et al. | |
| 2019/0378914 A1 | 12/2019 | Huang et al. | |
| 2020/0083220 A1 | 3/2020 | Park et al. | |
| 2020/0083222 A1 | 3/2020 | Kim et al. | |
| 2020/0194277 A1 | 6/2020 | Dai et al. | |
| 2021/0111280 A1 | 4/2021 | Yang et al. | |
| 2021/0166977 A1 | 6/2021 | Wu et al. | |

FOREIGN PATENT DOCUMENTS

| | | |
|---|---|---|
| DE | 02018124814 A1 | 5/2019 |
| KR | 20110047879 A | 5/2011 |
| KR | 20180053803 A | 5/2018 |
| KR | 20180079160 | 7/2018 |
| KR | 20190049315 A | 5/2019 |
| KR | 20190055774 A | 5/2019 |
| KR | 20190112910 A | 10/2019 |
| KR | 20200050424 A | 5/2020 |

* cited by examiner

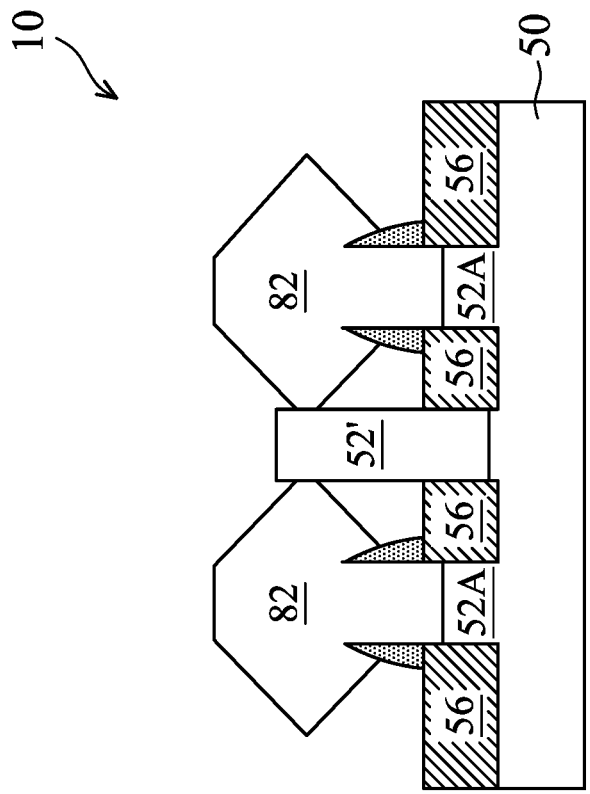
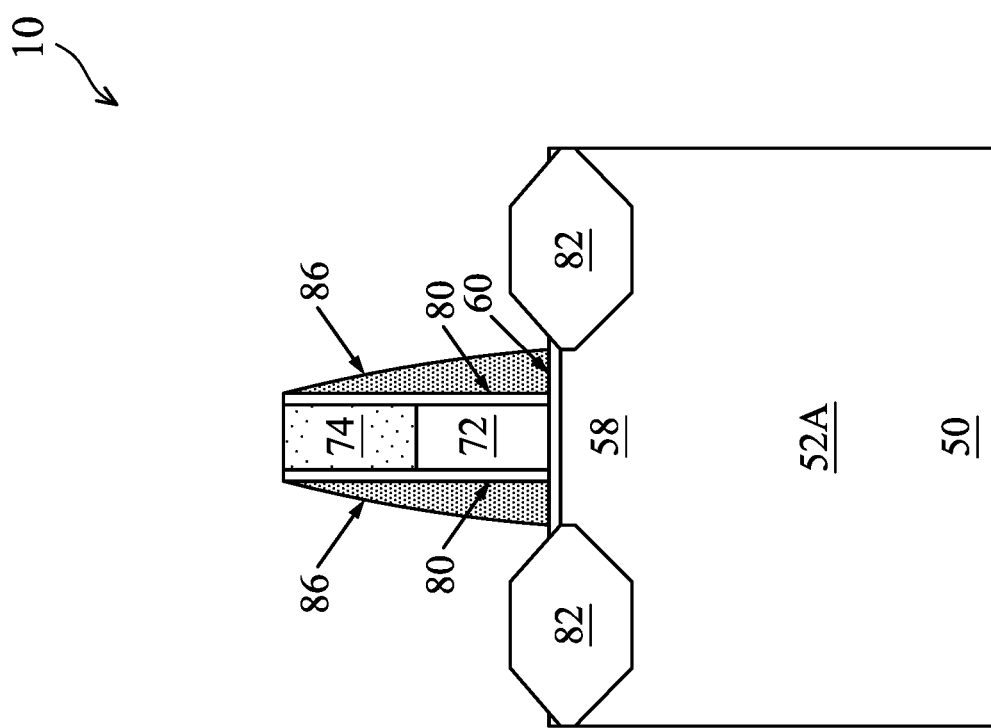
Figure 14C
Figure 14B

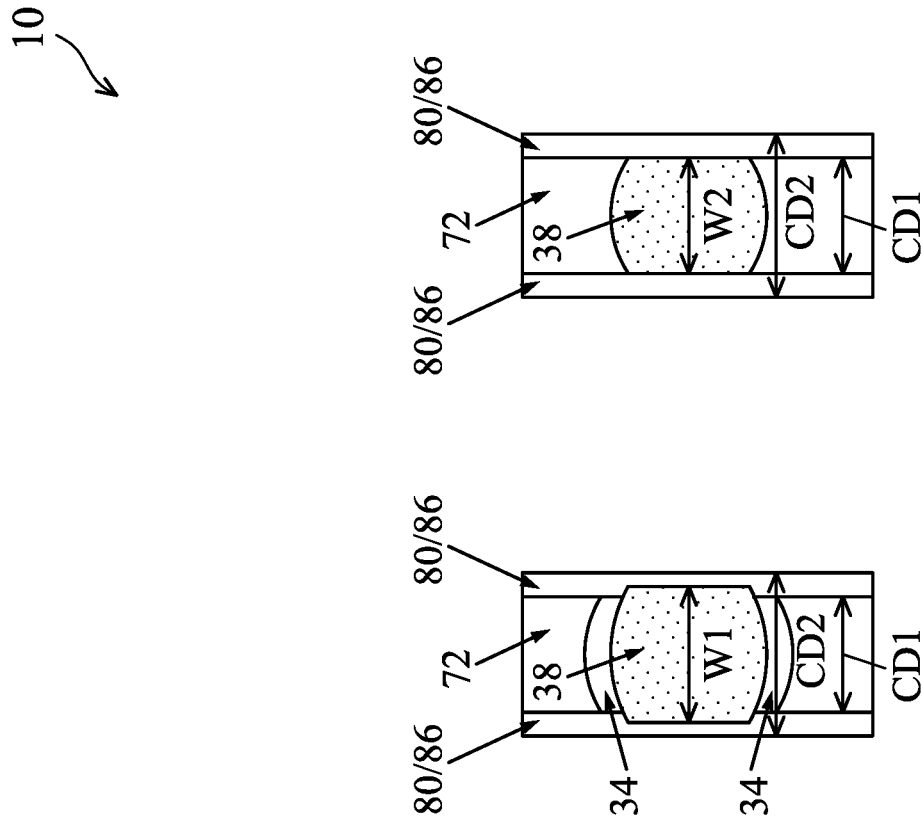
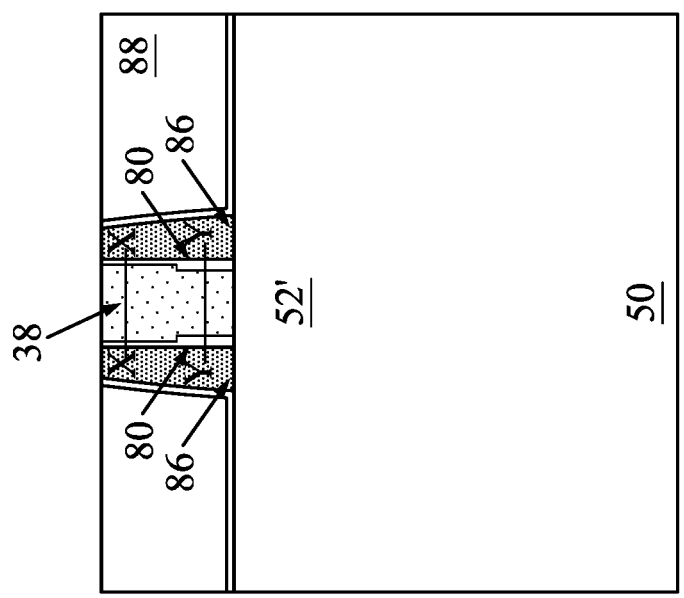
Figure 20B
Figure 20C
Figure 20D

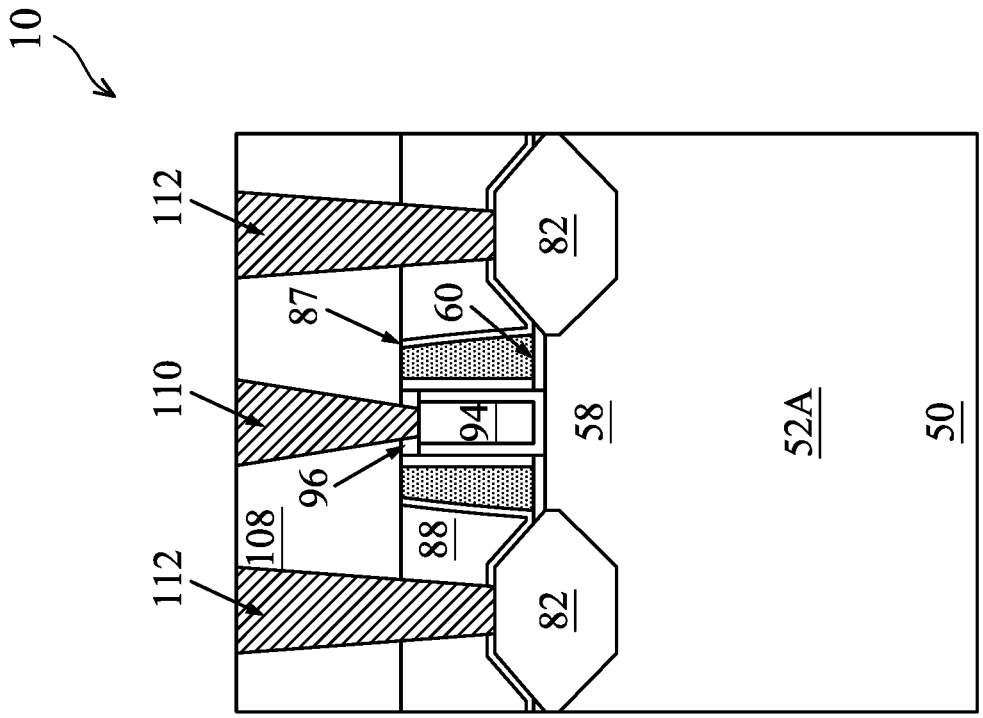
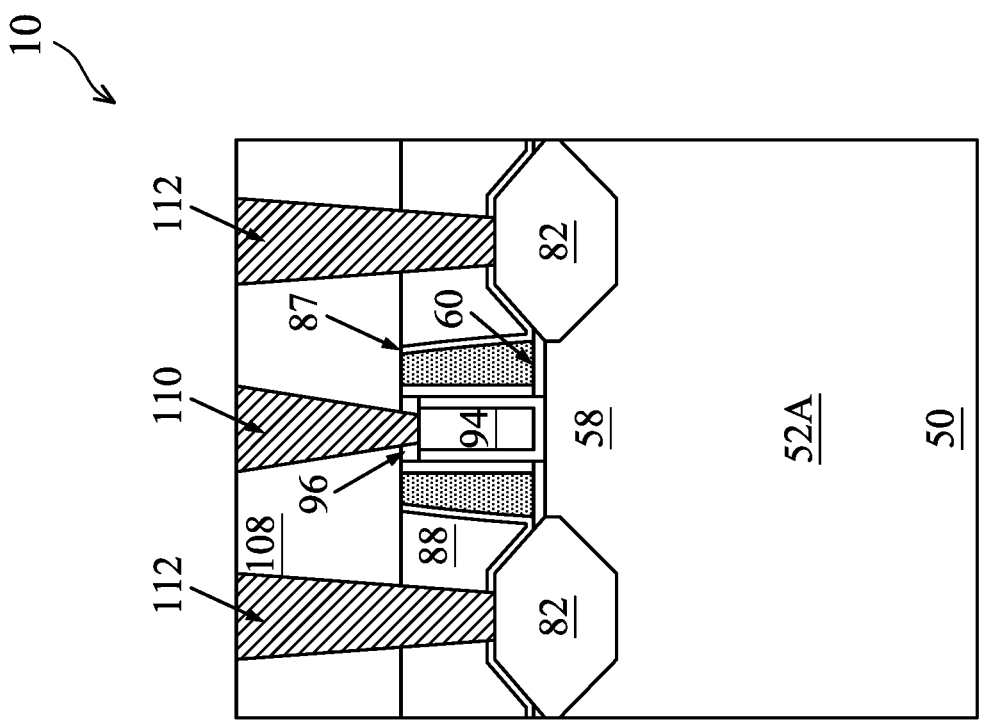

TRANSISTOR GATES AND METHODS OF FORMING THEREOF

PRIORITY CLAIM AND CROSS-REFERENCE

This application is a continuation of U.S. application Ser. No. 17/869,590, filed Jul. 20, 2022, which is a divisional of U.S. application Ser. No. 16/871,514, filed on May 11, 2020, now U.S. Pat. No. 11,437,287, which claims the benefit of U.S. Provisional Application No. 62/968,681, filed on Jan. 31, 2020, which application is hereby incorporated herein by reference.

BACKGROUND

Semiconductor devices are used in a variety of electronic applications, such as, for example, personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area. However, as the minimum features sizes are reduced, additional problems arise that should be addressed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 2, 3, 4, 5, 6, 7, 8, 9, 10, 11, 12A, 12B, 13A, 13B, 14A, 14B, 14C, 14D, 14E 15A, 15B, 16A, 16B, 17A, 17B, 18A, 18B, 19A, 19B, 20A, 20B, 20C, 20D, 21A, 21B, 22A, 22B, 22C, 22D, 22E, 23A, 23B, 23C, 24A, 24B, 25A, 25B, 26A, 26B, 26C, 27, 28A, 28B, 29A, 29B, 30A, 30B, 31A, 31B, 32A, and 32B are cross-sectional and top-down views of intermediate stages in the manufacturing of FinFETs, in accordance with some embodiments.

FIGS. 33A, 33B, 34A, 34B, 35A, 35B, 36A, 36B, 36C, 36D, 37A, 37B, 38A, and 38B are cross-sectional and top-down views of intermediate stages in the manufacturing of FinFETs, in accordance with some alternative embodiments.

DETAILED DESCRIPTION

Figure 1A:
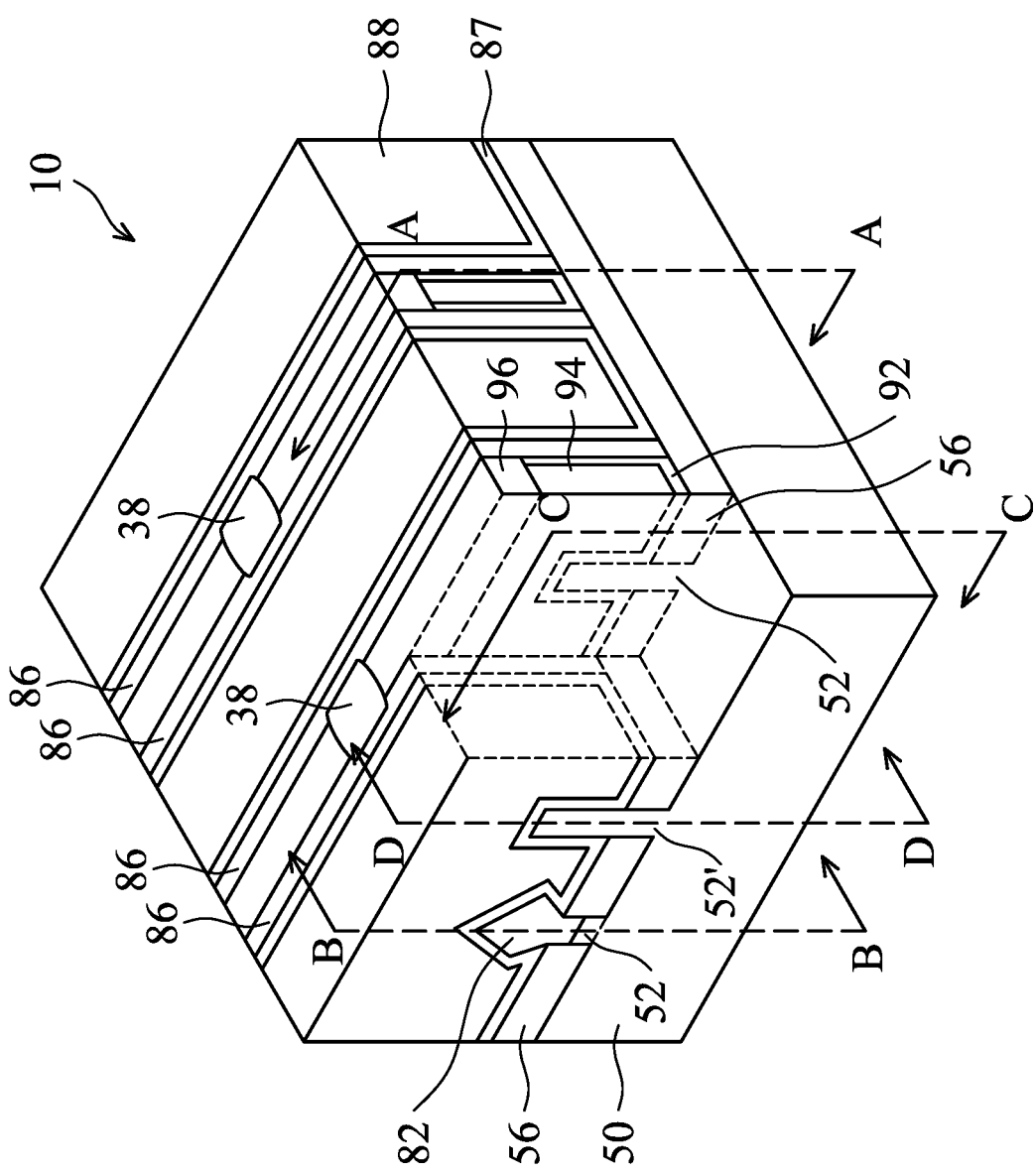
FIGS. 1A and 1B illustrate examples of FinFETs in a three-dimensional view, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Various embodiments are described herein as applied to a fin field effect transistor (FinFET). Embodiments may be applied to other transistor technologies, including NanosheetFET (NSFET, including gate all around field effect transistors (GAAFETs), nanowire FETs, nanosheet FETs, and the like), or the like.

In various embodiments, a dielectric material may be used to separate metal gates of adjacent transistors. The dielectric material may be formed by patterning an opening in a dummy gate stack or a metal gate stack and filling the dielectric material in the opening. In various embodiments, an upper portion of the opening may be widened, thereby improving a gap fill window of the dielectric material. For example, a small critical dimension may result in voids in the dielectric material, and these voids may be subsequently filled with undesirable materials (e.g., a metal gate material in cut dummy gate processes). By widening a gap fill window for the dielectric material, these voids can be reduced or eliminated. Further a lower portion of the opening may not be widened, and an effective gate width of the adjacent gate stacks may be maintained. In some embodiments, widening the upper portion of the opening may be achieved one or more cycles of treatment and etching processes. Accordingly, an atomic layer etch (ALE) type process may be achieved to control effective gate width and enlarge the dielectric material gap fill window. Manufacturing defects can be reduced, and device performance can be improved.

Figure 1B:
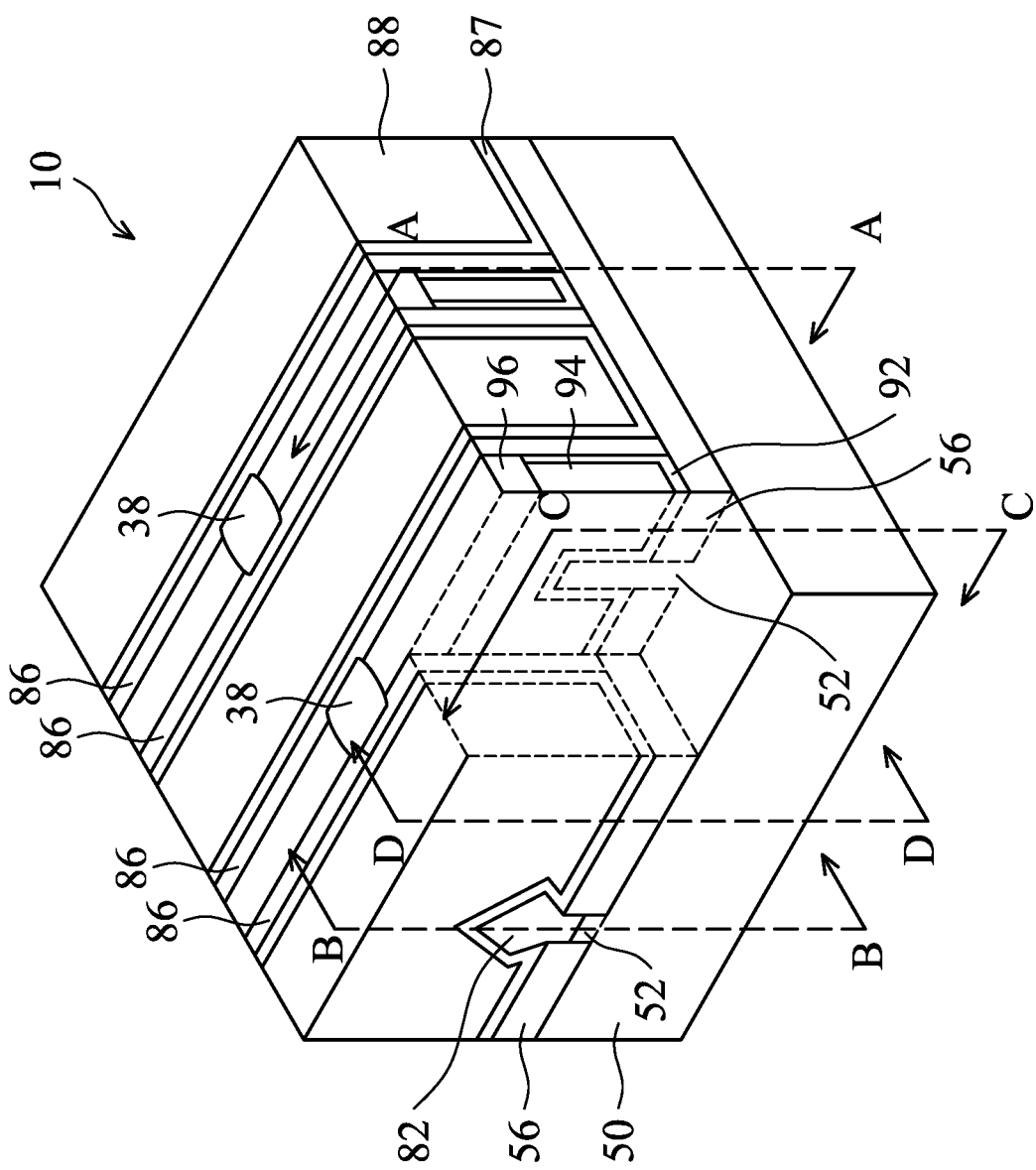

FIGS. 1A and 1B illustrates examples of a device 10 and device 20, respectively, in a three-dimensional view, in accordance with some embodiments. Each of the devices 10 and 20 comprises FinFETs and are similar where like reference numerals indicate like elements. Portions of the devices 10 and 20 are cut away to illustrate underlying features (e.g., features outlined with dashed lines). The devices 10 and 20 each comprises fins 52 on a substrate 50 (e.g., a semiconductor substrate). Isolation regions 56 are disposed in the substrate 50, and the fins 52 protrudes above and from between neighboring isolation regions 56. Although the isolation regions 56 are described/illustrated as being separate from the substrate 50, as used herein the term "substrate" may be used to refer to just the semiconductor substrate or a semiconductor substrate inclusive of isolation regions. Additionally, although the fins 52 is illustrated as a single, continuous material as the substrate 50, the fin 52 and/or the substrate 50 may comprise a single material or a plurality of materials. In this context, the fins 52A refers to the portion extending between the neighboring isolation regions 56. As illustrated in FIG. 1A, the device 10 further includes a dummy fin 52' between adjacent fins 52. The dummy fin 52' is optional and may be omitted, such as in the device 20 as illustrated by FIG. 1B.

A gate dielectric layer 92 is along sidewalls and over a top surface of the fins 52, gate electrodes 94 are over the gate dielectric layer 92, and a gate mask layer 96 is over the gate electrodes 94. The gate dielectric layer 92, gate electrodes 94, and gate mask layer 96 may also be disposed on sidewalls of the dummy channel regions 52'. One or more layers of gate spacers 86 may be on sidewalls of the gate dielectric layer 92, the gate electrodes 94, and the gate mask layer 96. Source/drain regions 82 are disposed in opposite sides of the fin 52A with respect to the gate dielectric layer 92, the gate electrodes 94, and the gate mask layer 96. The dummy fin 52' may be disposed between and physically separate adjacent source/drain regions 82. The source/drain regions 82 may also extend from a recessed portion of the fin 52A.

Dielectric material 38 extend through the gate mask layers 96 into the gate electrodes 94. In the device 10 of FIG. 1A, the dielectric material 38 may extend to the dummy fin 52', and a combination of the dielectric material 38 and the dummy fin 52' may isolate gate electrodes of adjacent FinFETs (see e.g., FIG. 30A). In the device 20 of FIG. 1B, the dielectric material 38 may extend to isolation regions 56 to isolate gate electrodes of adjacent FinFETs (see e.g., FIG. 32A). A contact etch stop layer (CESL) 87 is disposed over the isolation regions 56, and a dielectric layer 88 is disposed over the CESL 87. The dielectric layer 88 may further surround the source/drain regions 82, portions of the dummy fin 52' (if present), the gate mask layer 96, the gate dielectric layer 92, and the gate electrodes 94.

FIGS. 1A and 1B further illustrate reference cross-sections that are used in later figures. Cross-section A-A is along a longitudinal axis of the gate electrode 94 and in a direction, for example, perpendicular to the direction of current flow between the source/drain regions 82 of the FinFET. Cross-section B-B is perpendicular to cross-section A-A and is along a longitudinal axis of the fin 52 and in a direction of, for example, a current flow between the source/drain regions 82 of the FinFET. Cross-section B-B extends through a source/drain region of the FinFET. Cross-section C-C is parallel to cross-section A-A and extends through the source/drain region of the FinFET. Subsequent figures refer to these reference cross-sections for clarity. Cross-section D-D is parallel to cross-section B-B. In FIG. 1A, cross-section D-D extends through a dummy fin of the FinFET, and in FIG. 1B, cross-section D-D extends through an analogous location of the FinFET as FIG. 1A.

Some embodiments discussed herein are discussed in the context of FinFETs formed using a gate-last process. In other embodiments, a gate-first process may be used. Also, some embodiments contemplate aspects used in planar devices, such as planar FETs, in NSFETs, or the like.

FIGS. 2 through 38B are cross-sectional views of intermediate stages in the manufacturing of FinFETs, in accordance with some embodiments. FIGS. 2 through 11, 12A, 13A, 14A, 15A, 16A, 17A, 18A, 19A, 21A, 24A, 25A, 26A, 27, 28A, 29A, 30A, 31A, 32A, 33A, 34A, 35A, 36A, 37A, and 38A illustrate reference cross-section A-A illustrated in FIGS. 1A/1B, except for multiple fins/FinFETs. FIGS. 12B, 13B, 14B, 15B, 16B, 24B, 25B, 26B, 26C, 28B, 29B, 30B, 31B, 32B, 37B, and 38B are illustrated along a similar cross-section B-B illustrated in FIGS. 1A/1B, except for multiple fins/FinFETs. FIGS. 14C, 14D, and 14E are illustrated along reference cross-section C-C illustrated in FIG. 1, except for multiple fins/FinFETs. FIGS. 17B, 18B, 19B, 20B, 21B, 22A, 23A, 23B, 23C, 33B, 34B, 35B, and 36B are illustrated along reference cross-section D-D illustrated in FIGS. 1A/1B, except for multiple fins/FinFETs.

Figure 2:
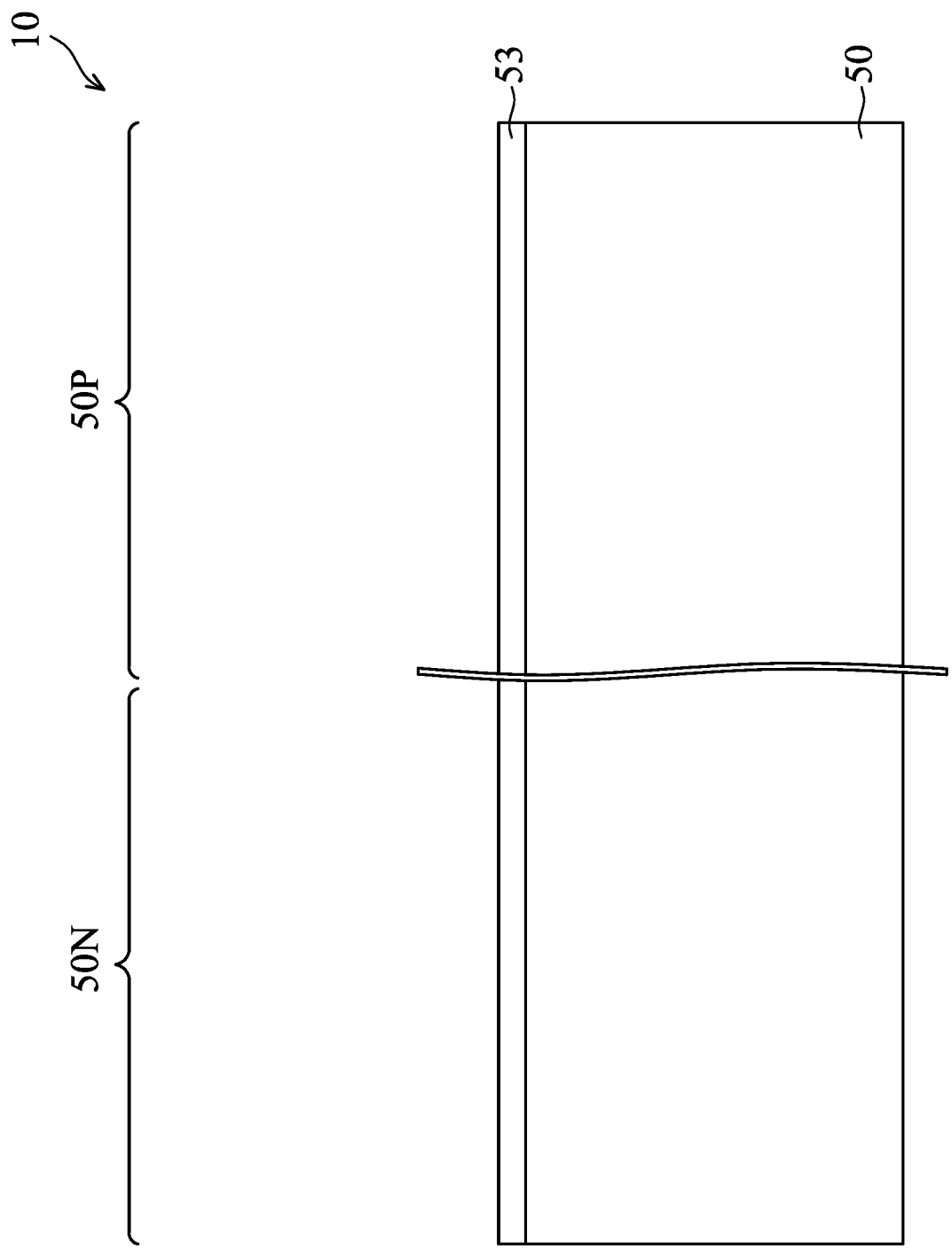

In FIG. 2, a substrate 50 is provided. The substrate 50 may be a semiconductor substrate, such as a bulk semiconductor, a semiconductor-on-insulator (SOI) substrate, or the like, which may be doped (e.g., with a p-type or an n-type dopant) or undoped. The substrate 50 may be a wafer, such as a silicon wafer. Generally, an SOI substrate is a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrate 50 may include silicon; germanium; a compound semiconductor including silicon carbide, gallium arsenide, gallium phosphide, indium phosphide, indium arsenide, and/or indium antimonide; an alloy semiconductor including silicon-germanium, gallium arsenide phosphide, aluminum indium arsenide, aluminum gallium arsenide, gallium indium arsenide, gallium indium phosphide, and/or gallium indium arsenide phosphide; or combinations thereof.

The substrate 50 has a region 50N and a region 50P. The region 50N can be for forming n-type devices, such as NMOS transistors, e.g., n-type FinFETs. The region 50P can be for forming p-type devices, such as PMOS transistors, e.g., p-type FinFETs. The region 50N may be physically separated from the region 50P (as illustrated by divider 51), and any number of device features (e.g., other active devices, doped regions, isolation structures, etc.) may be disposed between the region 50N and the region 50P.

A hard mask 53 is deposited on the substrate 50. The hard mask 53 may be used to define a pattern of subsequently formed semiconductor fins. In some embodiments, the hard mask is deposited using physical vapor deposition (PVD), chemical vapor deposition (CVD), atomic layer deposition (ALD), or the like. The hard mask 53 may comprise silicon oxide, silicon nitride, silicon oxynitride, a metal oxide, a metal nitride, multilayers thereof, or the like. For example, although only one hard mask layer is illustrated, a multilayer structure (e.g., a layer of silicon oxide on a layer of silicon nitride) may be formed as the hard mask 53.

FIGS. 3 through 32B illustrate various additional steps in the manufacturing of embodiment devices. FIGS. 3 through 32B illustrate features in either of the region 50N and the region 50P. For example, the structures illustrated in FIGS. 3 through 32B may be applicable to both the region 50N and the region 50P. Differences (if any) in the structures of the region 50N and the region 50P are described in the text accompanying each figure.

Figure 3:
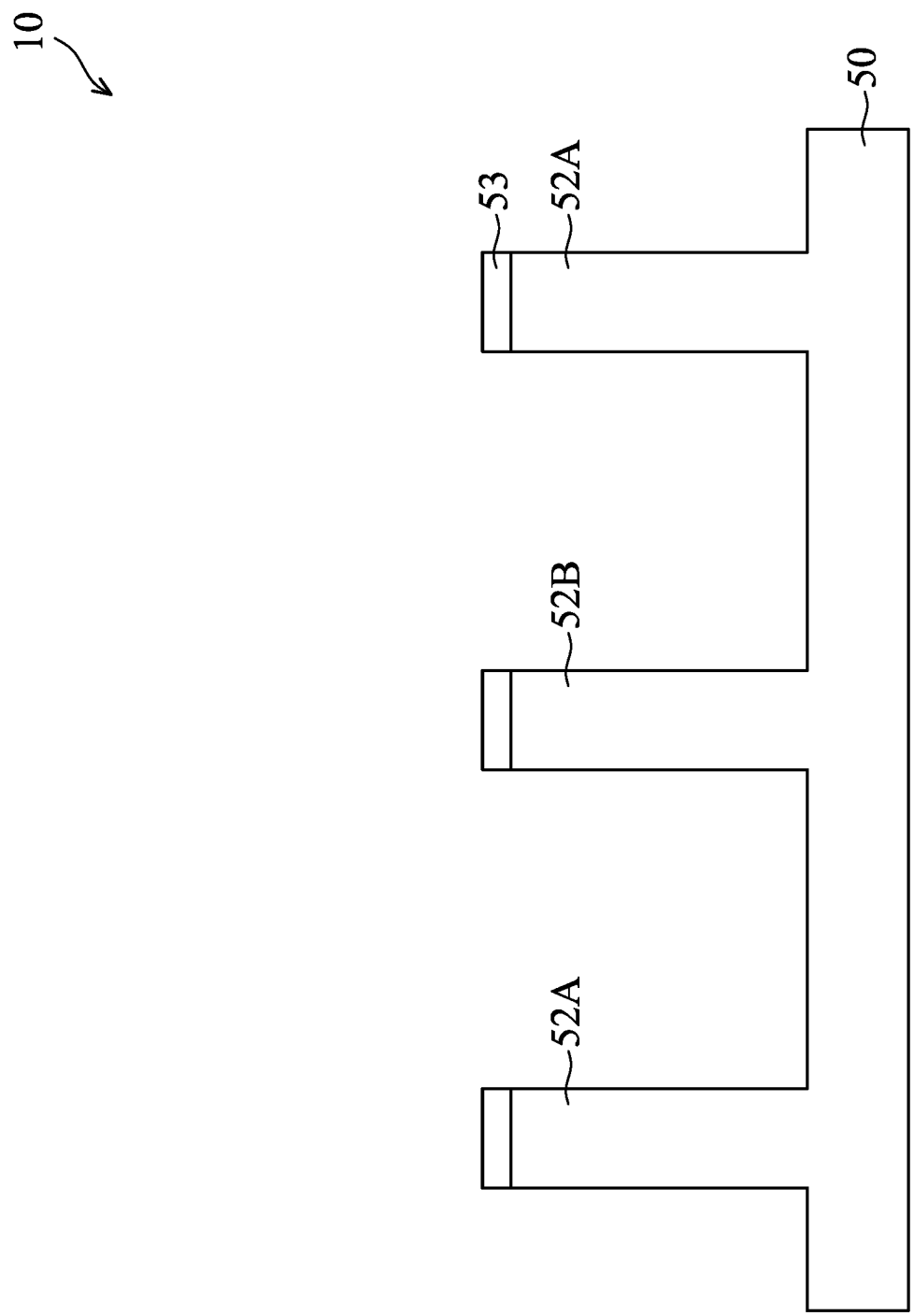

FIGS. 3 through 7 illustrate cross-sectional views (e.g., along cross-section A-A of FIG. 1A) of manufacturing semiconductor fins and dummy fins according to various embodiments. The formation of dummy fins is optional and may be omitted in other embodiments (e.g., as illustrated by FIG. 1B). In FIG. 3, fins 52A and 52B are formed in the substrate 50. The fins 52A/52B are semiconductor strips. The fins 52A/52B include a fin 52B between fins 52A. As will be described in subsequent figures, the fin 52B may be optionally removed and replaced with a dummy fin 52' (see FIG. 6).

In some embodiments, the fins 52A may be formed in the substrate 50 by etching trenches in the substrate 50. The etching may be any acceptable etch process, such as a reactive ion etch (RIE), neutral beam etch (NBE), the like, or a combination thereof. The etch may be anisotropic.

The fins may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins. In some embodiments, the mask (or other layer) may remain on the fins 52A/52B.

Figure 4:
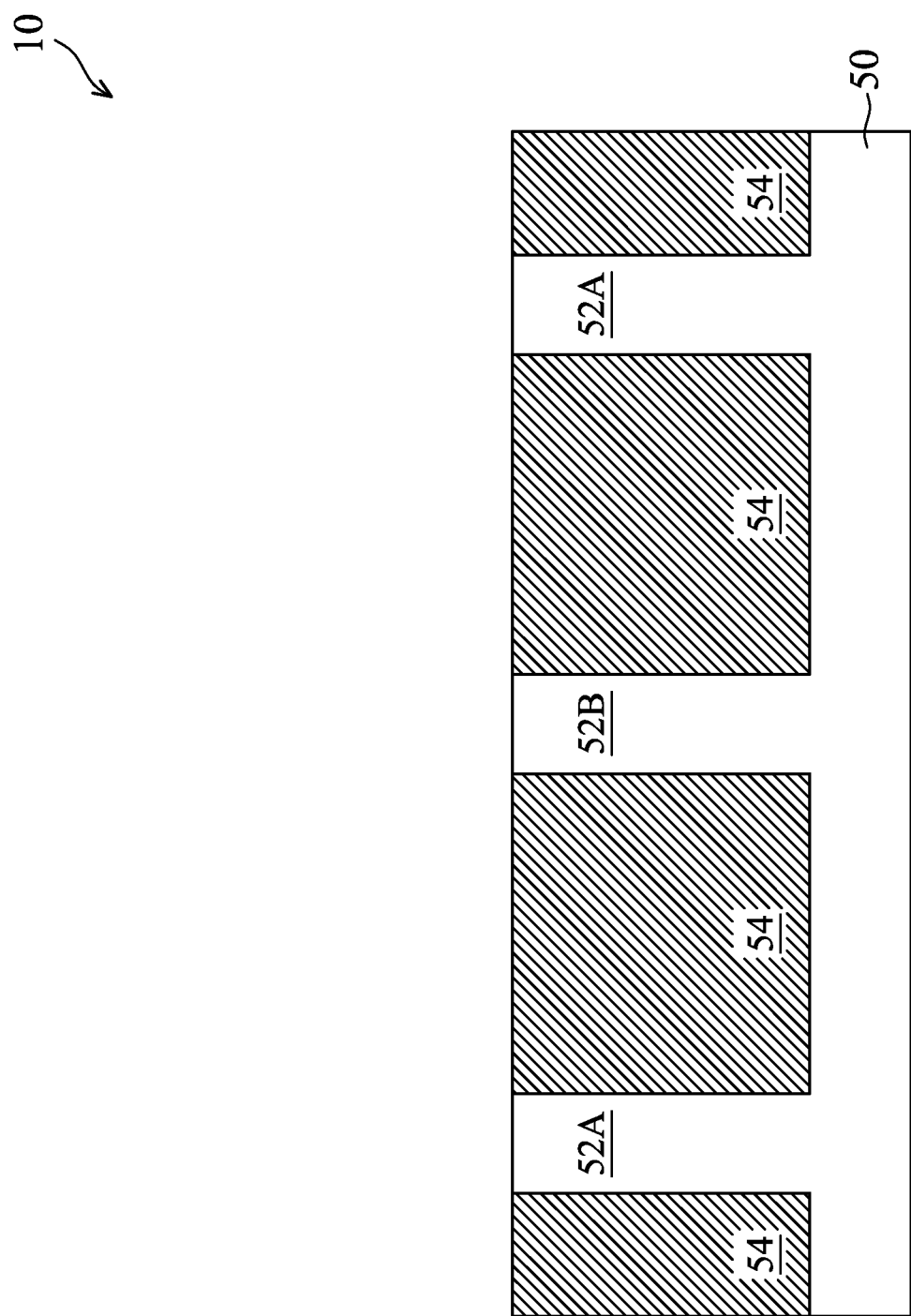

In FIG. 4, an insulation material 54 is formed over the substrate 50 and between neighboring fins 52A/52B. The insulation material 54 may be an oxide, such as silicon oxide, a nitride, the like, or a combination thereof, and may be formed by a high density plasma chemical vapor deposition (HDP-CVD), a flowable CVD (FCVD) (e.g., a CVD-based material deposition in a remote plasma system and post curing to make it convert to another material, such as an oxide), the like, or a combination thereof. Other insulation materials formed by any acceptable process may be used. In the illustrated embodiment, the insulation material 54 is silicon oxide formed by a FCVD process. An anneal process may be performed once the insulation material is formed. In an embodiment, the insulation material 54 is formed such that excess insulation material 54 covers the fins 52A/52B. Although the insulation material 54 is illustrated as a single layer, some embodiments may utilize multiple layers. For example, in some embodiments a conformal liner (not shown) may first be formed along a surface of the substrate 50 and the fins 52A/52B. Thereafter, a fill material, such as those discussed above may be formed over the liner.

After deposition, a removal process is applied to the insulation material 54 to remove excess insulation material 54 over the fins 52A/52B. In some embodiments, a planarization process such as a chemical mechanical polish (CMP), an etch-back process, combinations thereof, or the like may be utilized. The planarization process exposes the fins 52A/52B such that top surfaces of the fins 52A/52B and the insulation material 54 are level after the planarization process is complete. In embodiments in which mask 53 remains on the fins 52A/52B, the planarization process may expose the mask 53 or remove the mask 53 such that top surfaces of the mask or the fins 52A/52B, respectively, and the insulation material 54 are level after the planarization process is complete.

Figure 5:
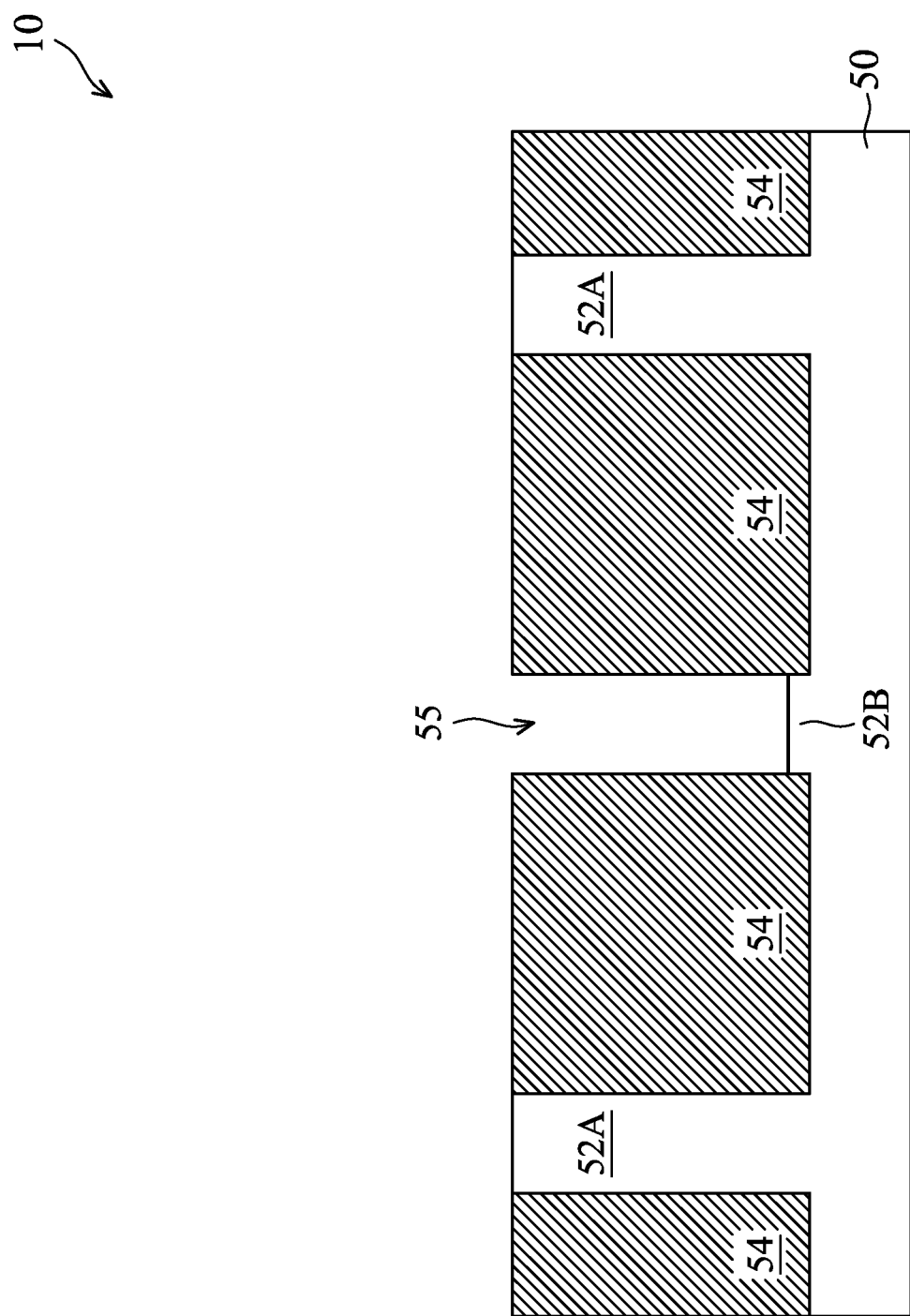

In FIG. 5, at least a portion of the fin 52B is removed using an acceptable etching process, for example. Thus, an opening 55 is formed in the isolation material 54 between the fins 52A. In subsequent processes, a dummy channel region may be formed in the opening 55. The fin 52B may be completely removed or a portion of the fin 52B may remain under the opening 55.

Figure 6:
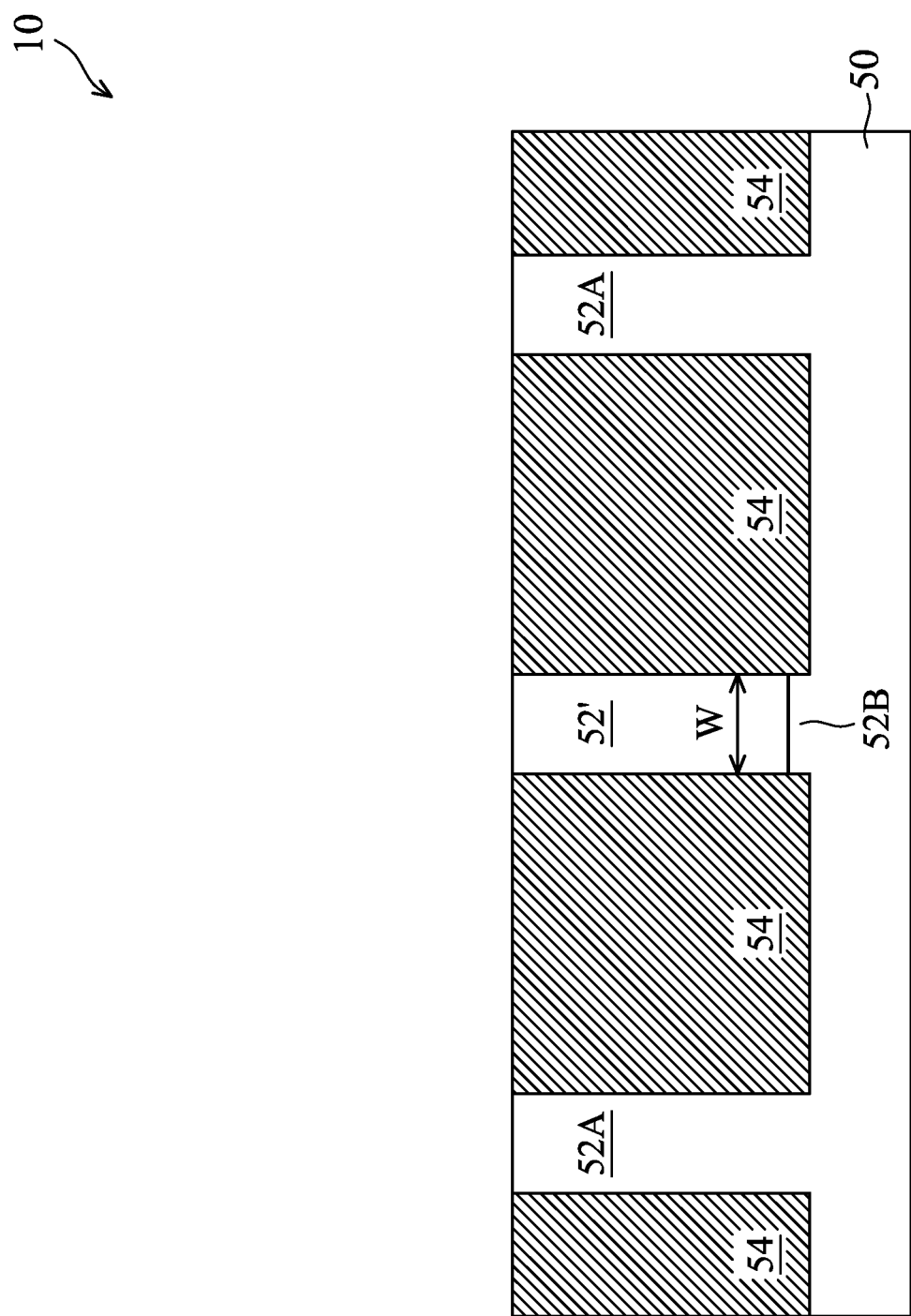

In FIG. 6, a dummy fin 52' is formed in the opening 55. The dummy fin 52' may comprise one or more layers of a silicon-based material (e.g., SiN, SiON, SiOCN, SiC, SiOC, $SiO_2$, or the like), a metal-based material (e.g., a metal oxide, metal nitride, or the like such as TaN, TaO, HfO, or the like), and/or the like. Although FIG. 6 illustrates the dummy fin 52' as being a single material, the dummy fin 52' may comprise multiple layers of materials, which may be stacked vertically and/or horizontally. For example, in some embodiments, a first layer of the dummy fin 52' may line sidewalls and a lateral surface of a second layer of the dummy fin 52'. As a further example, a third layer of the dummy fin 52' may be disposed on top of the second layer of the dummy fin 52'. In some embodiments, a width W of the dummy fin 52' may be in the range of about 5 Å to about 500 Å.

The dummy fin 52' may be formed using one or more deposition processes, such as CVD, plasma enhanced CVD (PECVD), plasma enhanced ALD (PEALD), ALD, PVD, or the like. In embodiments where the dummy fin 52' comprises a multilayer structure, forming the dummy fin 52' may also include one or more etch back and/or planarization steps before additional material layer(s) of the dummy fin 52' are deposited. Further, the dummy fin 52' may be deposited to initially cover the insulation material 54, and a planarization, etch back, or the like process may be used to remove excess portions of the dummy fin 52' and expose the insulation material 54.

Figure 7:
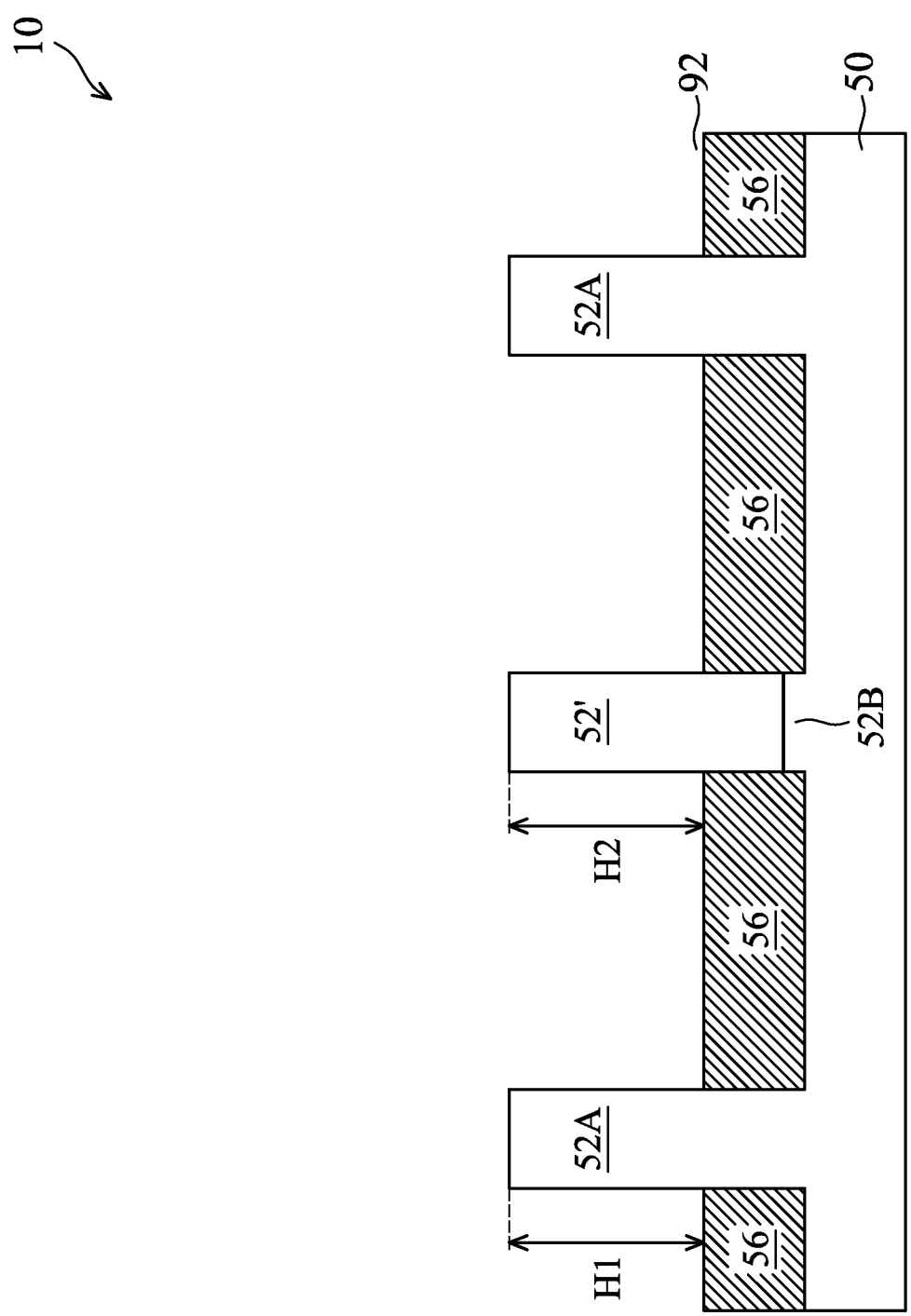

In FIG. 7, the insulation material 54 is recessed to form Shallow Trench Isolation (STI) regions 56. The insulation material 54 is recessed such that upper portions of fins 52A and the dummy fin 52' protrude from between neighboring STI regions 56. Further, the top surfaces of the STI regions 56 may have a flat surface as illustrated, a convex surface, a concave surface (such as dishing), or a combination thereof. The top surfaces of the STI regions 56 may be formed flat, convex, and/or concave by an appropriate etch. The STI regions 56 may be recessed using an acceptable etching process, such as one that is selective to the material of the insulation material 54 (e.g., etches the material of the insulation material 54 at a faster rate than the material of the fins 52). For example, an oxide removal using, for example, dilute hydrofluoric (dHF) acid may be used. Recessing the insulation material 54 may use a process that is selectively etches the insulation material 54 compared to the dummy fin 52' (if present).

The process described with respect to FIGS. 2 through 7 is just one example of how the fins 52A may be formed. In some embodiments, the fins may be formed by an epitaxial growth process. For example, a dielectric layer can be formed over a top surface of the substrate 50, and trenches can be etched through the dielectric layer to expose the underlying substrate 50. Homoepitaxial structures can be epitaxially grown in the trenches, and the dielectric layer can be recessed such that the homoepitaxial structures protrude from the dielectric layer to form fins. Additionally, in some embodiments, heteroepitaxial structures can be used for the fins 52A. For example, the fins 52A in FIG. 7 can be recessed, and a material different from the fins 52A may be epitaxially grown over the recessed fins 52A. In such embodiments, the fins 52A comprise the recessed material as well as the epitaxially grown material disposed over the recessed material. In an even further embodiment, a dielectric layer can be formed over a top surface of the substrate 50, and trenches can be etched through the dielectric layer. Heteroepitaxial structures can then be epitaxially grown in the trenches using a material different from the substrate 50, and the dielectric layer can be recessed such that the heteroepitaxial structures protrude from the dielectric layer to form the fins 52A. In some embodiments where homoepitaxial or heteroepitaxial structures are epitaxially grown, the epitaxially grown materials may be in situ doped during growth, which may obviate prior and subsequent implantations although in situ and implantation doping may be used together.

Still further, it may be advantageous to epitaxially grow a material in region 50N (e.g., an NMOS region) different from the material in region 50P (e.g., a PMOS region). In various embodiments, upper portions of the fins 52A may be formed from silicon-germanium ($Si_xGe_{1-x}$, where x can be in the range of 0 to 1), silicon carbide, pure or substantially pure germanium, a III-V compound semiconductor, a II-VI compound semiconductor, or the like. For example, the available materials for forming III-V compound semiconductor include, but are not limited to, indium arsenide, aluminum arsenide, gallium arsenide, indium phosphide, gallium nitride, indium gallium arsenide, indium aluminum arsenide, gallium antimonide, aluminum antimonide, aluminum phosphide, gallium phosphide, and the like.

Further in FIG. 7, appropriate wells (not shown) may be formed in the fins 52A and/or the substrate 50. In some embodiments, a P well may be formed in the region 50N, and an N well may be formed in the region 50P. In some embodiments, a P well or an N well are formed in both the region 50N and the region 50P.

In the embodiments with different well types, the different implant steps for the region 50N and the region 50P may be achieved using a photoresist or other masks (not shown). For example, a photoresist may be formed over the fins 52A and the STI regions 56 in the region 50N. The photoresist is patterned to expose the region 50P of the substrate 50, such as a PMOS region. The photoresist can be formed by using a spin-on technique and can be patterned using acceptable photolithography techniques. Once the photoresist is patterned, an n-type impurity implant is performed in the region 50P, and the photoresist may act as a mask to substantially prevent n-type impurities from being implanted into the region 50N, such as an NMOS region. The n-type impurities may be phosphorus, arsenic, antimony, or the like implanted in the region to a concentration of equal to or less than $10^{18}$ $cm^{-3}$, such as between about $10^{16}$ $cm^{-3}$ and about $10^{18}$ $cm^{-3}$. After the implant, the photoresist is removed, such as by an acceptable ashing process.

Following the implanting of the region 50P, a photoresist is formed over the fins 52A and the STI regions 56 in the region 50P. The photoresist is patterned to expose the region 50N of the substrate 50, such as the NMOS region. The photoresist can be formed by using a spin-on technique and can be patterned using acceptable photolithography techniques. Once the photoresist is patterned, a p-type impurity implant may be performed in the region 50N, and the photoresist may act as a mask to substantially prevent p-type impurities from being implanted into the region 50P, such as the PMOS region. The p-type impurities may be boron, boron fluoride, indium, or the like implanted in the region to a concentration of equal to or less than $10^{18}$ $cm^{-3}$, such as between about $10^{16}$ $cm^{-3}$ and about $10^{18}$ $cm^{-3}$. After the implant, the photoresist may be removed, such as by an acceptable ashing process.

After the implants of the region 50N and the region 50P, an anneal may be performed to repair implant damage and to activate the p-type and/or n-type impurities that were implanted. In some embodiments, the grown materials of epitaxial fins may be in situ doped during growth, which may obviate the implantations, although in situ and implantation doping may be used together.

In the embodiment of FIG. 7, the dummy fin 52' is illustrated as having a top surface that is substantially level (e.g., within manufacturing tolerances) with a top surface of the fins 52A. For example, a height H1 that the fins 52A extend above the STI regions 56 is equal to a height H2 that the dummy fin 52' extends above the STI regions 56. Other configurations are also possible. For example, the height H1 may be less than or greater than the height H2, and a top surface of the dummy fin 52' may be higher than or lower than a top surface of the fins 52A.

Figure 8:
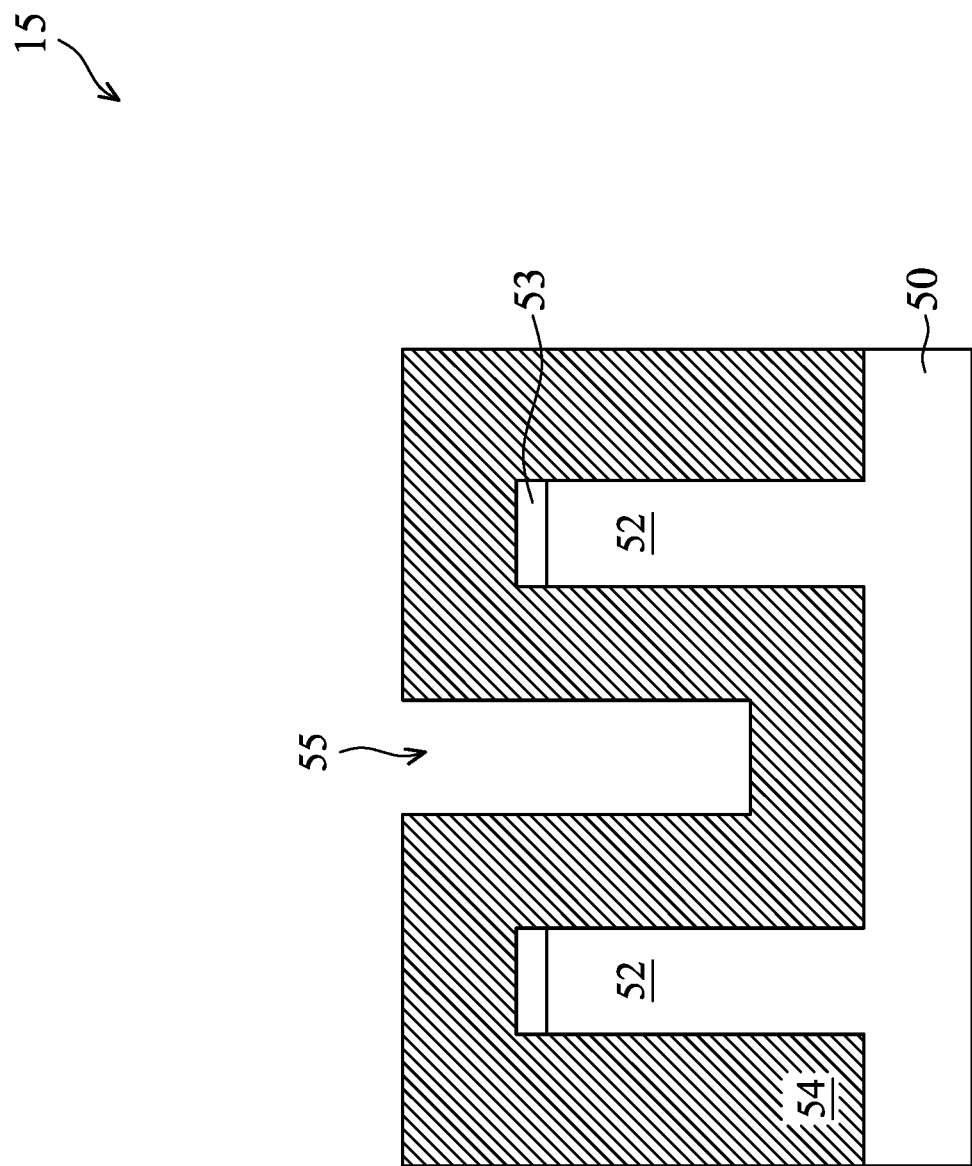
Figure 9:
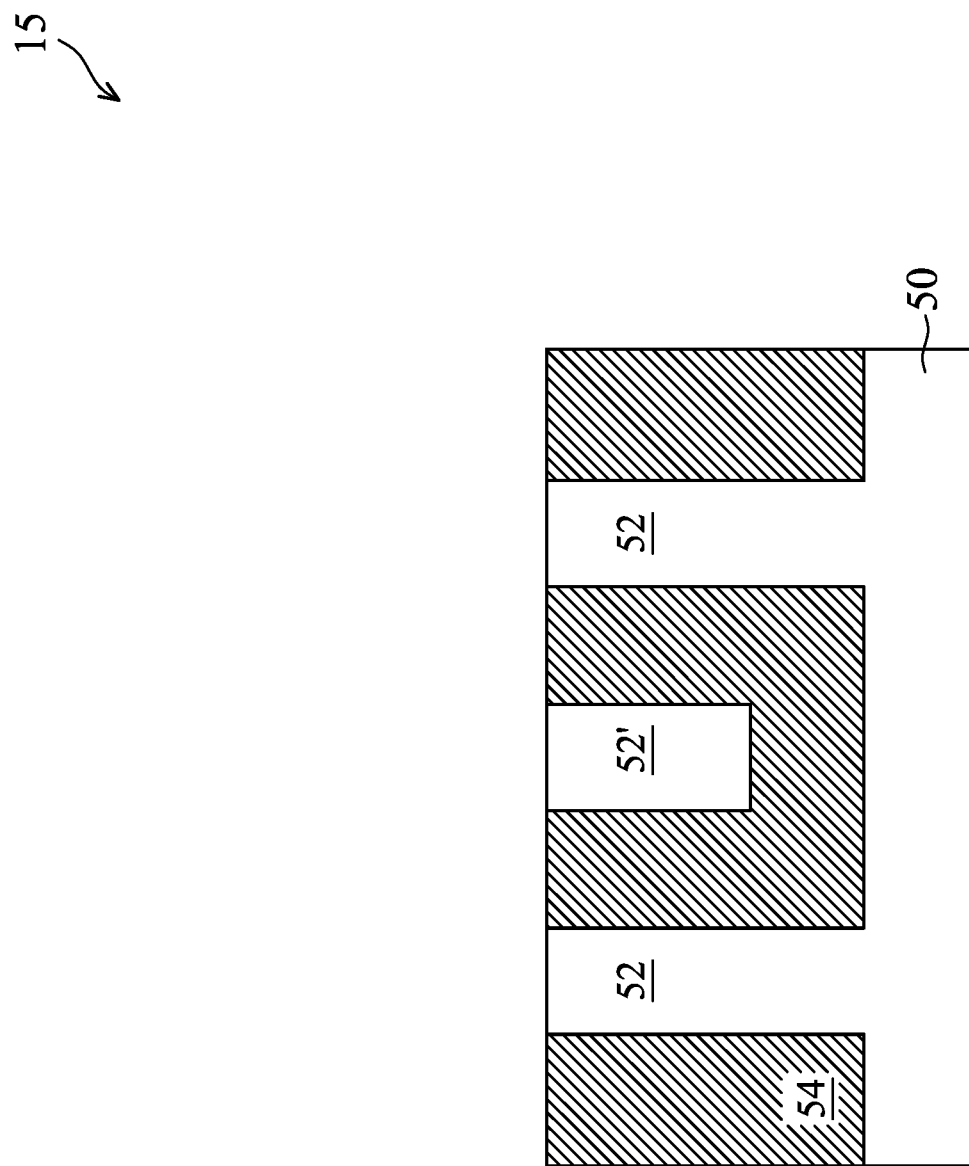
Figure 10:
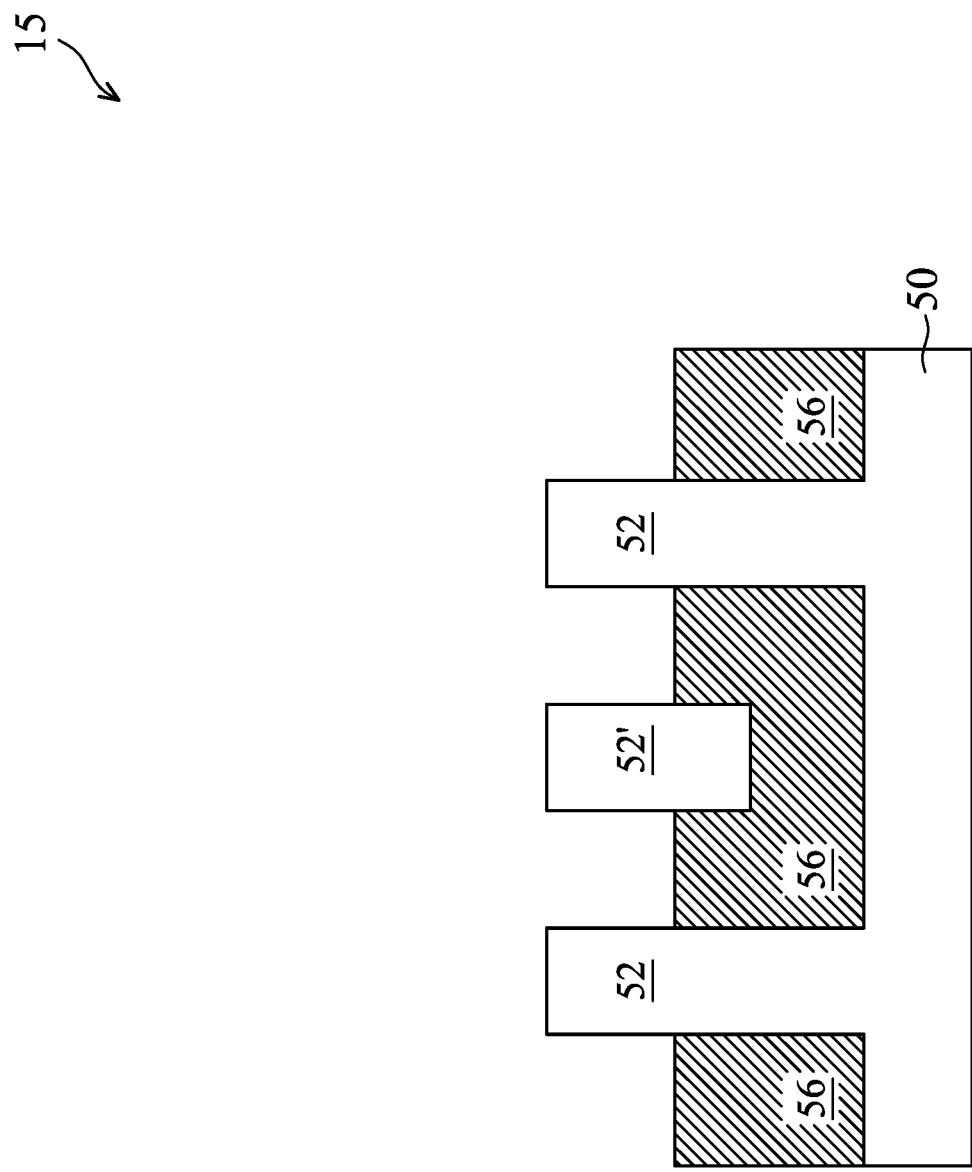

FIGS. 3 through 7 illustrate just one example of how dummy fins 52' may be formed. Other methods are also possible. For example, FIGS. 8 through 10 illustrate intermediate steps of forming dummy fin 52' in a device 15 according to alternative embodiments. In FIGS. 8 through 10, like reference numbers indicate like elements formed using like processes as the features described above in FIGS. 3 through 7. In FIGS. 8, fins 52 are formed extending from a substrate 50 using a similar process as described above in FIG. 2, for example. A hard mask 53, is used to pattern the fins 52, and may remain on the fins 52.

As also illustrated by FIG. 8, an insulation material 54 is deposited over and along sidewalls of the fins 52. The insulation material 54 may be deposited using a conformal process, which only partially fills a space between the fins 52. As a result of the deposition process, the opening 55 is defined between the fins 52 and over the insulation material 54. One or more materials may be subsequently filled in the opening 55 for forming a dummy fin 52'

In FIG. 9, a dummy fin 52' is formed in the opening 55. The dummy fin 52' may be disposed between fins 52, and the dummy fin 52' may be embedded in the insulation material 54. For example, the insulation material 54 may contact a bottom surface and sidewalls of the dummy fin 52'. Forming the dummy fin 52' may be performed using a similar process as described above with respect to FIG. 6.

In FIG. 10, the insulation material 56 is etched back to expose sidewalls of the fins 52, expose sidewalls of the dummy fin 52', and define STI region 56. Etching back the insulation material 54 may be performed using a similar process as described above with respect to FIG. 7. Accordingly, a method of forming the dummy fin 52' may be completed according to alternative embodiments. Subsequent description of additional processes may be applied to either the device 10 (as illustrated by FIG. 7) or the device 15 (as illustrated by FIG. 10).

Figure 11:
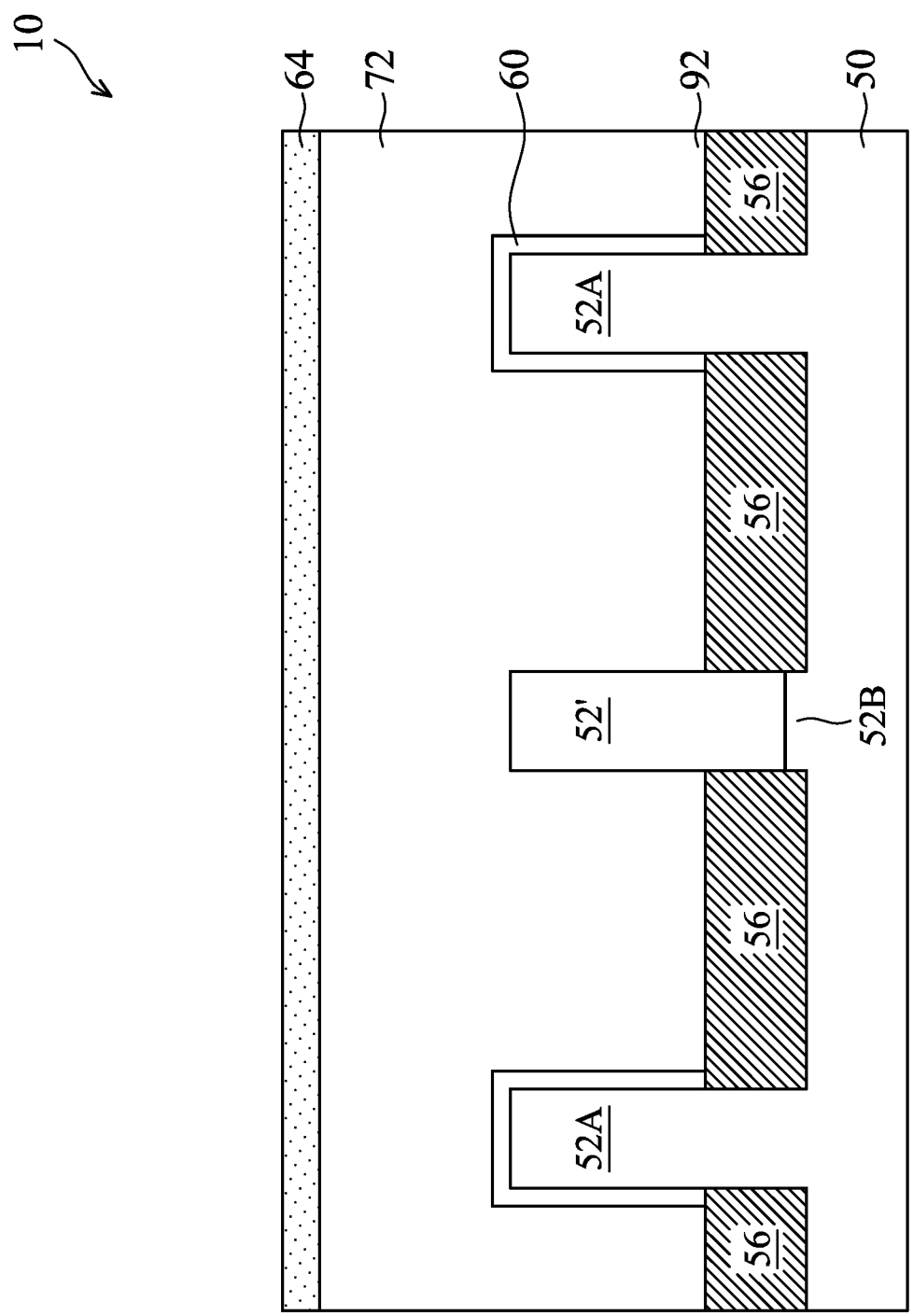

FIGS. 11 through 31B illustrate cross-sectional views of additional steps of manufacturing the device 10. It should be understood that these steps may also be applied to the device 15 (as illustrated by FIG. 10) or the device 20 (see FIG. 1B). In FIG. 11, a dummy dielectric layer 60 is formed on the fins 52A and the dummy fin 52' in the device 10. The dummy dielectric layer 60 may be, for example, silicon oxide, silicon nitride, a combination thereof, or the like, and may be deposited or thermally grown according to acceptable techniques.

A dummy gate layer 62 is formed over the dummy dielectric layer 60, and a mask layer 64 is formed over the dummy gate layer 62. The dummy gate layer 62 may be deposited over the dummy dielectric layer 60 and then planarized, such as by a CMP. The mask layer 64 may be deposited over the dummy gate layer 62. The dummy gate layer 62 may be a conductive or non-conductive material and may be selected from a group including amorphous silicon, polycrystalline-silicon (polysilicon), poly-crystalline silicon-germanium (poly-SiGe), metallic nitrides, metallic silicides, metallic oxides, and metals. The dummy gate layer 62 may be deposited by physical vapor deposition (PVD), CVD, sputter deposition, or other techniques known and used in the art for depositing the selected material. The dummy gate layer 62 may be made of other materials that have a high etching selectivity from the etching of isolation regions.

The mask layer 64 may include, for example, silicon nitride, silicon oxynitride, or the like. In this example, a single dummy gate layer 62 and a single mask layer 64 are formed across the region 50N and the region 50P. It is noted that the dummy dielectric layer 60 is shown covering only the fins 52A for illustrative purposes only. In some embodiments, the dummy dielectric layer 60 may be deposited such that the dummy dielectric layer 60 covers the STI regions 56, extending between the dummy gate layer 62 and the STI regions 56.

FIGS. 12A through 16B illustrate additional immediate stages of manufacture. In FIGS. 12A through 16B, figures that end in "A" are illustrated along the respective cross-section A-A of FIGS. 1A and 1B, and Figures that end in "B" are illustrated along the respective cross-section B-B of FIGS. 1A and 1B. FIGS. 14C, 14D, and 14E are illustrated along respective cross-section C-C of FIGS. 1A and 1B.

Figure 12A:
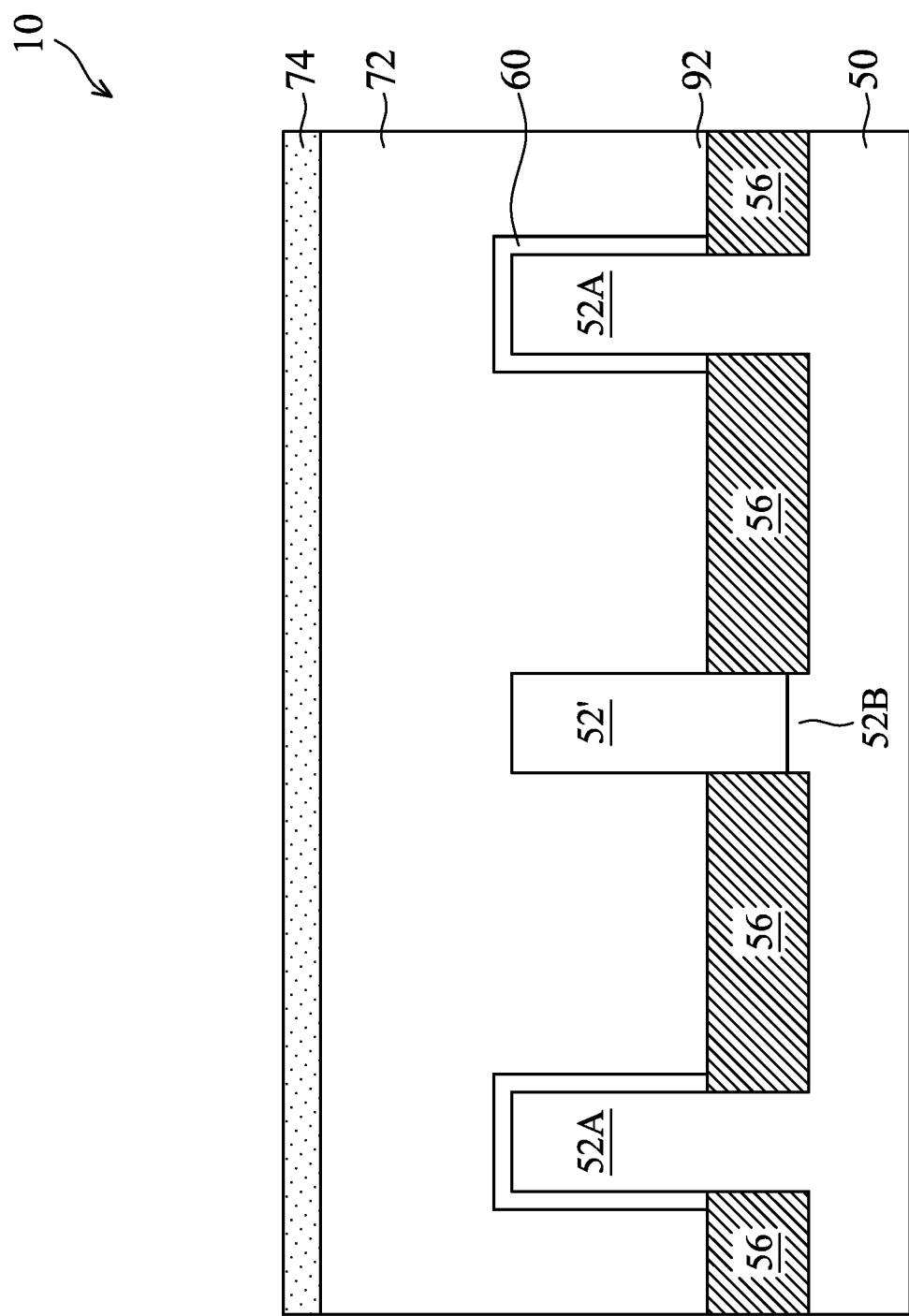
Figure 12B:
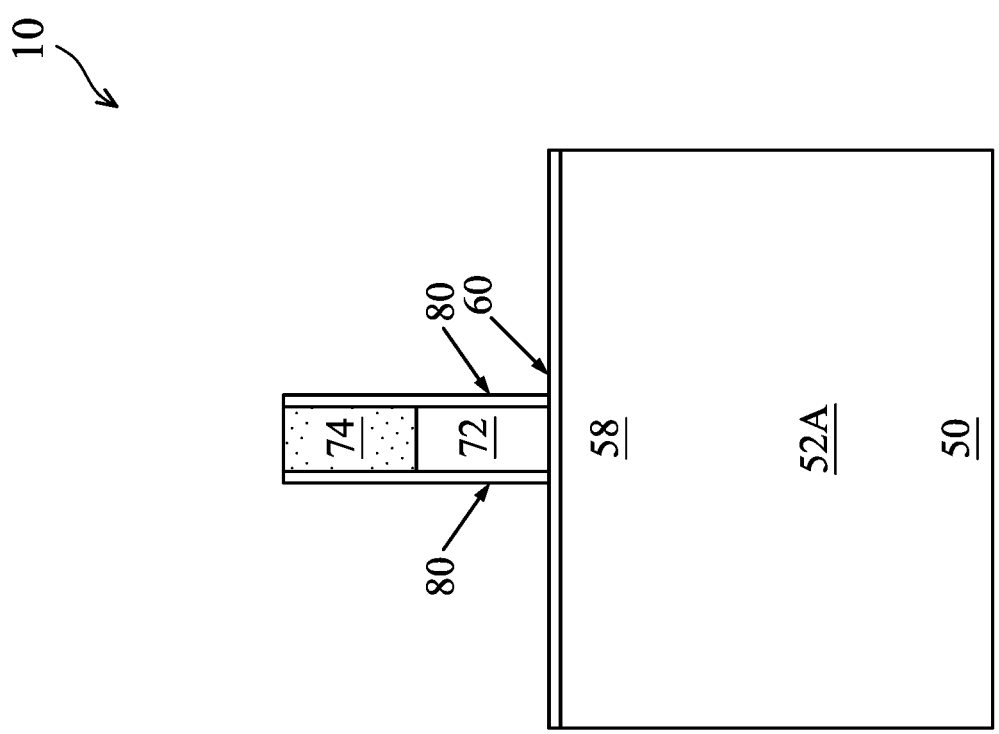

In FIGS. 12A and 12B, the mask layer 64 (see FIG. 11) may be patterned using acceptable photolithography and etching techniques to form masks 74. The pattern of the masks 74 then may be transferred to the dummy gate layer 62. In some embodiments (not illustrated), the pattern of the masks 74 may also be transferred to the dummy dielectric layer 60 by an acceptable etching technique to form dummy gates 72. The dummy gates 72 cover respective channel regions 58 of the fins 52A. The dummy gates 72 also cover top surfaces and sidewalls of the dummy fin 52'. The pattern of the masks 74 may be used to physically separate each of the dummy gates 72 from adjacent dummy gates. The dummy gates 72 may also have a lengthwise direction substantially perpendicular to the lengthwise direction of respective epitaxial fins 52A.

Further in FIGS. 12A and 12B, gate seal spacers 80 can be formed on exposed surfaces of the dummy gates 72, the masks 74, and/or the fins 52A/dummy fin 52'. A thermal oxidation or a deposition followed by an anisotropic etch may form the gate seal spacers 80. The gate seal spacers 80 may be formed of silicon oxide, silicon nitride, silicon oxynitride, or the like.

After the formation of the gate seal spacers 80, implants for lightly doped source/drain (LDD) regions (not explicitly illustrated) may be performed. In the embodiments with different device types, similar to the implants discussed above in FIG. 6, a mask, such as a photoresist, may be formed over the region 50N, while exposing the region 50P, and appropriate type (e.g., p-type) impurities may be implanted into the exposed fins 52A in the region 50P. The mask may then be removed.

Subsequently, a mask, such as a photoresist, may be formed over the region 50P while exposing the region 50N, and appropriate type impurities (e.g., n-type) may be implanted into the exposed fins 52A in the region 50N. The mask may then be removed. The n-type impurities may be the any of the n-type impurities previously discussed, and the p-type impurities may be the any of the p-type impurities previously discussed. The lightly doped source/drain regions may have a concentration of impurities of from about $10^{15}$ $cm^{-3}$ to about $10^{19}$ $cm^{-3}$. An anneal may be used to repair implant damage and to activate the implanted impurities.

Figure 13A:
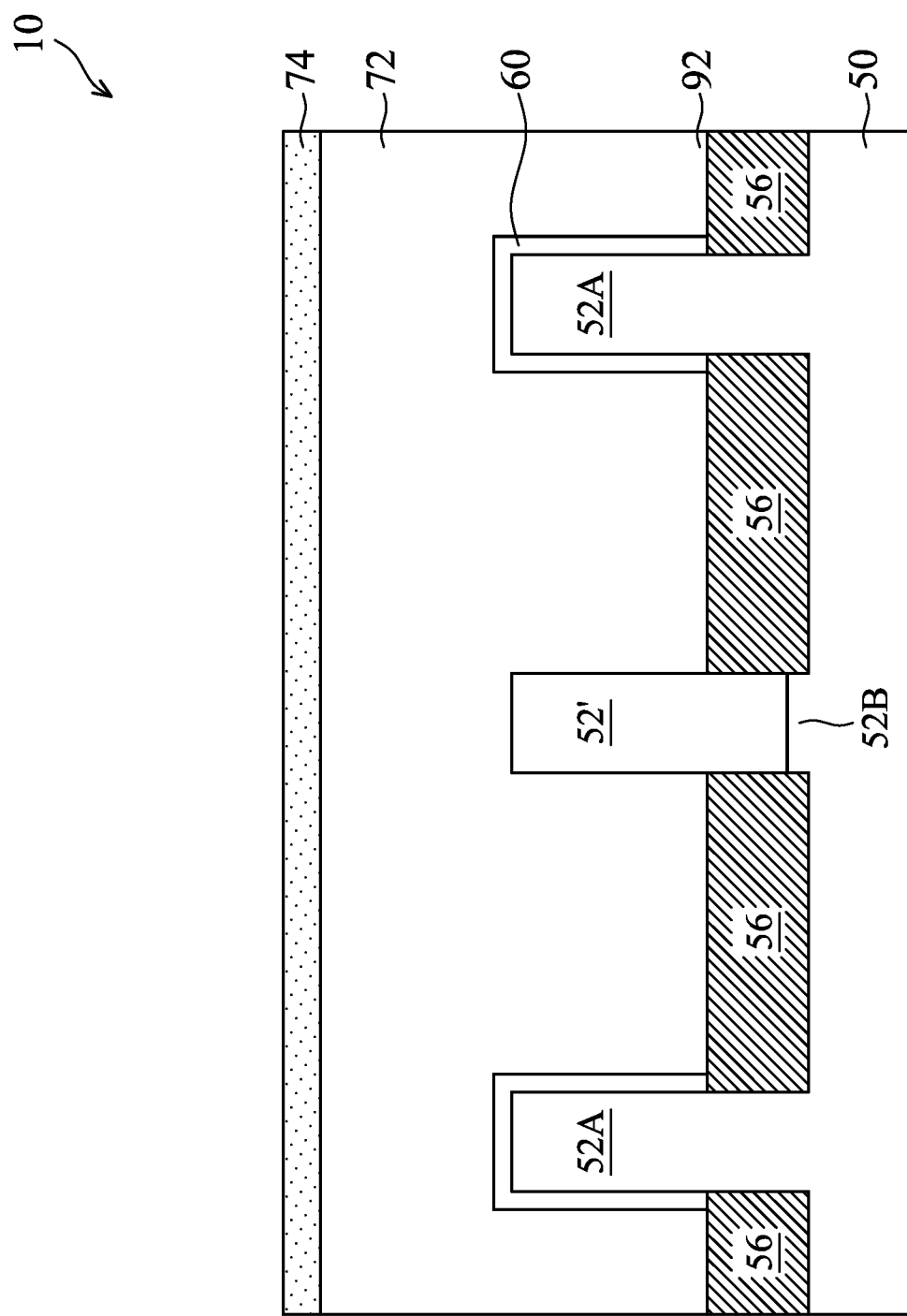
Figure 13B:
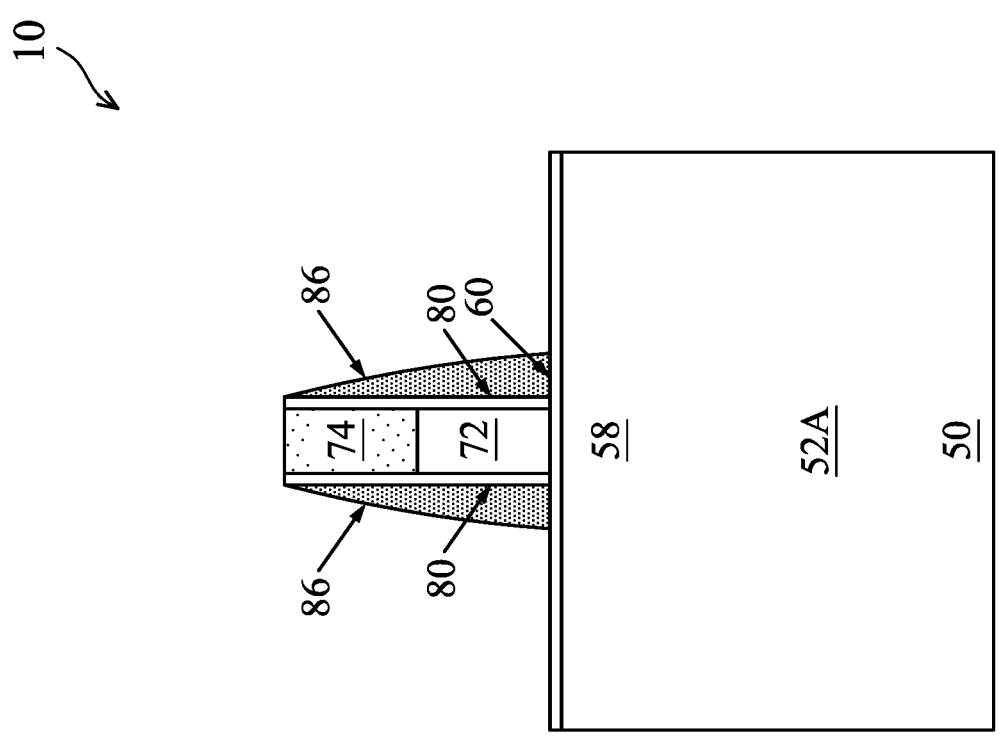
Figure 14A:
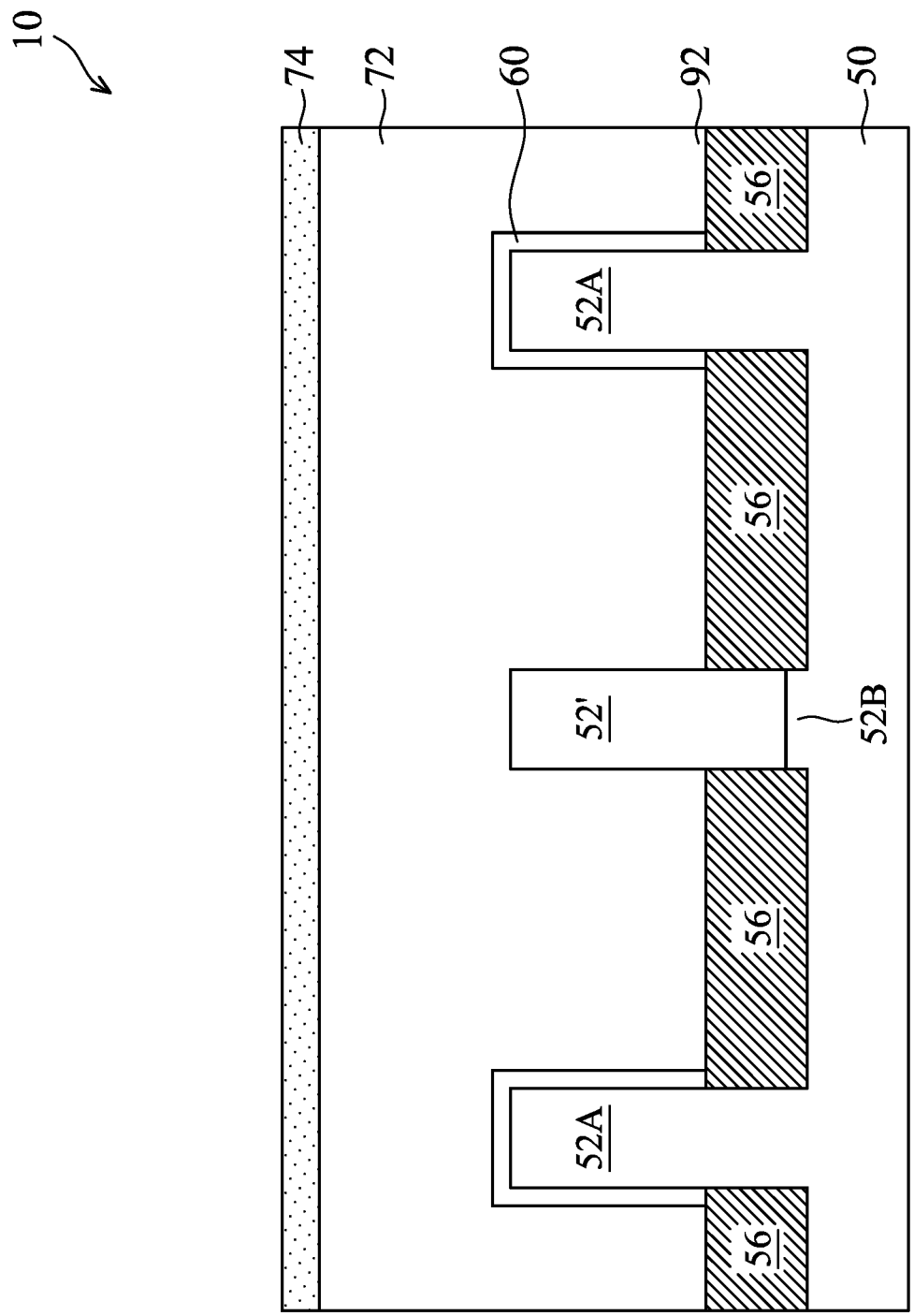
Figure 14E:
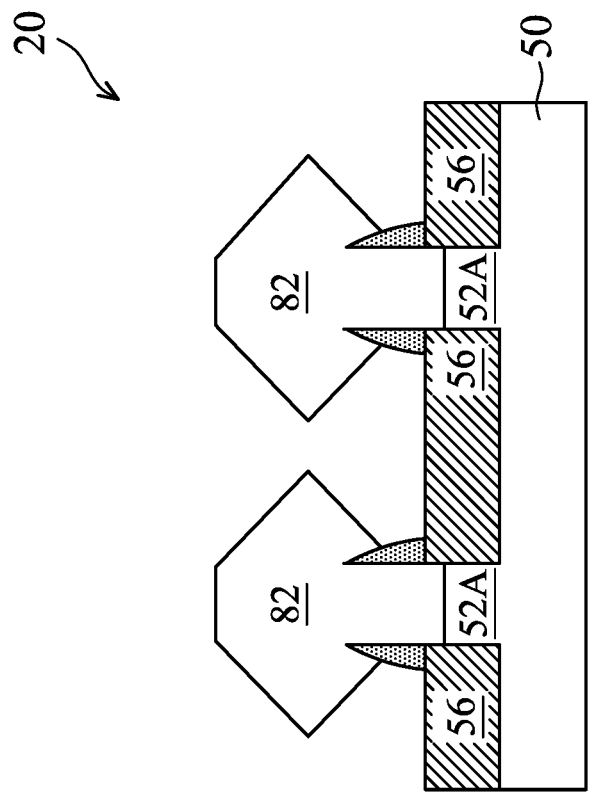
Figure 14D:
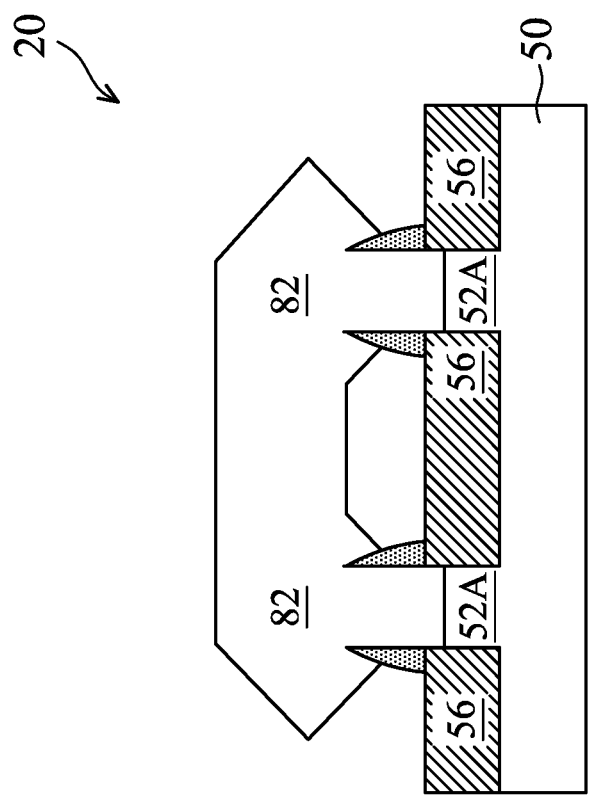

In FIGS. 13A and 13B, gate spacers 86 are formed on the gate seal spacers 80 along sidewalls of the dummy gates 72 and the masks 74. The gate spacers 86 may be formed by conformally depositing an insulation material and subsequently anisotropically etching the insulation material. The insulation material of the gate spacers 86 may be silicon oxide, silicon nitride, silicon oxynitride, silicon carbonitride, a combination thereof, or the like.

It is noted that the above disclosure generally describes a process of forming spacers and LDD regions. Other processes and sequences may be used. For example, fewer or additional spacers may be utilized, different sequence of steps may be utilized (e.g., the gate seal spacers 80 may not be etched prior to forming the gate spacers 86, yielding "L-shaped" gate seal spacers, spacers may be formed and removed, and/or the like. Furthermore, the n-type and p-type devices may be formed using a different structures and steps. For example, LDD regions for n-type devices may be formed prior to forming the gate seal spacers 80 while the LDD regions for p-type devices may be formed after forming the gate seal spacers 80.

In FIGS. 14A through 14E epitaxial source/drain regions 82 are formed in the fins 52A. The source/drain regions 82 may exert stress in the respective channel regions 58, thereby improving performance. The epitaxial source/drain regions 82 are formed in the fins 52A such that each dummy gate 72 is disposed between respective neighboring pairs of the epitaxial source/drain regions 82. In some embodiments the epitaxial source/drain regions 82 may extend into, and may also penetrate through, the fins 52A. In some embodiments, the gate spacers 86 are used to separate the epitaxial source/drain regions 82 from the dummy gates 72 by an appropriate lateral distance so that the epitaxial source/drain regions 82 do not short out subsequently formed gates of the resulting FinFETs.

The epitaxial source/drain regions 82 in the region 50N, e.g., the NMOS region, may be formed by masking the region 50P, e.g., the PMOS region, and etching source/drain regions of the fins 52A in the region 50N to form recesses in the fins 52A. Then, the epitaxial source/drain regions 82 in the region 50N are epitaxially grown in the recesses. The epitaxial source/drain regions 82 may include any acceptable material, such as appropriate for n-type FinFETs. For example, if the fin 52A is silicon, the epitaxial source/drain regions 82 in the region 50N may include materials exerting a tensile strain in the channel region 58, such as silicon, silicon carbide, phosphorous doped silicon carbide, silicon phosphide, or the like. The epitaxial source/drain regions 82 in the region 50N may have surfaces raised from respective surfaces of the fins 52A and may have facets.

The epitaxial source/drain regions 82 in the region 50P, e.g., the PMOS region, may be formed by masking the region 50N, e.g., the NMOS region, and etching source/drain regions of the fins 52A in the region 50P are etched to form recesses in the fins 52A. Then, the epitaxial source/drain regions 82 in the region 50P are epitaxially grown in the recesses. The epitaxial source/drain regions 82 may include any acceptable material, such as appropriate for p-type FinFETs. For example, if the fin 52A is silicon, the epitaxial source/drain regions 82 in the region 50P may comprise materials exerting a compressive strain in the channel region 58, such as silicon-germanium, boron doped silicon-germanium, germanium, germanium tin, or the like. The epitaxial source/drain regions 82 in the region 50P may also have surfaces raised from respective surfaces of the fins 52A and may have facets.

The epitaxial source/drain regions 82 and/or the fins 52A may be implanted with dopants to form source/drain regions, similar to the process previously discussed for forming lightly-doped source/drain regions, followed by an anneal. The source/drain regions may have an impurity concentration of between about $10^{19}$ cm$^{-3}$ and about $10^{21}$ cm$^{-3}$. The n-type and/or p-type impurities for source/drain regions may be any of the impurities previously discussed. In some embodiments, the epitaxial source/drain regions 82 may be in situ doped during growth.

As a result of the epitaxy processes used to form the epitaxial source/drain regions 82 in the region 50N and the region 50P, upper surfaces of the epitaxial source/drain regions have facets which expand laterally outward beyond sidewalls of the fins 52A. Gate spacers 86 are formed covering a portion of the sidewalls of the fins 52A that extend above the STI regions 56 thereby blocking the epitaxial growth. In some other embodiments, the spacer etch used to form the gate spacers 86 may be adjusted to remove the spacer material to allow the epitaxially grown region to extend to the surface of the STI region 56.

In embodiments with the dummy fin 52', adjacent source/drain regions 82 remain separated after the epitaxy process is completed as illustrated by FIG. 14C. For example, the source/drain regions 82 may grow to physically contact the dummy fin 52', which physically separates adjacent source/drain regions 82 from each other. Thus, adjacent epitaxial source/drain regions 82 may be prevented from merging and inadvertently shorted out.

In other embodiments (e.g., the device 20 of FIG. 1B), the dummy fin 52' may not be formed. In such embodiments, the facets of the epitaxial source/drain regions 82 cause adjacent source/drain regions 82 of a same FinFET to merge as illustrated by FIG. 14D. In other embodiments, adjacent source/drain regions 82 remain separated after the epitaxy process is completed as illustrated by FIG. 14E. In the embodiments illustrated in FIGS. 14C, 14D, and 14E, gate spacers 86 are formed covering a portion of the sidewalls of the fins 52 that extend above the STI regions 56 thereby blocking the epitaxial growth. In some other embodiments, the spacer etch used to form the gate spacers 86 may be adjusted to remove the spacer material to allow the epitaxially grown region to extend to the surface of the STI region 56.

Figure 15A:
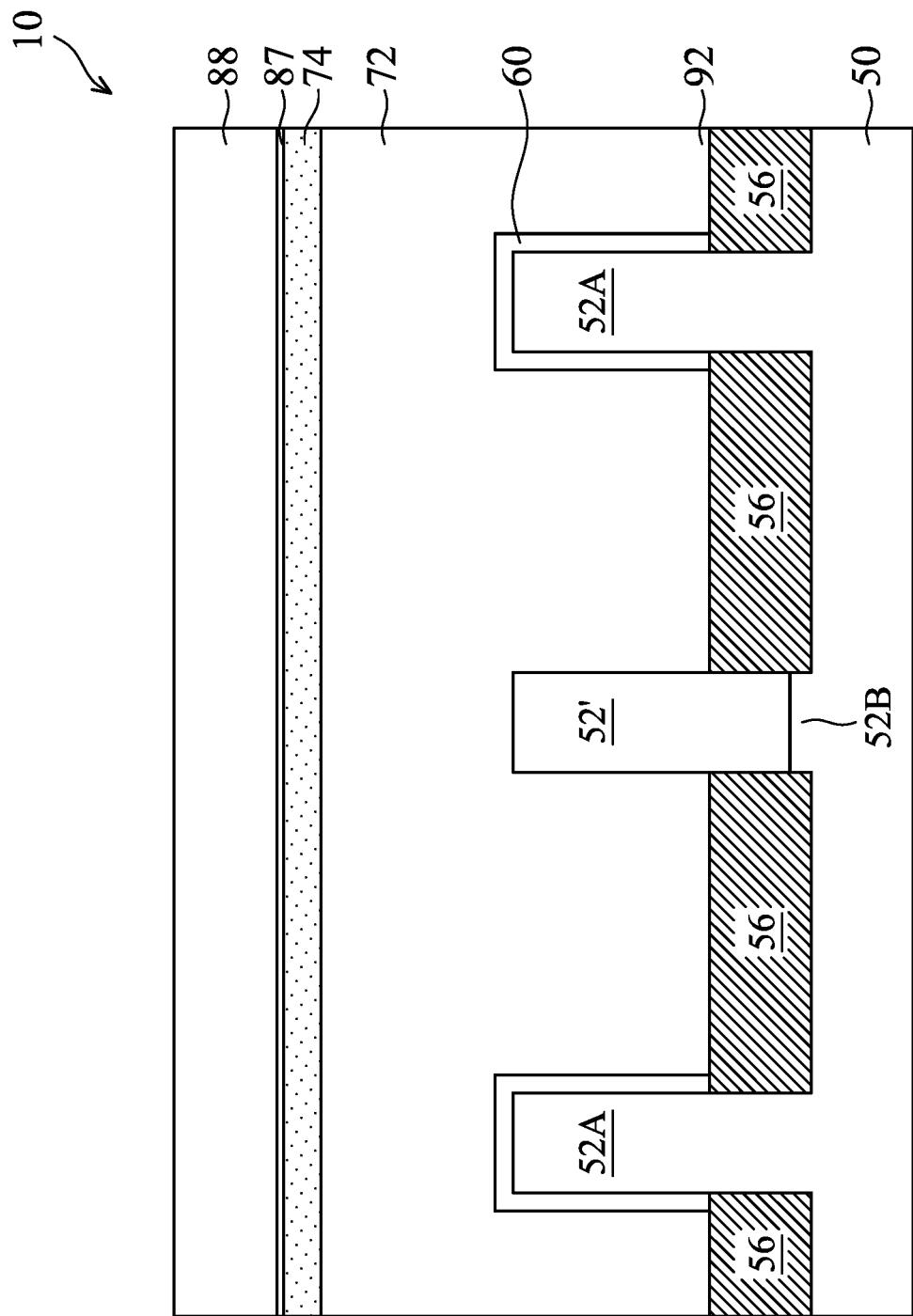
Figure 15B:
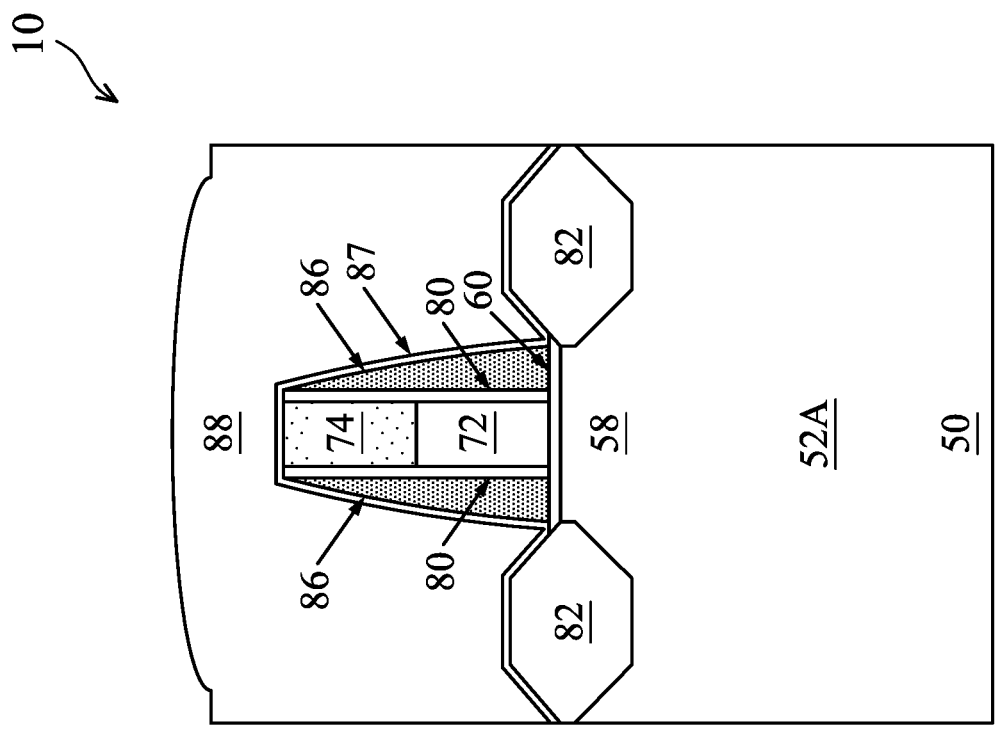

In FIGS. 15A and 15B, a first interlayer dielectric (ILD) 88 is deposited over the structure illustrated in FIGS. 14A and 14B. The first ILD 88 may be formed of a dielectric material, and may be deposited by any suitable method, such as CVD, plasma-enhanced CVD (PECVD), or FCVD. Dielectric materials may include phospho-silicate glass (PSG), boro-silicate glass (BSG), boron-doped phospho-silicate glass (BPSG), undoped silicate glass (USG), or the like. Other insulation materials formed by any acceptable process may be used. In some embodiments, a contact etch stop layer (CESL) 87 is disposed between the first ILD 88 and the epitaxial source/drain regions 82, the masks 74, and the gate spacers 86. The CESL 87 may comprise a dielectric material, such as, silicon nitride, silicon oxide, silicon oxynitride, or the like, having a different etch rate than the material of the overlying first ILD 88.

Figure 16A:
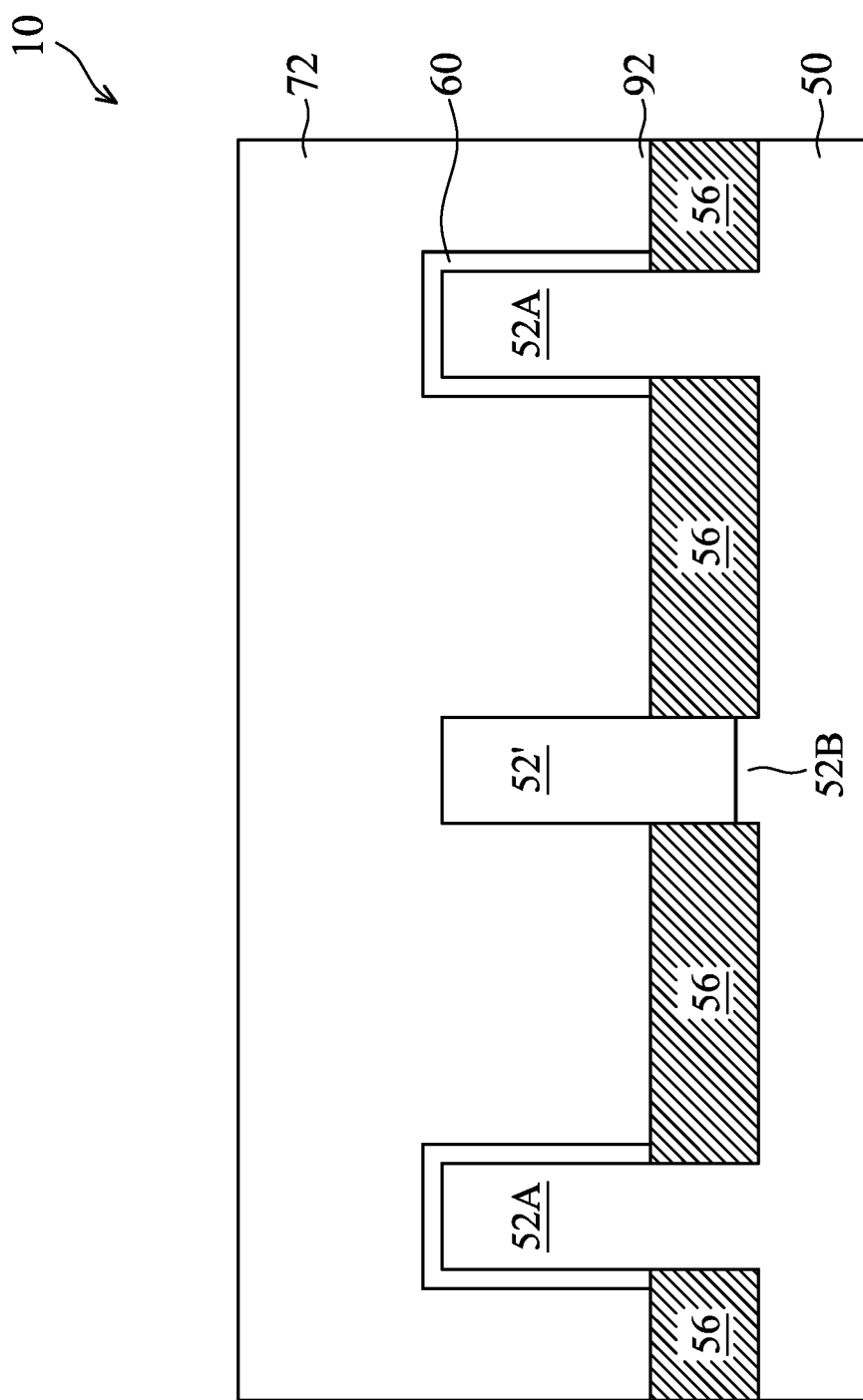
Figure 16B:
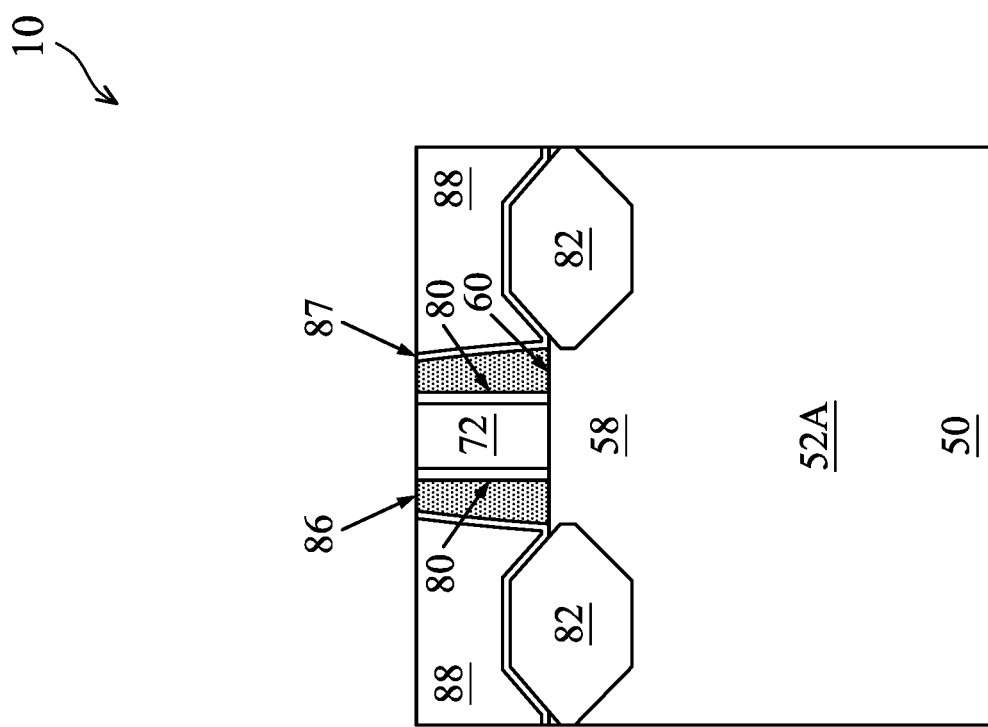

In FIGS. 16A and 16B, a planarization process, such as a CMP, may be performed to level the top surface of the first ILD 88 with the top surfaces of the dummy gates 72 or the masks 74. The planarization process may also remove the masks 74 on the dummy gates 72, and portions of the gate seal spacers 80 and the gate spacers 86 along sidewalls of the masks 74. After the planarization process, top surfaces of the dummy gates 72, the gate seal spacers 80, the gate spacers 86, and the first ILD 88 are level. Accordingly, the top surfaces of the dummy gates 72 are exposed through the first ILD 88. In some embodiments, the masks 74 may remain, in which case the planarization process levels the top surface of the first ILD 88 with the top surfaces of the top surface of the masks 74.

FIGS. 17A through 21B illustrate additional immediate stages of forming a dielectric material in the dummy gate 72 to separate gates of adjacent transistors. In FIGS. 17A through 21B, figures that end in "A" are illustrated along the respective cross-section A-A of FIGS. 1A and 1B, and Figures that end in "B" are illustrated along the respective cross-section D-D of FIGS. 1A and 1B.

Figure 17A:
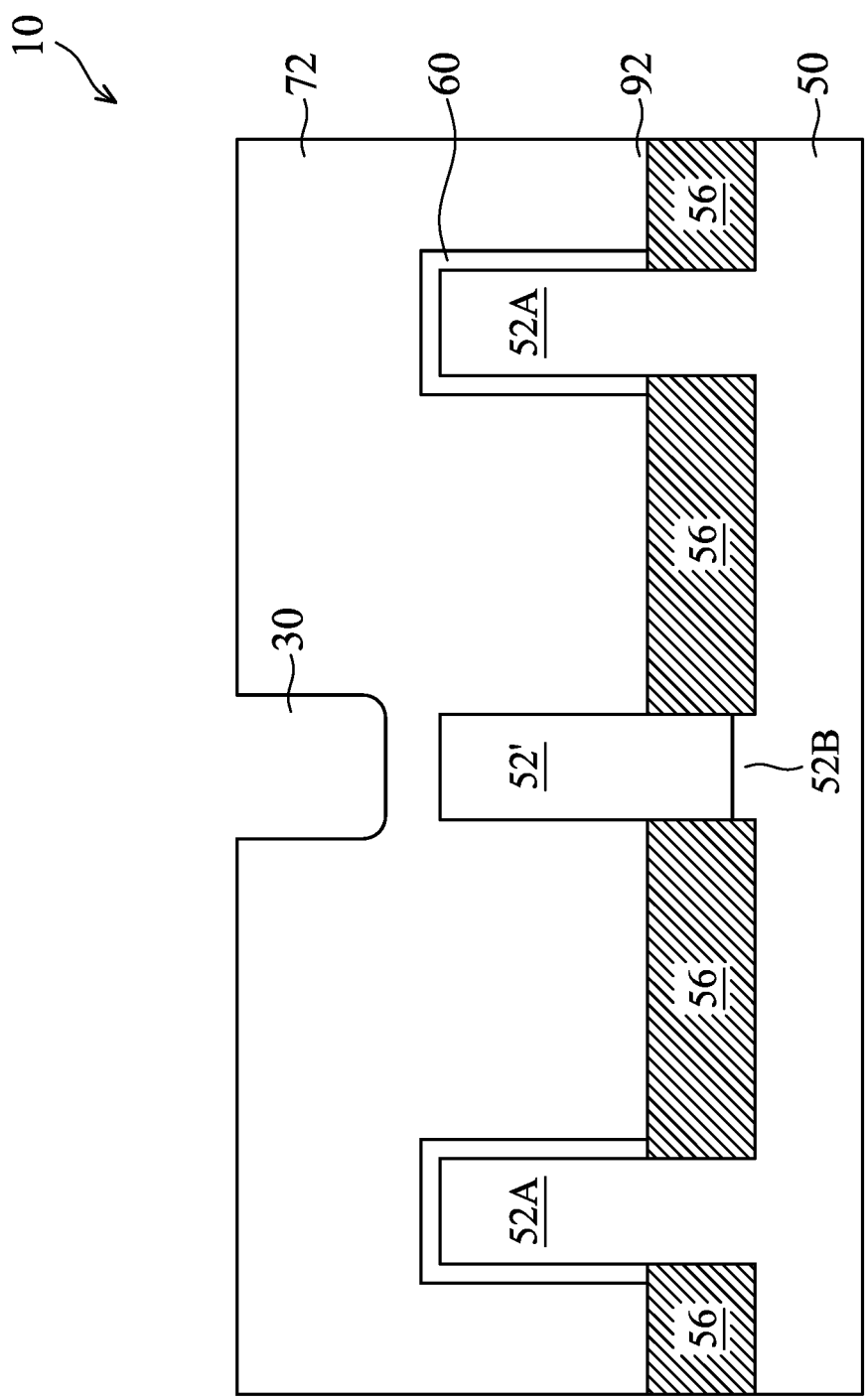
Figure 17B:
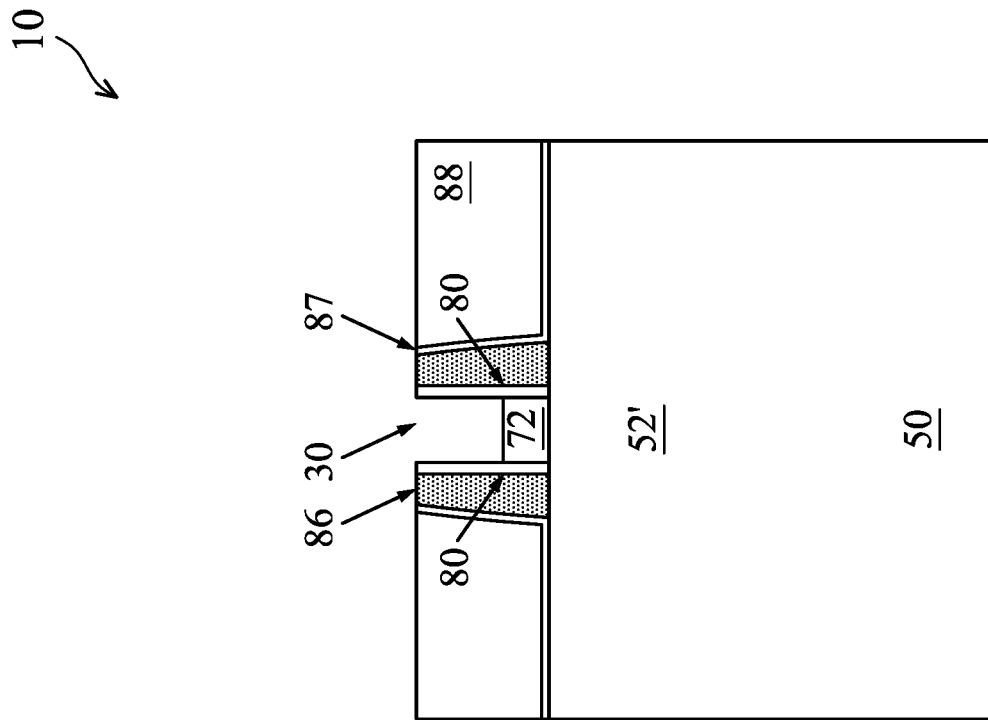

In FIGS. 17A and 17B, an opening 30 is patterned in the dummy gate 72. In some embodiments, the opening 30 may be aligned with and disposed directly over the dummy fin 52'. The opening 30 may be formed in the dummy gate 72 through a combination of photolithography and etching, for example. The opening 30 may expose sidewalls of the gate spacers (e.g., the gate seal spacers 80/gate spacers 86, see FIG. 17B). A depth that the opening 30 extends may be controlled by tuning one or more parameters of the etching (e.g., etch time, or the like).

In some embodiments, etching the opening 30 in the dummy gate 72 includes a plasma process, such as a plasma etch, a remote plasma process, a radical etch, or the like. An etching gas used during the plasma process may comprise $Cl_2$, HBr, $CF_4$, $CHF_3$, $CH_2F_2$, $CH_3F$, $C_4F_6$, $BCl_3$, $SF_6$, $H_2$, combination thereof, or the like. The plasma process may further include flowing a passivation gas over the device 10 for tuning (e.g., increasing) etch selectivity between the dummy gate 72 and other features of the device 10. Embodiment passivation gases may comprise $N_2$, $O_2$, $CO_2$, $SO_2$, CO, $SiCl_4$, combinations thereof, or the like. One or more carrier gases may also be used during the plasma process, such as, Ar, He, Ne, combinations thereof, or the like. Further, the plasma process may be performed with a plasma source power in the range of about 10 W to about 3000 W, with a bias power in the range of about 0 W to about 3000 W, at a pressure of about 1 mTorr to about 800 mTorr, with a gas mixture flow rate of about 10 sccm to about 5000 sccm, or the like.

In some embodiments, etching the opening 30 in the dummy gate 72 includes a wet etch process (sometimes referred to as a wet clean). Embodiment etchants that may be used during the wet etch process may include HF, $F_2$, combinations thereof, or the like. The wet etch process may further include flowing an assisted etch chemical over the device 10 for tuning (e.g., increasing) etch selectivity between the dummy gate 72 and other features of the device 10. Embodiment assisted etch chemicals may comprise $H_2SO_4$, HCl, HBr, $NH_3$, combinations thereof, or the like. Deionized water (DIW), alcohol, acetone, or the like may be used as a solvent for mixing the etchant and/or the assisted etch chemical during the wet etch process.

Figure 18A:
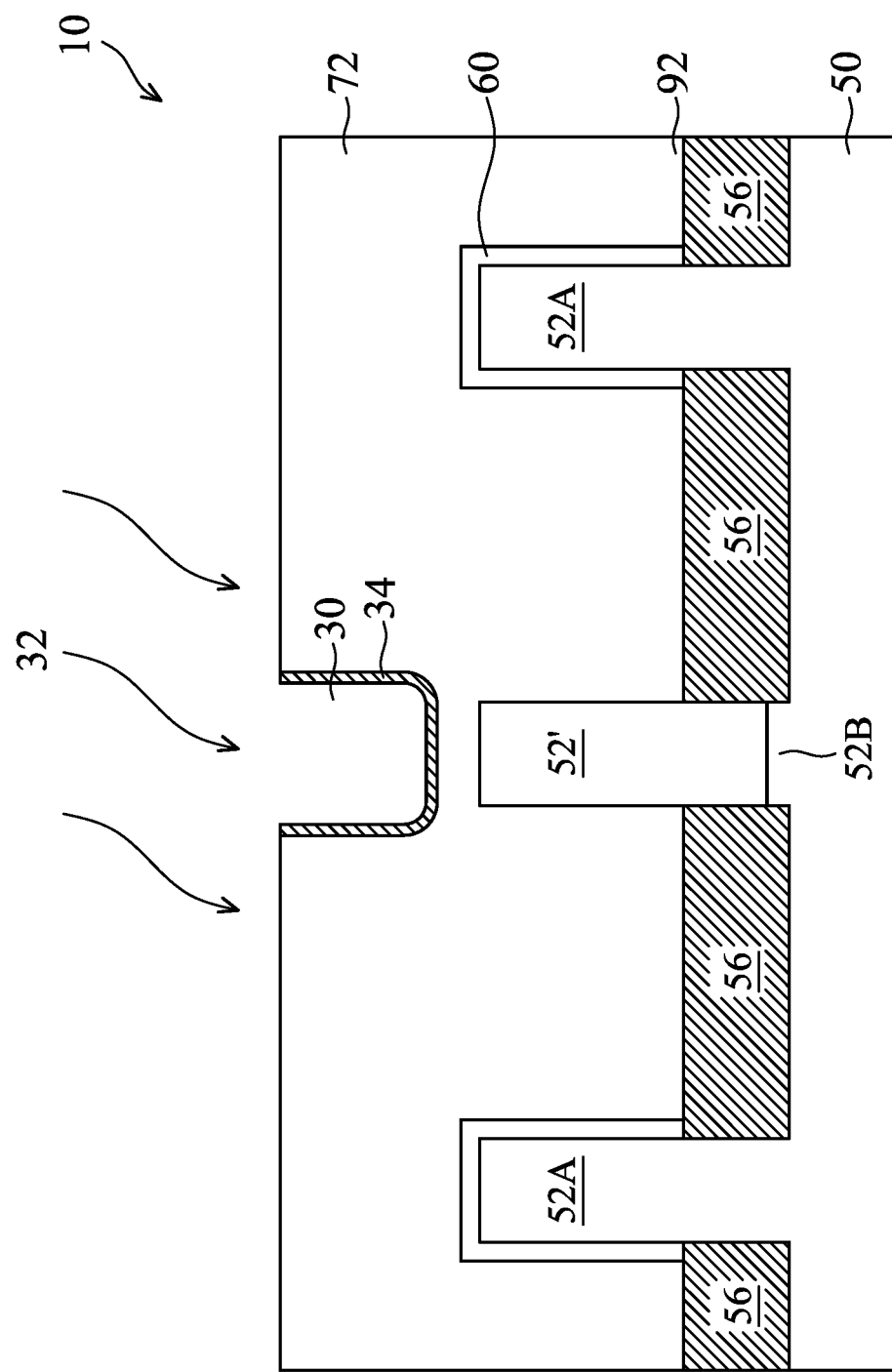
Figure 18B:
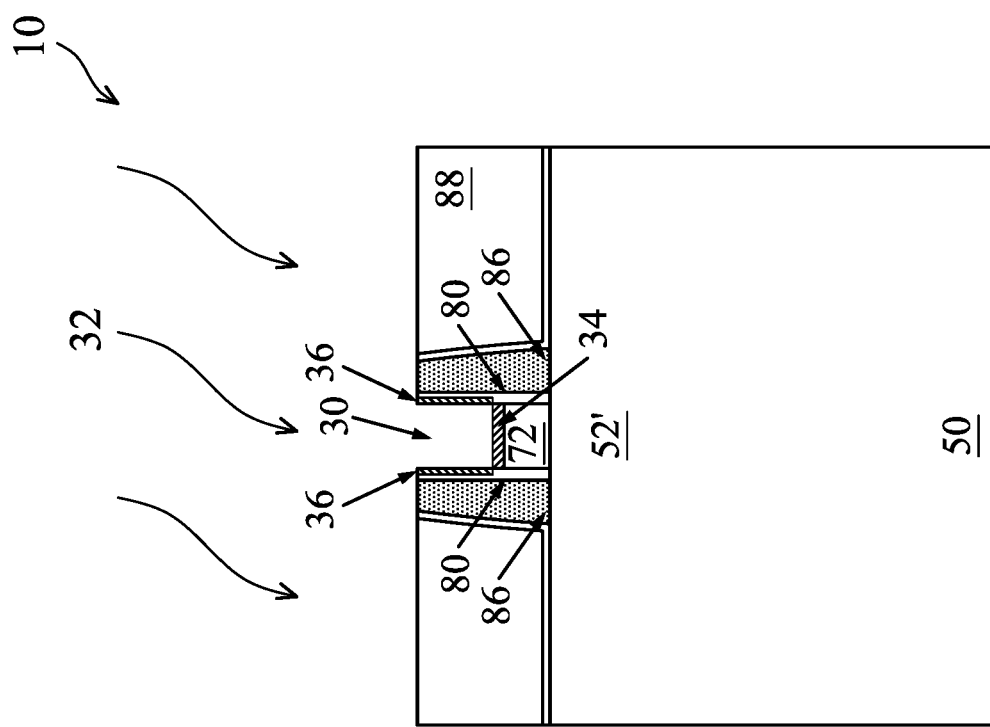

In FIGS. 18A and 18B, a treatment process 32 is applied to the device 10, such as to sidewalls and a bottom surface of the opening 30. The treatment process 32 may form passivation regions 34 and 36 on sidewalls and a bottom surface of the opening 30. The passivation region 34 may be formed in the dummy gate 72, and the passivation region 36 may be formed in the gate spacers (e.g., the gate seal spacers 80 and/or the gate spacers 86). Further although not explicitly illustrated, the treatment process 32 may further form passivation regions in other exposed surfaces of the wafer 10, such as upper surfaces of the gate dummy gate 72 and upper surfaces of the first ILD 88. Such passivation regions may be removed in subsequent processing steps.

The treatment process 32 may be a conversion process that converts an exposed portion of the dummy gate 72 into the passivation region 34 and converts and exposed portion of the gate spacer (e.g., the gate seal spacers 80 and optionally the gate spacers 86) into the passivation region 36. The treatment process 32 may be performed in-situ (e.g., in a same process chamber) or ex-situ (e.g., in a different process chamber) of the etching process to form the opening 30. A respective thickness of each of the passivation region 34 and the passivation layer 36 may be in the range of about 2 Å to about 300 Å.

In some embodiments, the treatment process 32 includes a plasma process, such as a plasma implantation, or the like. A passivation gas used during the plasma process may comprise $N_2$, $O_2$, $CO_2$, $SO_2$, CO, combination thereof, or the like. The plasma process may further include flowing an additional gas, such as a carbon-based ($CH_4$), a silicon-based gas (e.g., $SiCl_4$), combinations thereof, or the like, to help form the passivation regions 34 and 36. Further, the plasma process may be performed with a plasma source power in the range of about 10 W to about 3000 W, with a bias power in the range of about 0 W to about 300 0 W, at a pressure of about 1 mTorr to about 800 mTorr, with a gas mixture flow rate of about 10 sccm to about 5000 sccm, or the like.

In some embodiments, the treatment process 32 is a non-plasma, dry chemical treatment using a treatment gas, such as, HF, $NF_3$, $CH_4$, combinations thereof, or the like. In some embodiments, the treatment process 32 is a wet treatment process, which uses a solution comprising deionized water (DIW), $O_3$, $CO_2$, HF, HCl, $NH_3$, combinations thereof, or the like. In some embodiments, the treatment process 32 is a deposition process that reacts with existing materials of the dummy gate 72 and the gate spacers and also deposits a dielectric material (e.g., SiN, SiON, SiCON, SiC, SiOC, $SiO_2$, SiC, combinations thereof, or the like) on surfaces of the opening 30. In such embodiments, the passivation regions 34 and 36 include the reacted areas of the dummy gate 72, the reacted areas of the gate spacers, and the deposited dielectric material. Embodiment deposition processes may include an ALD process, a CVD process, combinations thereof, or the like.

Because a material of the dummy gate 72 is different than material(s) of the gate spacers (e.g., the gate seal spacers 80/gate spacers 86), the treated region 34 may have a different material composition than the treated region 36. For example, in embodiments where the treatment process 32 comprises using nitrogen and the gate spacers comprise oxygen, the passivation region 34 may comprise silicon and nitrogen while the passivation region 36 may comprise silicon, oxygen, and nitrogen. As another example where the treatment process 32 comprises using oxygen and the gate spacers comprise nitrogen, the passivation region 34 may comprise silicon and oxygen while the passivation region 36 may comprise silicon, oxygen, and nitrogen. As another example where the treatment process 32 comprises using nitrogen and the gate spacers comprise nitrogen, a nitrogen concentration of the passivation region 34 may be lower than a nitrogen concentration of the passivation region 36. As another example where the treatment process 32 comprises using oxygen and the gate spacers comprise oxygen, an oxygen concentration of the passivation region 34 may be lower than an oxygen concentration of the passivation region 36. Accordingly, the treatment process 32 forms two different passivation regions 34 and 36, and etch selectivity can be achieved between the passivation regions 34 and 36. Etch selectivity can also be achieved between the passivation region 36 and remaining portions of the gate spacers.

Figure 19B:
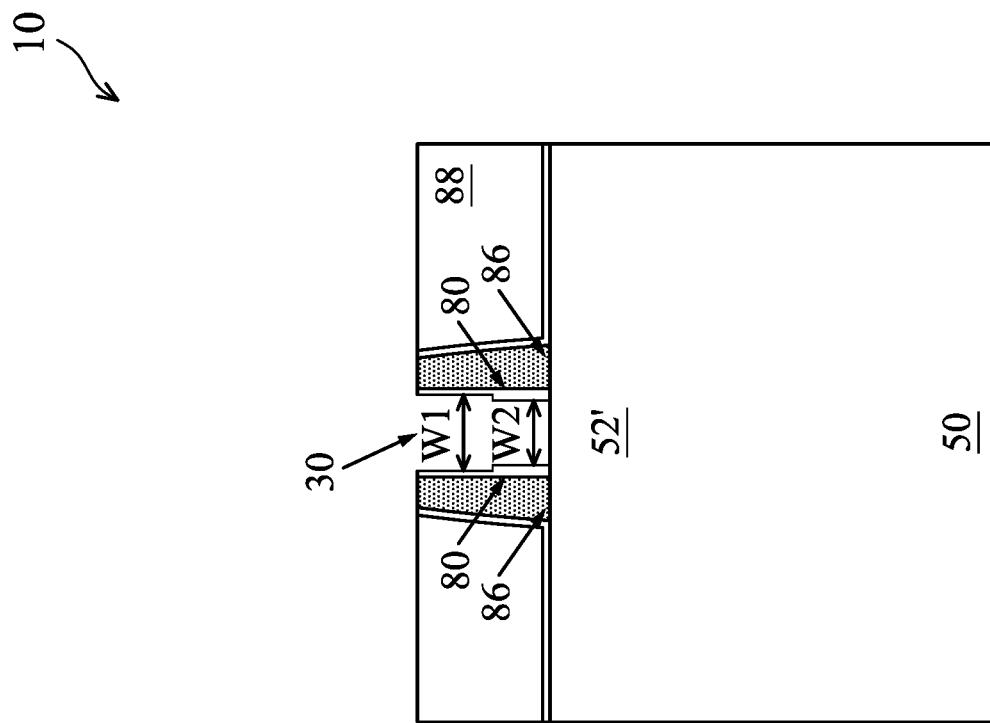
Figure 19A:
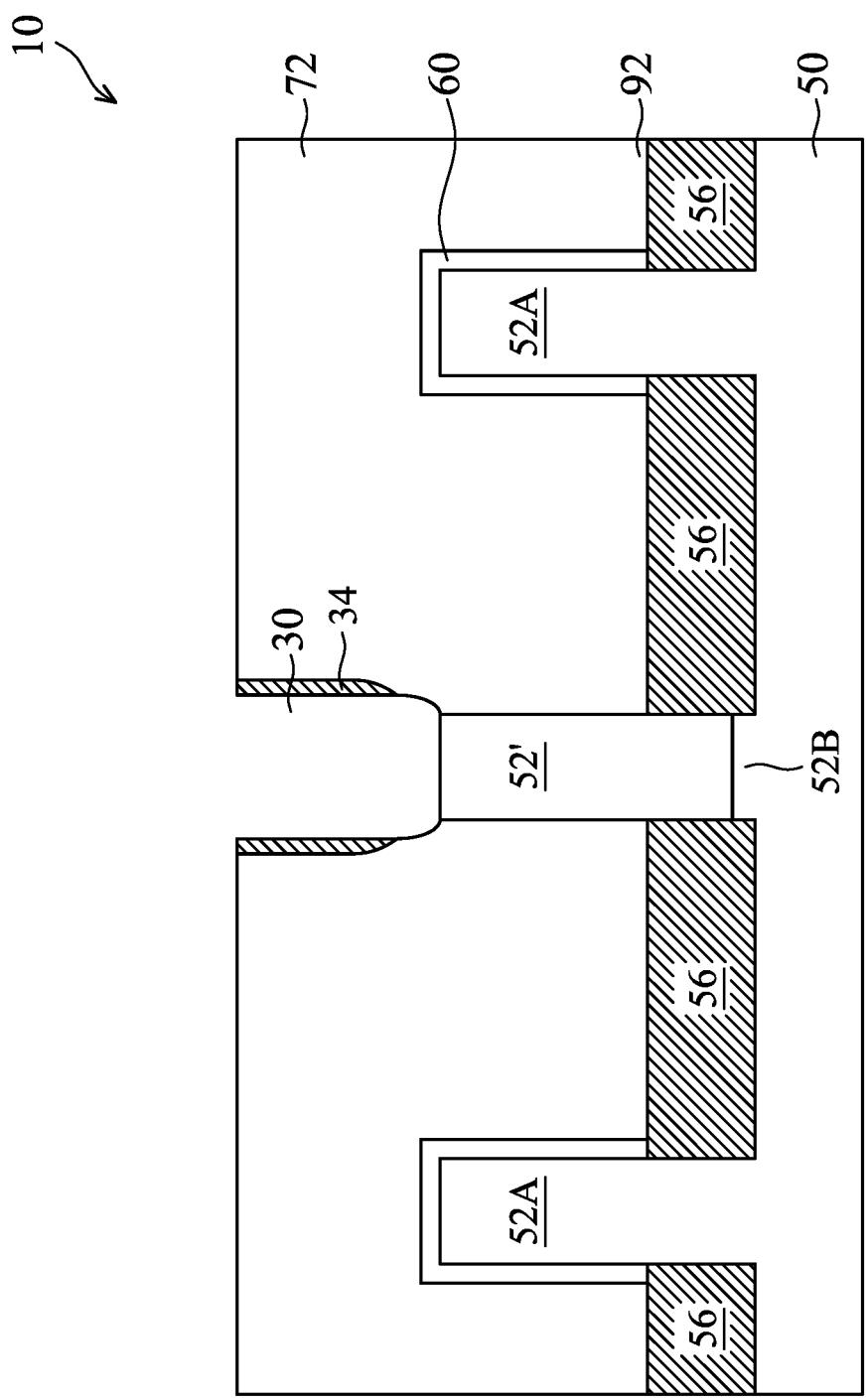

In FIGS. 19A and 19B, an etch process is applied to the dummy gate 72, which extends the opening 30 further towards the dummy fin 52' (if present) and the semiconductor substrate 50. In some embodiments, the opening 30 may be extended to expose the dummy fin 52' or the semiconductor substrate 50.

The etch process may be selective between a material of the passivation region 36 and a material of the gate spacers (e.g., the gate seal spacers 80) such that the etch process removes the passivation region 36. For example, the etch process may remove the material of the passivation region 36 at a greater rate than the material of the gate spacers. As a result and as illustrated in FIG. 19B, an upper portion of the opening 30 may have a width W1 that is greater than a width W2 of a lower portion of the opening 30.

Further, the etch process may be a directional process, which removes the passivation region 34 from bottom surfaces of the recess 30 without significantly removing the passivation region 34 from sidewalls of the recess 30. In some embodiments, the etch process may be selective between a material of the passivation regions 34 and 36 so that the material of the passivation region 36 is removed from sidewalls of the opening 30 without significantly removing the passivation region 34 from sidewalls of the opening 30. As a result, an effective gate width of the dummy gate 72 (and corresponding replacement metal gate) can be maintained, thereby improving device performance of the resultant device.

In some embodiments, removing the passivation region 36 and expanding the opening 30 includes a plasma process, such as a plasma etch, a remote plasma process, a radical etch, or the like. An etching gas used during the plasma process may comprise $Cl_2$, HBr, $CF_4$, $CHF_3$, $CH_2F_2$, $CH_3F$, $C_4F_6$, $BCl_3$, $SF_6$, $H_2$, combination thereof, or the like. The plasma process may further include flowing a passivation gas over the device 10 for tuning (e.g., increasing) etch selectivity between the dummy gate 72 and other features of the device 10. Embodiment passivation gases may comprise $N_2$, $O_2$, $CO_2$, $SO_2$, CO, $SiCl_4$, combinations thereof, or the like. One or more carrier gases may also be used during the plasma process, such as, Ar, He, Ne, combinations thereof, or the like. Further, the plasma process may be performed with a plasma source power in the range of about 10 W to about 3000 W, with a bias power in the range of about 0 W to about 300 0 W, at a pressure of about 1 mTorr to about 800 mTorr, with a gas mixture flow rate of about 10 sccm to about 5000 sccm, or the like.

In some embodiments, removing the passivation region 36 and expanding the opening 30 includes a wet etch process (sometimes referred to as a wet clean). Embodiment etchants that may be used during the wet etch process may include HF, $F_2$, combinations thereof, or the like. The wet etch process may further include flowing an assisted etch chemical over the device 10 for tuning (e.g., increasing) etch selectivity between the dummy gate 72 and other features of the device 10. Embodiment assisted etch chemicals may comprise $H_2SO_4$, HCl, HBr, $NH_3$, combinations thereof, or the like. Deionized water (DIW), alcohol, acetone, or the like may be used as a solvent for mixing the etchant and/or the assisted etch chemical during the wet etch process.

Although FIGS. 18A through 19B illustrates one treatment and etch cycle being applied to the opening 30 to expose the dummy fin 52', any multiple treatment and etch cycles may be performed. For example, the steps described with respect to FIGS. 18A through 19B may be repeated any number of times until the dummy fin 52' is exposed and the opening 30 has a desired profile. By repeating the treatment process and etch process described above, an atomic layer etch type process may be achieved to form an opening with an expanded upper portion.

Figure 20A:
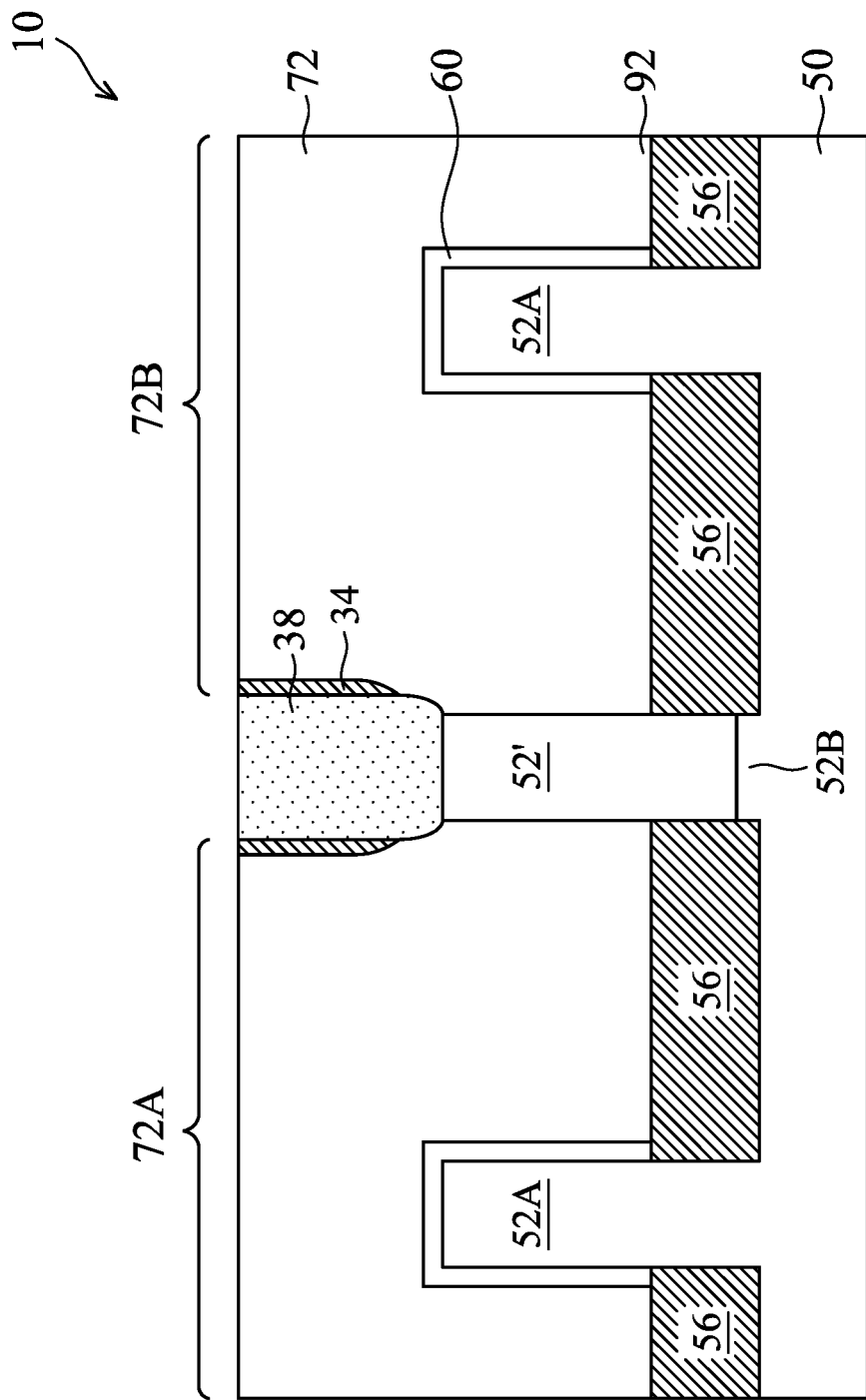

In FIGS. 20A and 20B, the opening 30 is filled with a dielectric material 38. The dielectric material 38 may be deposited by PVD, CVD, ALD, PECVD, or the like. The dielectric material 38 may initially be deposited to overfill the opening 30 and cover top surfaces of the dummy gate 72 and the first ILD 88. Subsequently, a planarization process (e.g., CMP, or the like) may be performed to remove excess dielectric material 38 from above the dummy gate 72 and the first ILD 88.

In the device 10 comprising the dummy fin 52', the dielectric material 38 in combination of with the dummy fin 52' separates the dummy gate 72 into different regions (e.g., regions 72A and 72B). In the device 20, which does not include the dummy fin 52', the dielectric material 38 alone separates the dummy gate 72 into different regions 72A and 72B (see FIGS. 21A and 21B). In the device 20, the dielectric material 38 extends to and contacts the semiconductor substrate 50. The regions 72A and 72B may correspond to locations of different transistor devices, for example. Thus, the dielectric material 38 and the dummy fin 52' (if present) may provide isolation between adjacent FinFETs.

As a result of widening upper portions of the opening 30, an upper portion of the dielectric material 38 may have the width W1, which is greater than the width W2 of a lower portion of the dielectric material 38. The widened opening 30 allows the dielectric material 38 to be filled with fewer defects (e.g., voids). Widening the opening 30 further results in the gate spacers (e.g., the gate seal spacer 80 and/or the gate spacers 86) being thinner on the upper portion of the dielectric material 38 than on the lower portion of the dielectric material 38. For example, the gate spacers have an upper portion that is thinner than a lower portion of the gate spacers. Further, by reducing etching of the dummy gate 72 along a bottom portion of the opening 30, an effective gate width of the dummy gate 72 (and the subsequently formed replacement gate) can be maintained.

FIGS. 20C and 20D illustrate top down views of the dielectric material 38. FIG. 20C illustrates a top down view taken along line X-X of FIG. 20B, and FIG. 20D illustrates a top down view taken alone line Y-Y of FIG. 20B. As illustrated by FIGS. 20C and 20D, an upper region of the dielectric material 38 is wider than a lower region of the dielectric material 38. Further, in FIG. 20C, the upper region of the dielectric material 38 may extend past first sidewalls of the gate spacers 80/86 towards second sidewalls of the gate spacers 80/86. The first sidewalls may adjoin the dummy gate 72, and the second sidewalls are opposite respective ones of the first sidewalls. In the upper region, the dielectric material 38 has the width W1, which is greater than a dimension CD1 of the dummy gate 72. The dimension CD1 may be a distance between opposing sidewalls of the dummy gate 72 measured along a channel length direction of the dummy gate 72. The width W1 of the dielectric material 38 may further be less than a dimension CD2 of the gate spacers 80/86. The dimension CD2 may be a distance between opposing outer sidewalls (e.g., the second sidewalls) of the gate spacers 80/86. In FIG. 30D, the dielectric material 38 may be bounded by the first sidewalls of the gate spacers 80/86. For example, the dielectric material 38 has a width W2 in the lower region illustrated by FIG. 30D, and the width W2 may be equal to the dimension CD1 of the dummy gate 72. The width W2 may also be less than the dimension CD2 of the gate spacers 80/86.

Figure 21A:
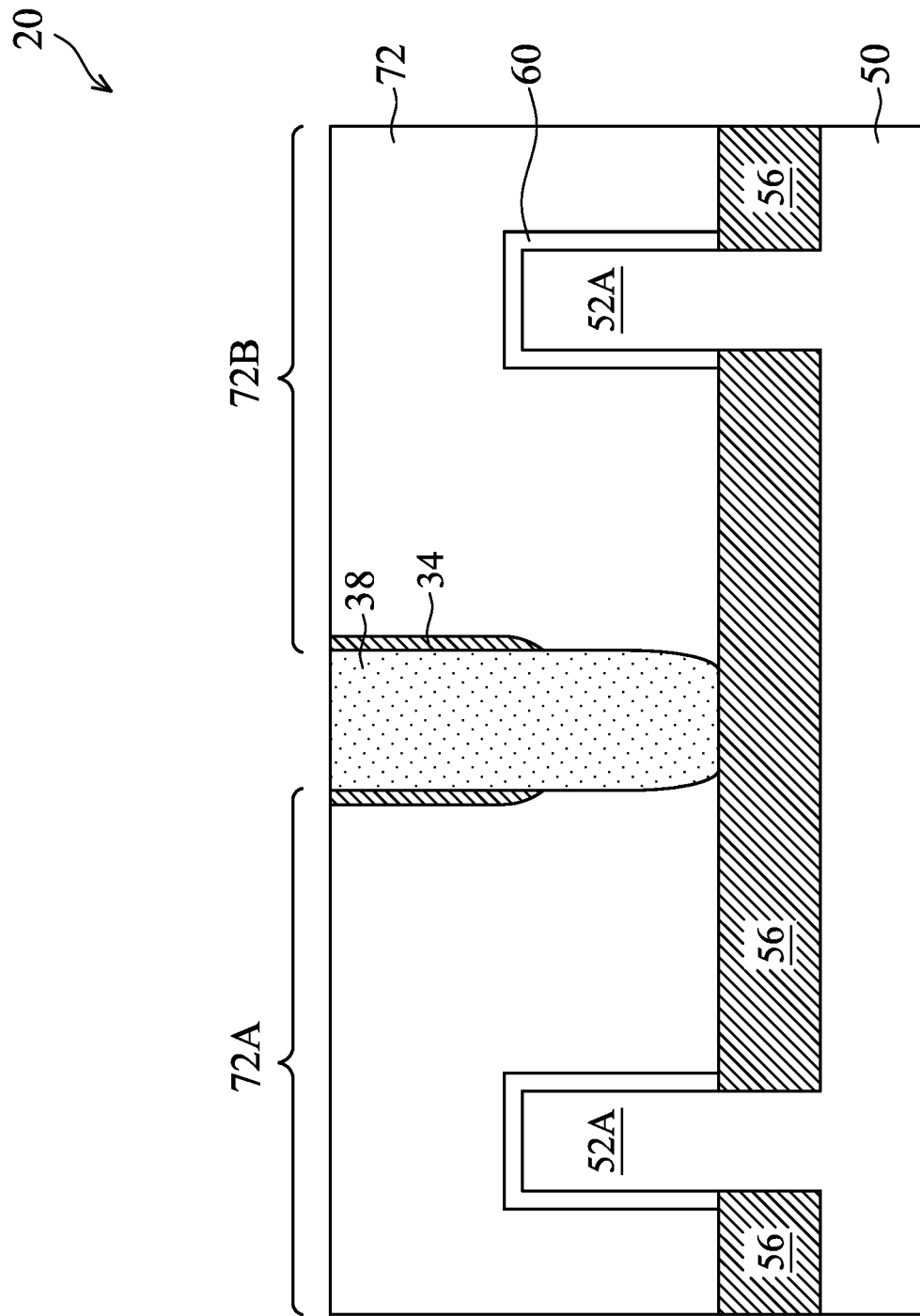
Figure 21B:
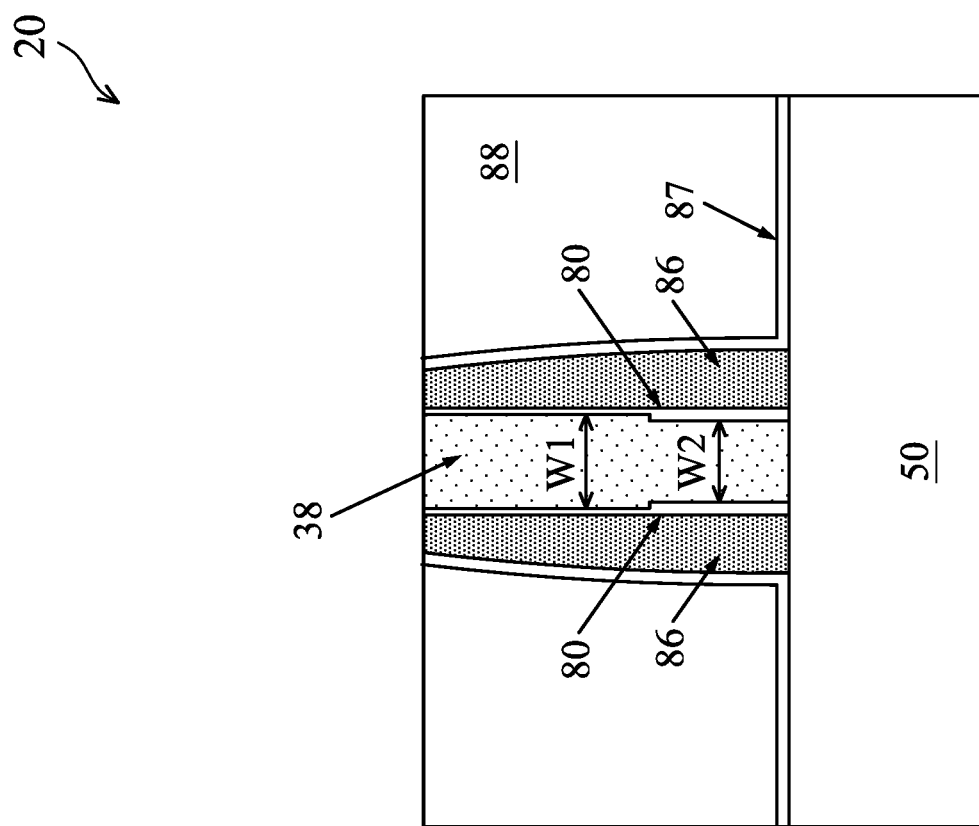
Figure 22A:
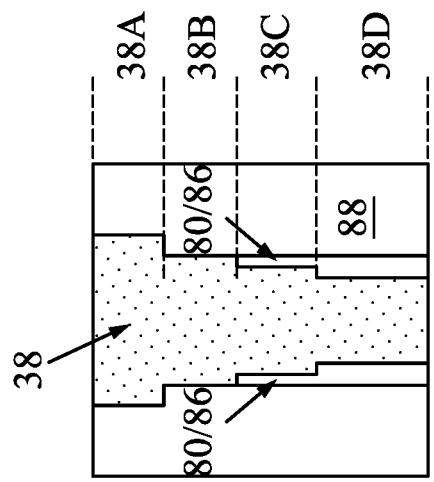
Figure 22E:
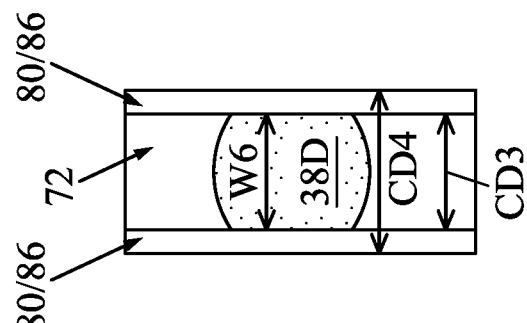
Figure 22D:
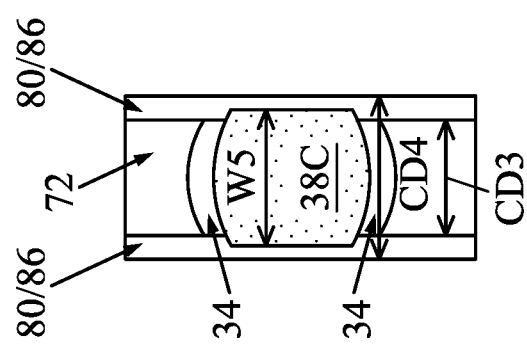
Figure 22C:
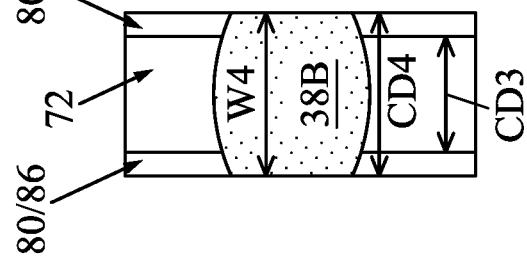
Figure 22B:
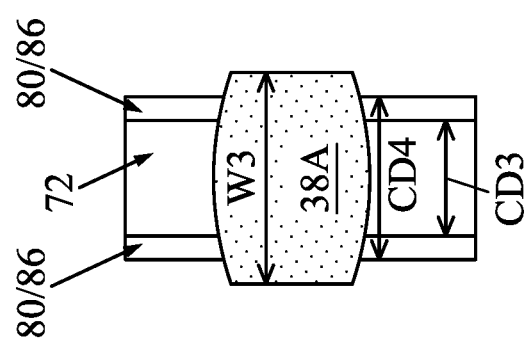

FIGS. 22A through 22E illustrates an alternate configuration of the dielectric material 38, which may be applied to either the device 10 (see FIGS. 20A and 20B) or the device 20 (see FIGS. 21A and 21B). FIG. 22A illustrates a cross-sectional view of dielectric layer 38 having regions 38A, 38B, 38C, and 38D. FIGS. 22B, 22C, 22D, and 22E illustrate respective top down views of each of the regions 38A, 38B, 38C, and 38D. Each of the regions 38A, 38B, 38C, and 38D have a different width, which decreases in a direction towards the semiconductor substrate 50 (see FIGS. 20A and 21A). For example, the region 38A has a width W3, which is greater than a width W4 of the region 38B. The width W3 may further be greater than a dimension CD3 of the dummy gate 72 and greater than a dimension CD4 of the gate spacers 80/86. In FIGS. 22B through 22E, the dimension CD3 may be a distance between opposing sidewalls of the dummy gate 72 measured along a channel length direction of the dummy gate 72, and the dimension CD4 may be a distance between opposing outer sidewalls (e.g., opposite the dummy gate 72) of the gate spacers 80/86. The width W4 of the region 38B is greater than a width W5 of the region 38C. The width W4 may further be greater than the dimension CD3 of the dummy gate 72 and equal to the dimension CD4 of the gate spacers 80/86. The width W5 of the region 38C is greater than a width W7 of the region 38D. The width W5 may be less than the dimension CD4 of the gate spacers 80/86 and greater than the dimension CD4 of the dummy gate 72. The width W6 may be equal to the dimension CD3 of the dummy gate 72 and less than the dimension CD4 of the gate spacers 80/86.

The configuration of FIGS. 22A through 22E may result from applying multiple cycles of the process described above with respect to FIGS. 18A through 19B. For example, FIGS. 22A through 22E may be achieved by applying three cycles. Further, by applying multiple cycles, an upper portion of the gate spacers 80/86 may be removed completely such that sidewalls of the dielectric material 38 directly contacts the first ILD 88. Additional cycles or fewer cycles may be applied in other embodiments. For example, in other embodiments, one or more of the regions 38A or 38B may be omitted, or the dielectric material 38 may comprise one or more additional regions (e.g., wider regions) over the region 38A.

Figures 23A, 23B, 23C:
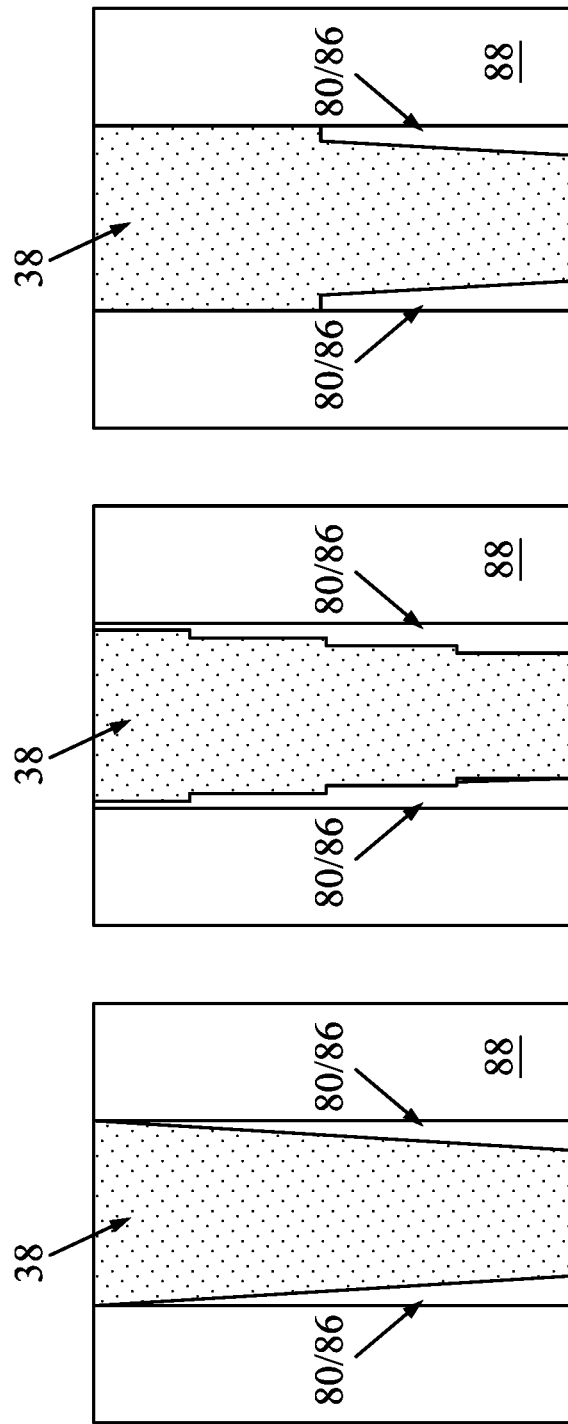

FIGS. 23A through 23C illustrate cross-sectional views of additional embodiments of the dielectric material 38. Compared to the embodiments of FIGS. 20A through 22E, which illustrate the dielectric material 38 as having substantially (e.g., within manufacturing tolerances) straight sidewalls that are substantially perpendicular to a major surface of the semiconductor substrate 50, the dielectric material 38 may also have sloped sidewalls. FIG. 23A illustrates an embodiment where the dielectric material 38 has a continuously and constantly decreasing width in a direction towards the semiconductor substrate 50. FIG. 23B illustrates an embodiment where the dielectric material 38 has a continuously and discretely decreasing width in a direction towards the semiconductor substrate 50. For example, in FIG. 23B, a width of the dielectric material 38 may decrease abruptly at discrete intervals. FIG. 23C illustrates an embodiment where the dielectric material 38 has both straight and sloped sidewall, and the gate spacers 80/86 only extend partially along sidewalls of the dielectric material 38. A portion of the dielectric material 38 bounded by the gate spacers 80/86 may have a continuously and constantly decreasing width in a direction towards the semiconductor substrate 50 whereas a portion of the dielectric material 38 above the gate spacers 80/86 may have a substantially constant width (e.g., within manufacturing tolerances).

FIGS. 24A through 32B illustrate additional immediate stages of forming a replacement gate and contacts to the transistor device. In FIGS. 24A through 32B, figures that end in "A" are illustrated along the respective cross-section A-A of FIGS. 1A and 1B, and Figures that end in "B" are illustrated along the respective cross-section B-B of FIGS. 1A and 1B.

Figure 24A:
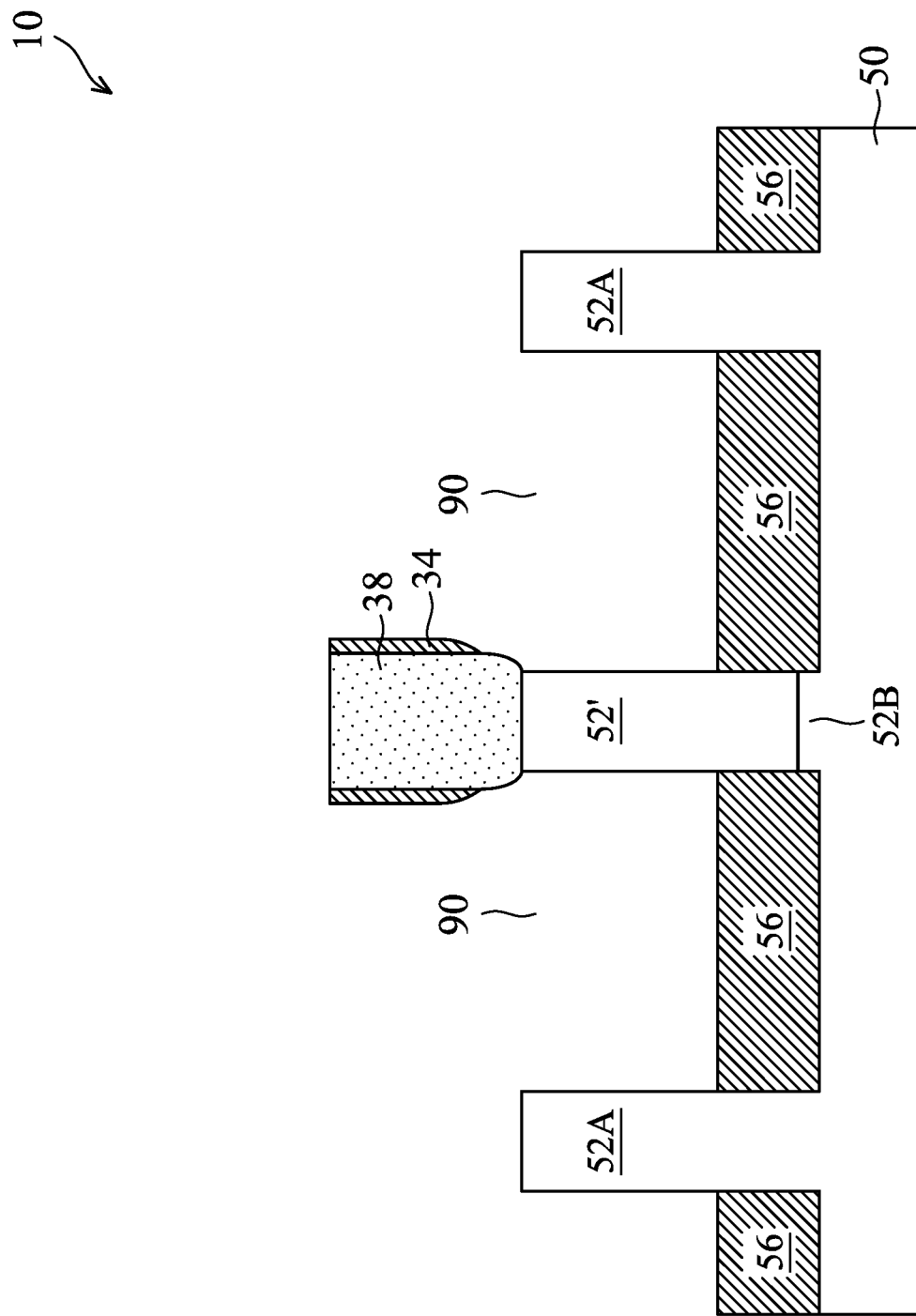
Figure 24B:
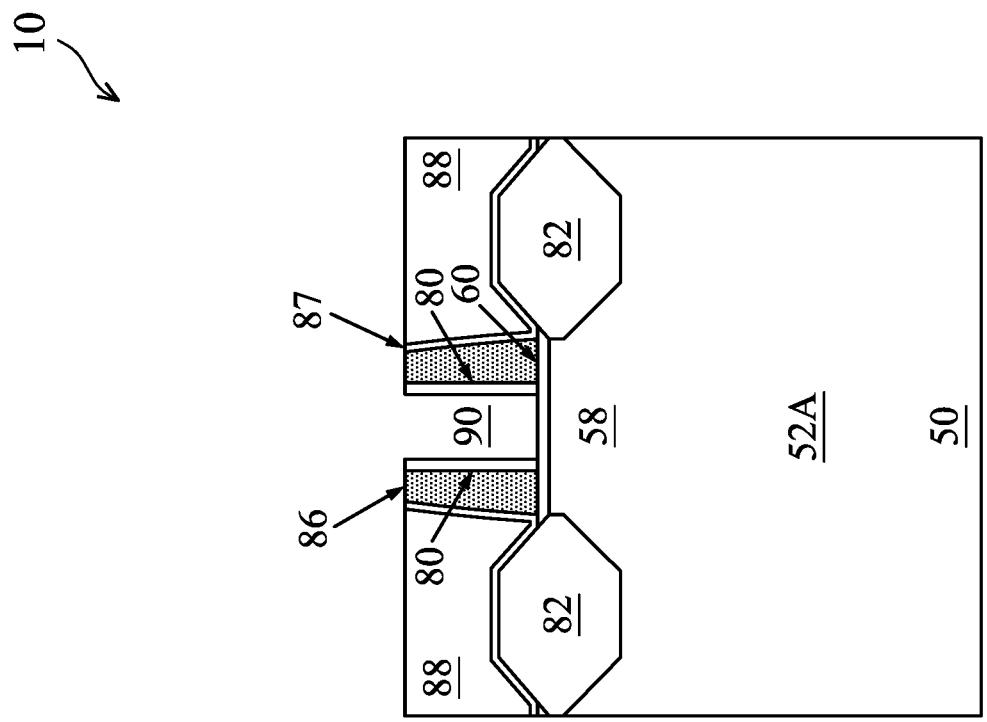

In FIGS. 24A and 24B, the remaining dummy gates 72, and the masks 74 if present, are removed in an etching step(s), so that recesses 90 are formed. Portions of the dummy dielectric layer 60 in the recesses 90 may also be removed. In some embodiments, only the dummy gates 72 are removed and the dummy dielectric layer 60 remains and is exposed by the recesses 90. In some embodiments, the dummy dielectric layer 60 is removed from recesses 90 in a first region of a die (e.g., a core logic region) and remains in recesses 90 in a second region of the die (e.g., an input/output region). In some embodiments, the dummy gates 72 are removed by an anisotropic dry etch process. For example, the etching process may include a dry etch process using reaction gas(es) that selectively etch the dummy gates 72 without etching the first ILD 88 or the gate spacers 86. Each recess 90 exposes and/or overlies a channel region 58 of a respective fin 52A. Each channel region 58 is disposed between neighboring pairs of the epitaxial source/drain regions 82. During the removal, the dummy dielectric layer 60 may be used as an etch stop layer when the dummy gates 72 are etched.

Figure 25A:
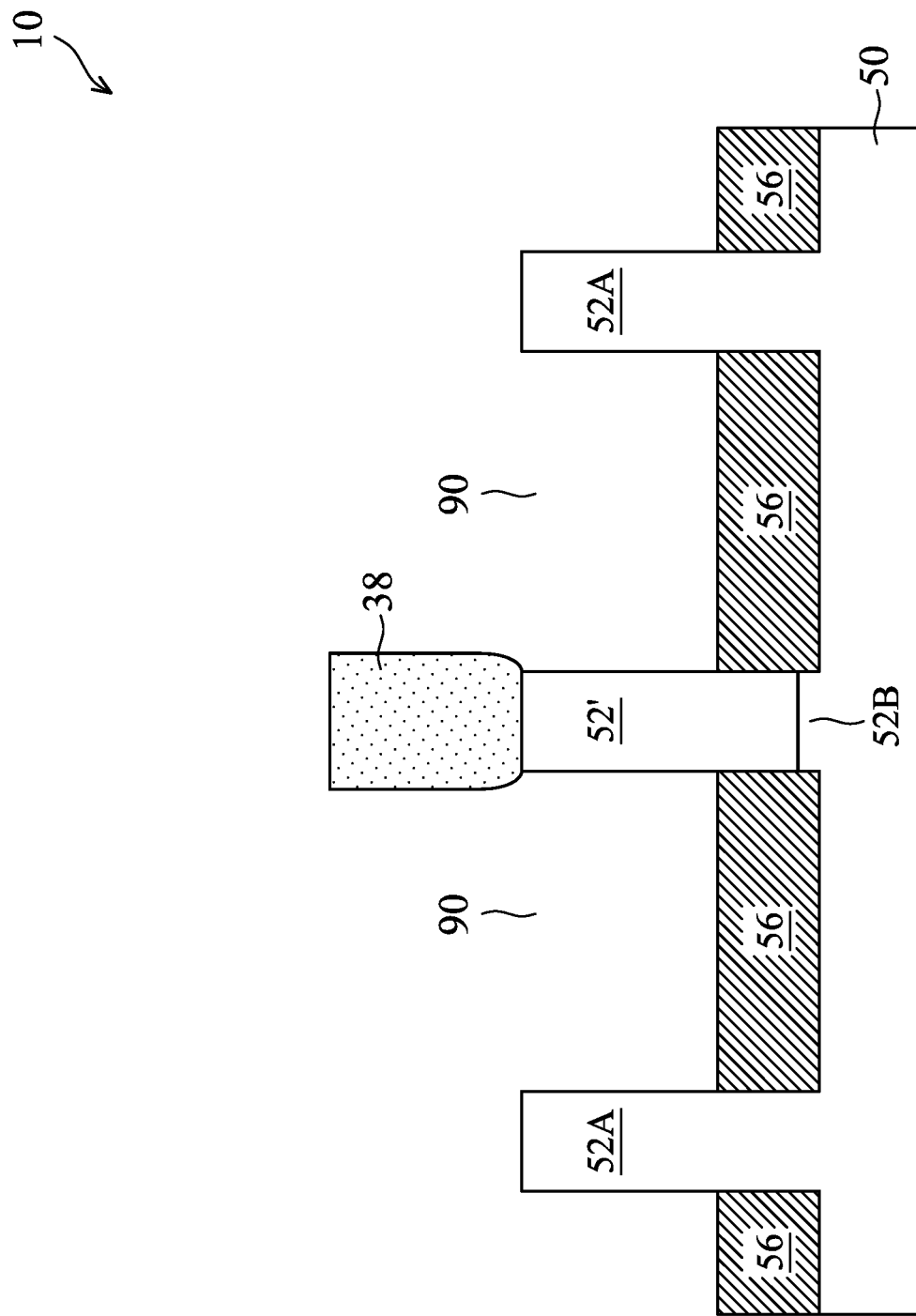
Figure 25B:
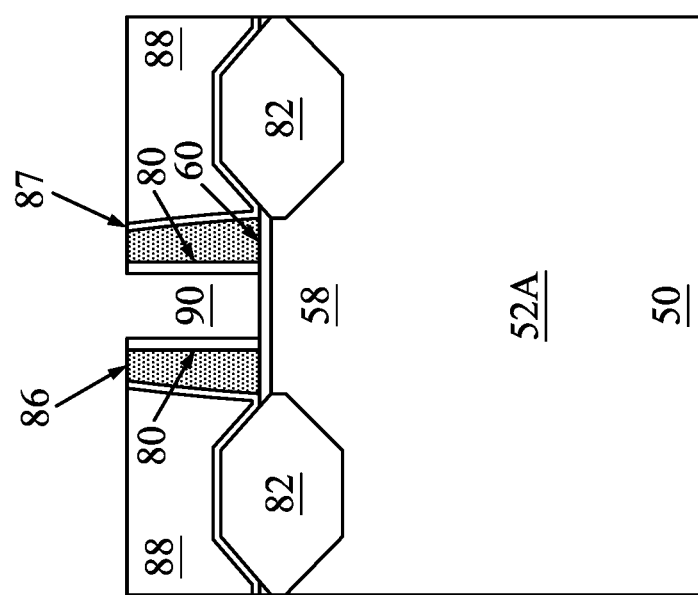

The dummy dielectric layer 60 may then be optionally removed after the removal of the dummy gates 72. In some embodiments, the dummy dielectric layer 60 may have a same material composition or a similar material composition as the passivation regions 34. Accordingly, removing the dummy dielectric layer 60 may also remove a portion of the passivation regions 34 or completely remove the passivation regions 34 (e.g., as illustrated by FIGS. 25A and 25B).

Figure 26B:
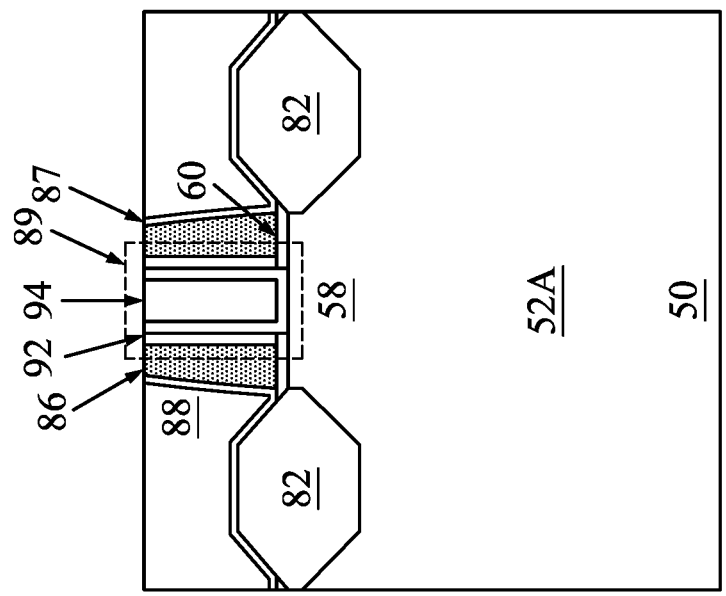
Figure 26A:
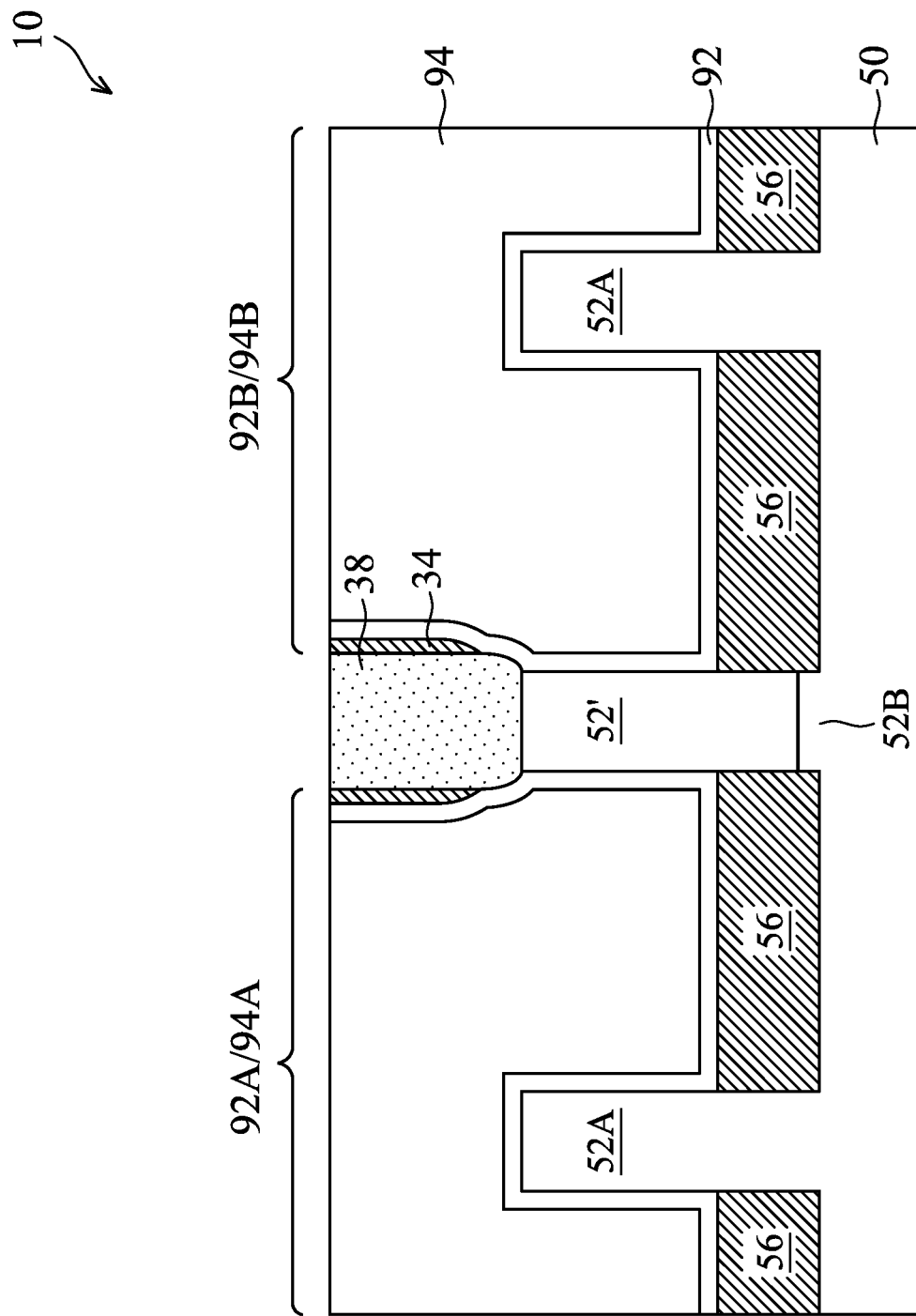
Figure 26C:
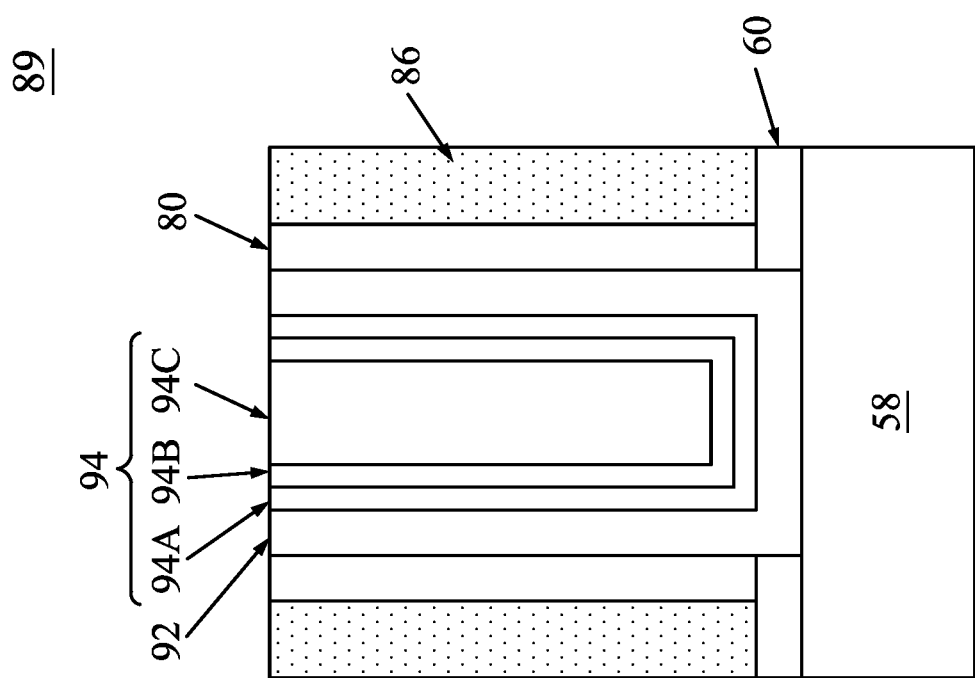
Figure 27:
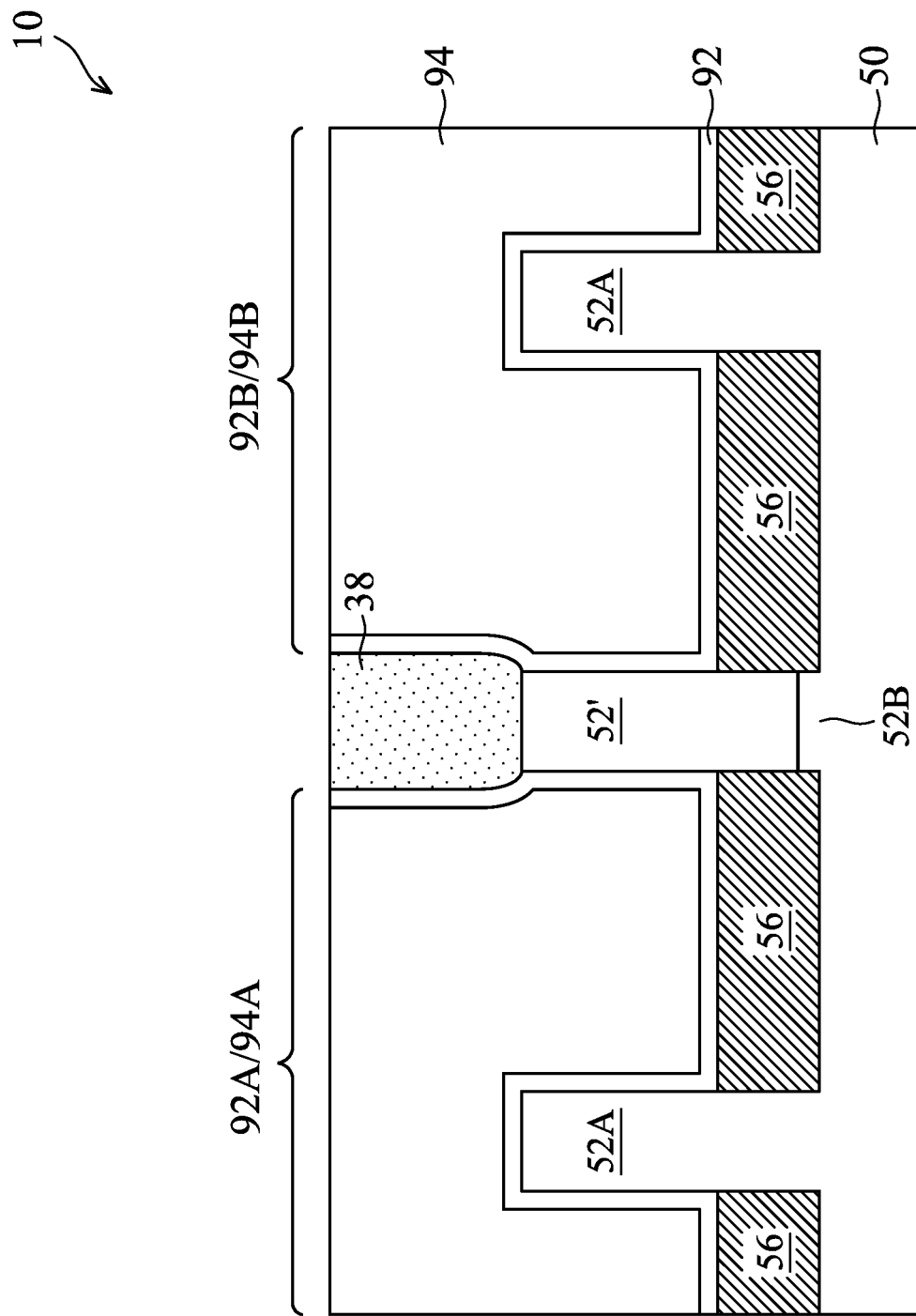

In FIGS. 26A and 26B, gate dielectric layers 92 and gate electrodes 94 are formed for replacement gates. FIG. 26C illustrates a detailed view of region 89 of FIG. 26B. FIG. 27 illustrates forming the gate dielectric layers 92 and the gate electrodes 94 in embodiments where the passivation regions 35 are removed. Gate dielectric layers 92 are deposited conformally in the recesses 90, such as on the top surfaces and the sidewalls of the fins 52A, on sidewalls of the dummy fin 52', on sidewalls of the dielectric material 38, on sidewalls of the passivation regions 34 (if present) and on sidewalls of the gate seal spacers 80/gate spacers 86. The gate dielectric layers 92 may also be formed on the top surface of the first ILD 88. In accordance with some embodiments, the gate dielectric layers 92 comprise silicon oxide, silicon nitride, or multilayers thereof. In some embodiments, the gate dielectric layers 92 include a high-k dielectric material, and in these embodiments, the gate dielectric layers 92 may have a k value greater than about 7.0, and may include a metal oxide or a silicate of hafnium, aluminum, zirconium, lanthanum, manganese, barium, titanium, lead, and combinations thereof. The formation methods of the gate dielectric layers 92 may include Molecular-Beam Deposition (MBD), ALD, PECVD, and the like. In embodiments where portions of the dummy gate dielectric 60 remains in the recesses 90, the gate dielectric layers 92 include a material of the dummy gate dielectric 60 (e.g., $SiO_2$).

The gate electrodes 94 are deposited over the gate dielectric layers 92, respectively, and fill the remaining portions of the recesses 90. By removing portions of the film 106 from sidewalls of the dummy fin 52', a space between the fins 52 and the dummy fin 52' can be increased. As a result, the gate electrodes 94 can be deposited in the space around and between the fins 52/dummy fin 52' with fewer defects (e.g., fewer voids).

The gate electrodes 94 may include a metal-containing material such as titanium nitride, titanium oxide, tantalum nitride, tantalum carbide, cobalt, ruthenium, aluminum, tungsten, combinations thereof, or multi-layers thereof. For example, although a single layer gate electrode 94 is illustrated in FIG. 26B, the gate electrode 94 may comprise any number of liner layers 94A, any number of work function tuning layers 94B, and a fill material 94C as illustrated by FIG. 26C. After the filling of the recesses 90, a planarization process, such as a CMP, may be performed to remove the excess portions of the gate dielectric layers 92 and the material of the gate electrodes 94, which excess portions are over the top surface of the ILD 88. The remaining portions of material of the gate electrodes 94 and the gate dielectric layers 92 thus form replacement gates of the resulting FinFETs. The gate electrodes 94 and the gate dielectric layers 92 may be collectively referred to as a "gate stack." The gate and the gate stacks may extend along sidewalls of a channel region 58 of the fins 52A. The dielectric material 38 and the dummy fin 52' isolates adjacent gate stacks (e.g., gate stack 92A/94A and gate stack 92B/94B) when the adjacent gate stacks correspond to different FinFETs. For example, the gate stack 92A/94A is arranged and separated from the gate stack 92B/94B in a channel width direction by the dielectric material 38 and the dummy fin 52' (if present). The adjacent gate stacks may be separated and arranged along the channel width direction of the FinFETs.

The formation of the gate dielectric layers 92 in the region 50N and the region 50P may occur simultaneously such that the gate dielectric layers 92 in each region are formed from the same materials, and the formation of the gate electrodes 94 may occur simultaneously such that the gate electrodes 94 in each region are formed from the same materials. In some embodiments, the gate dielectric layers 92 in each region may be formed by distinct processes, such that the gate dielectric layers 92 may be different materials, and/or the gate electrodes 94 in each region may be formed by distinct processes, such that the gate electrodes 94 may be different materials. Various masking steps may be used to mask and expose appropriate regions when using distinct processes.

Figure 28A:
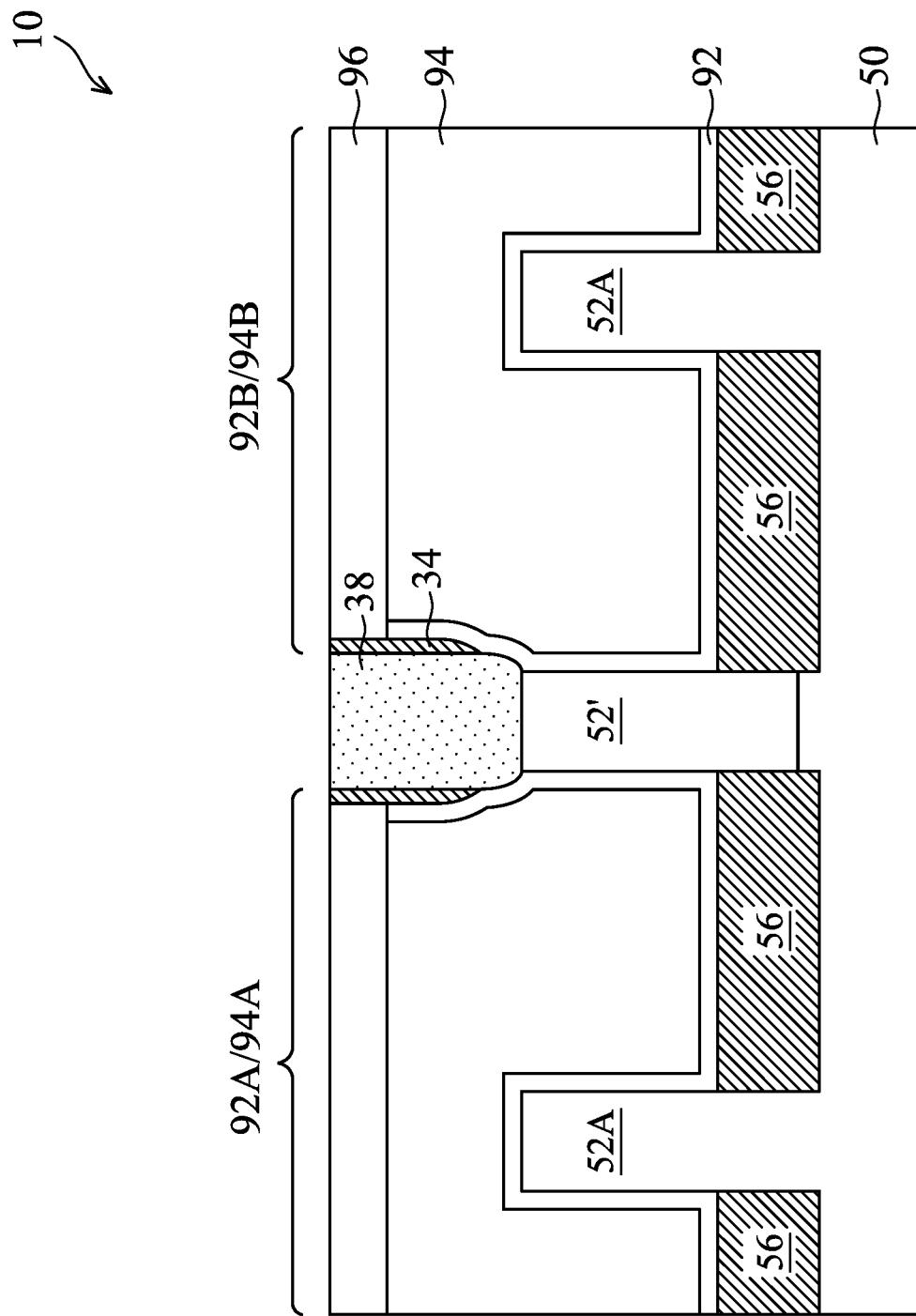
Figure 28B:
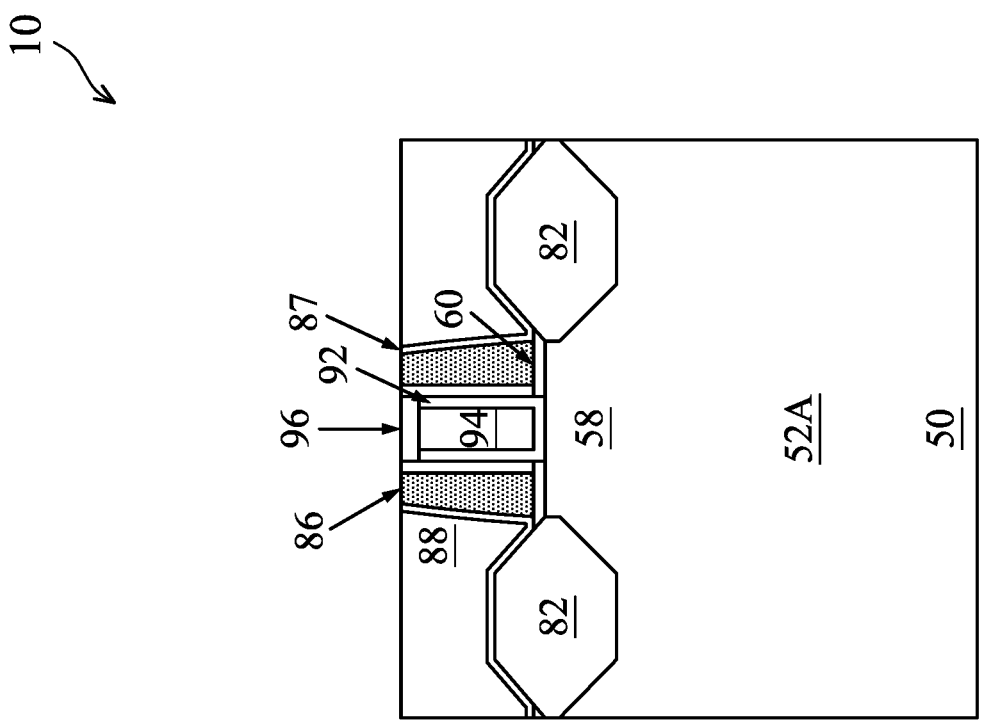

In FIGS. 28A and 28B, the gate stack (including a gate dielectric layer 92 and a corresponding overlying gate electrode 94) is recessed, so that a recess is formed directly over the gate stack and between opposing portions of gate spacers 86. The etching process may be selective such that the dielectric material 38 is not significantly etched. A gate mask 96 comprising one or more layers of dielectric material, such as silicon nitride, silicon oxynitride, or the like, is filled in the recess, followed by a planarization process to remove excess portions of the dielectric material extending over the first ILD 88. The subsequently formed gate contacts 110 (FIGS. 29A and 29B) penetrate through the gate mask 96 to contact the top surface of the recessed gate electrode 94. The dielectric material 38 may extend through the gate mask 96.

Figure 29A:
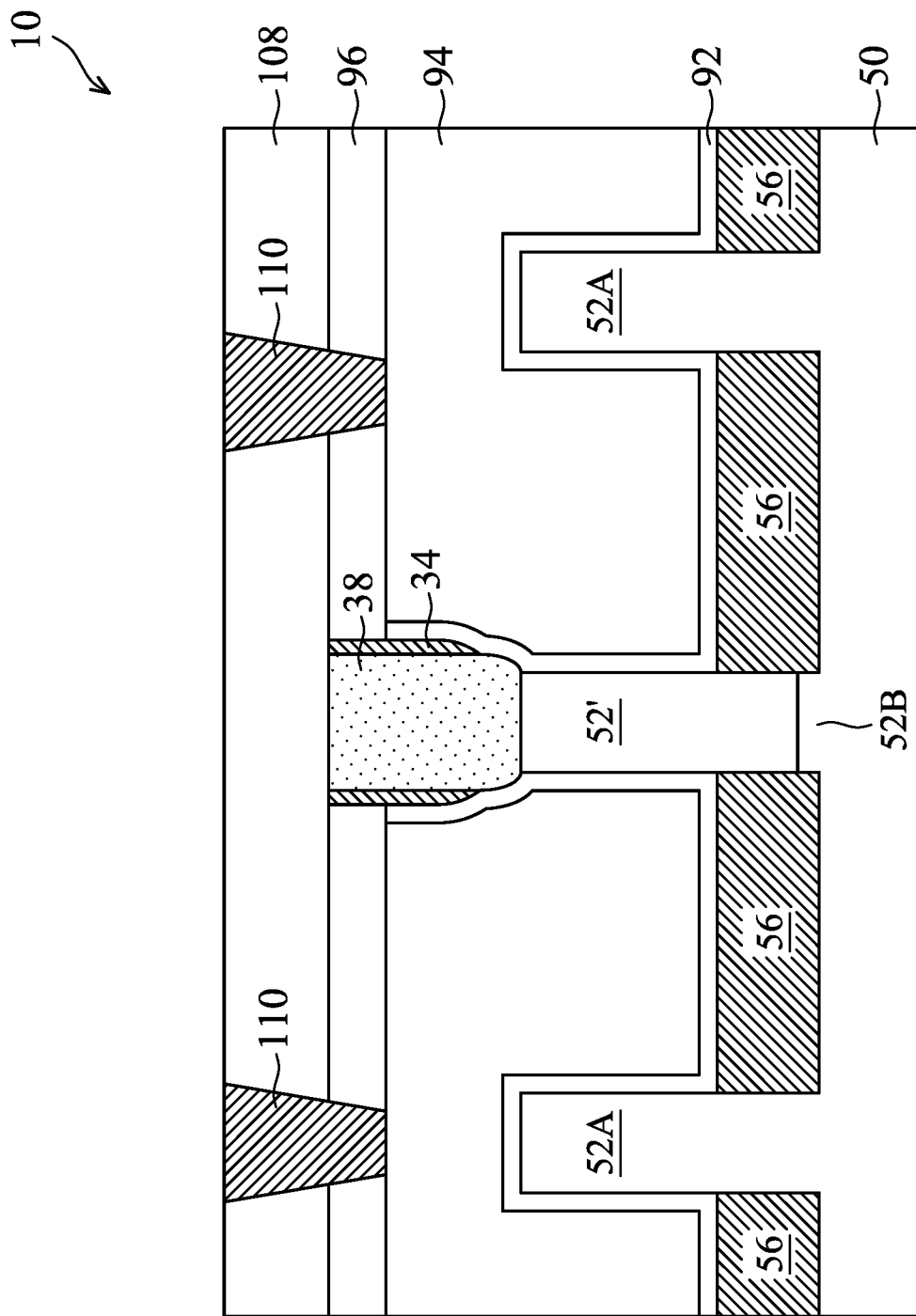
Figure 29B:
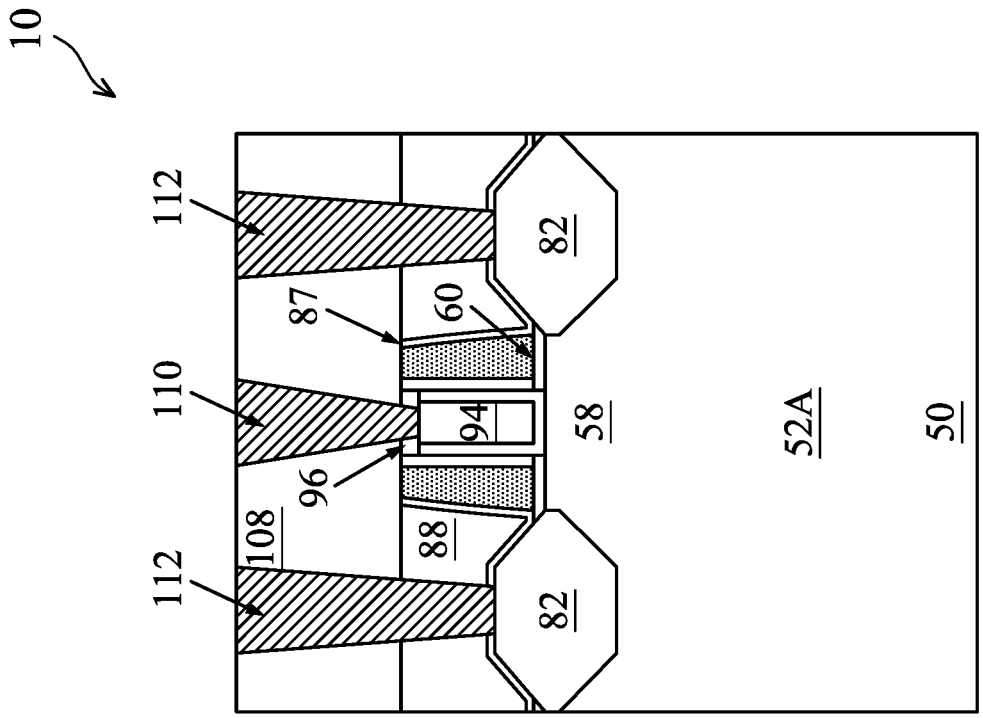

In FIGS. 29A and 29B, a second ILD 108 is deposited over the first ILD 88. In some embodiment, the second ILD 108 is a flowable film formed by a flowable CVD method.

In some embodiments, the second ILD 108 is formed of a dielectric material such as PSG, BSG, BPSG, USG, or the like, and may be deposited by any suitable method, such as CVD and PECVD.

Figure 30A:
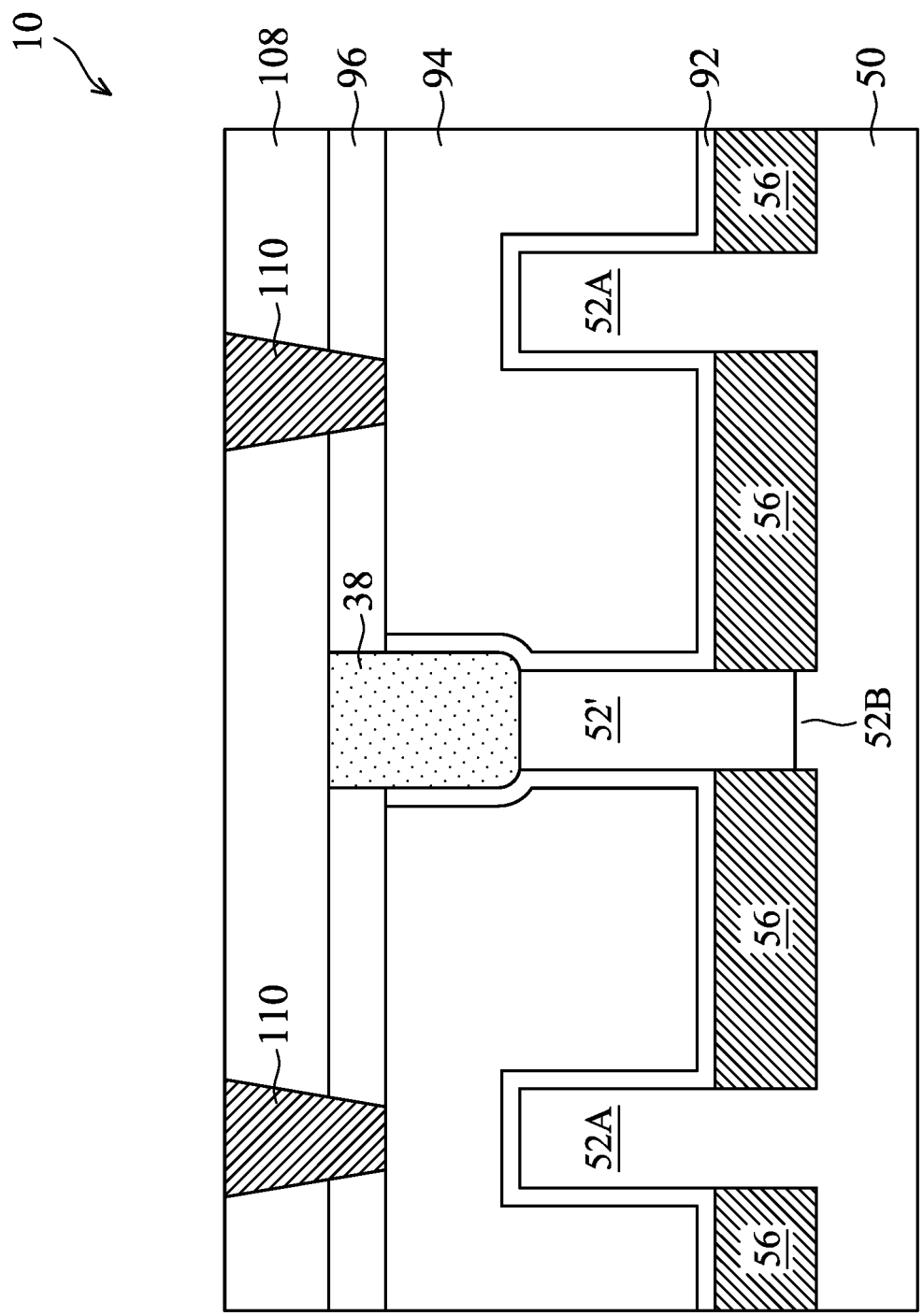
Figure 31B:
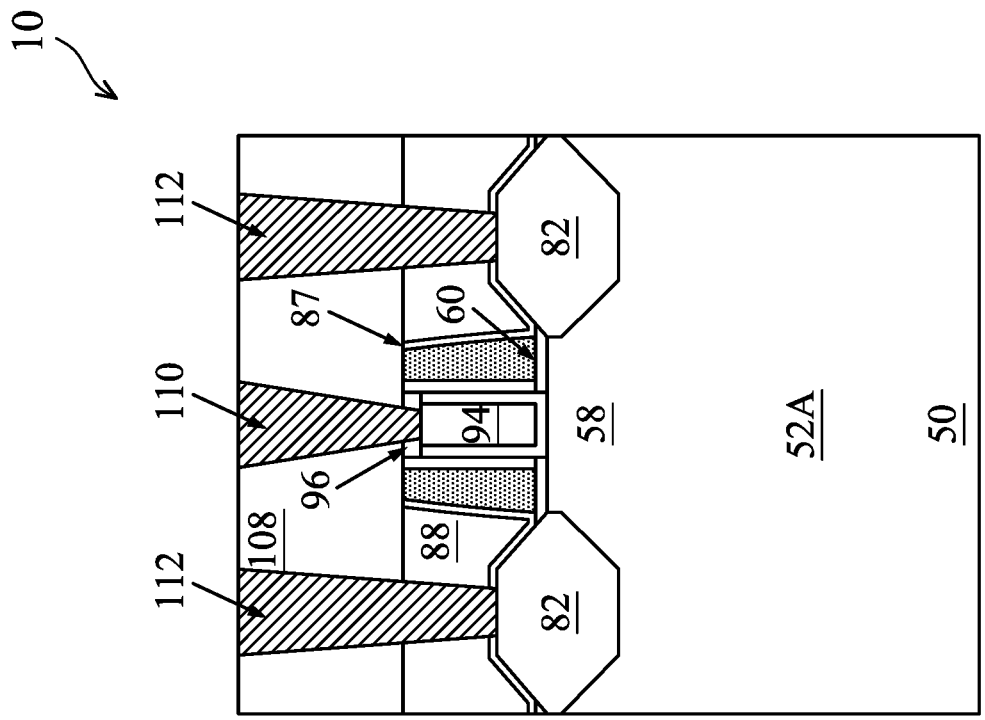
Figure 30B:
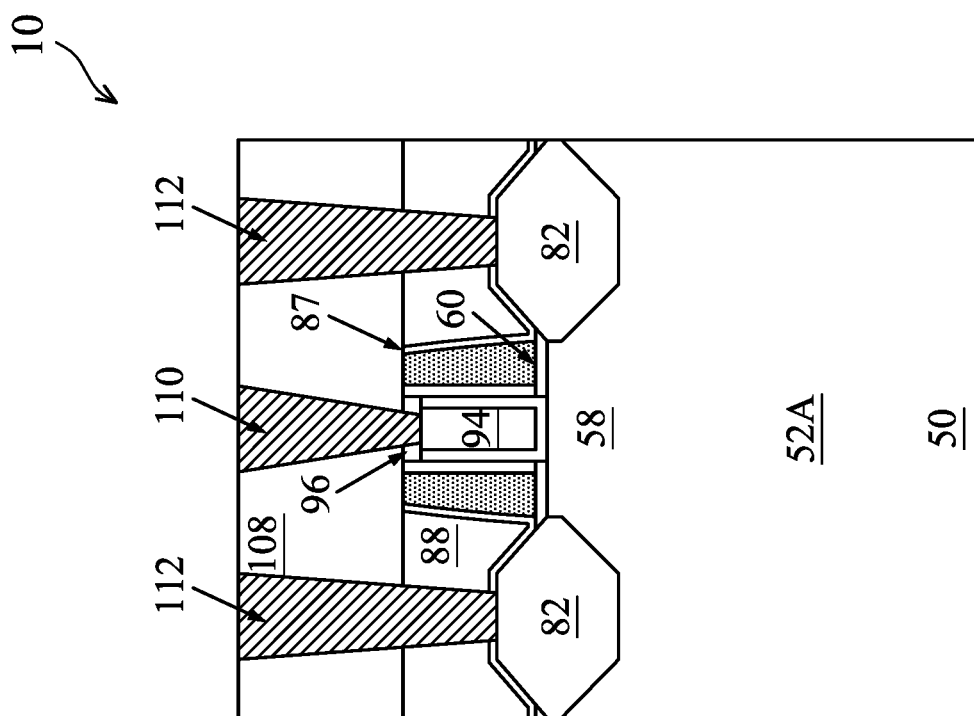
Figure 31A:
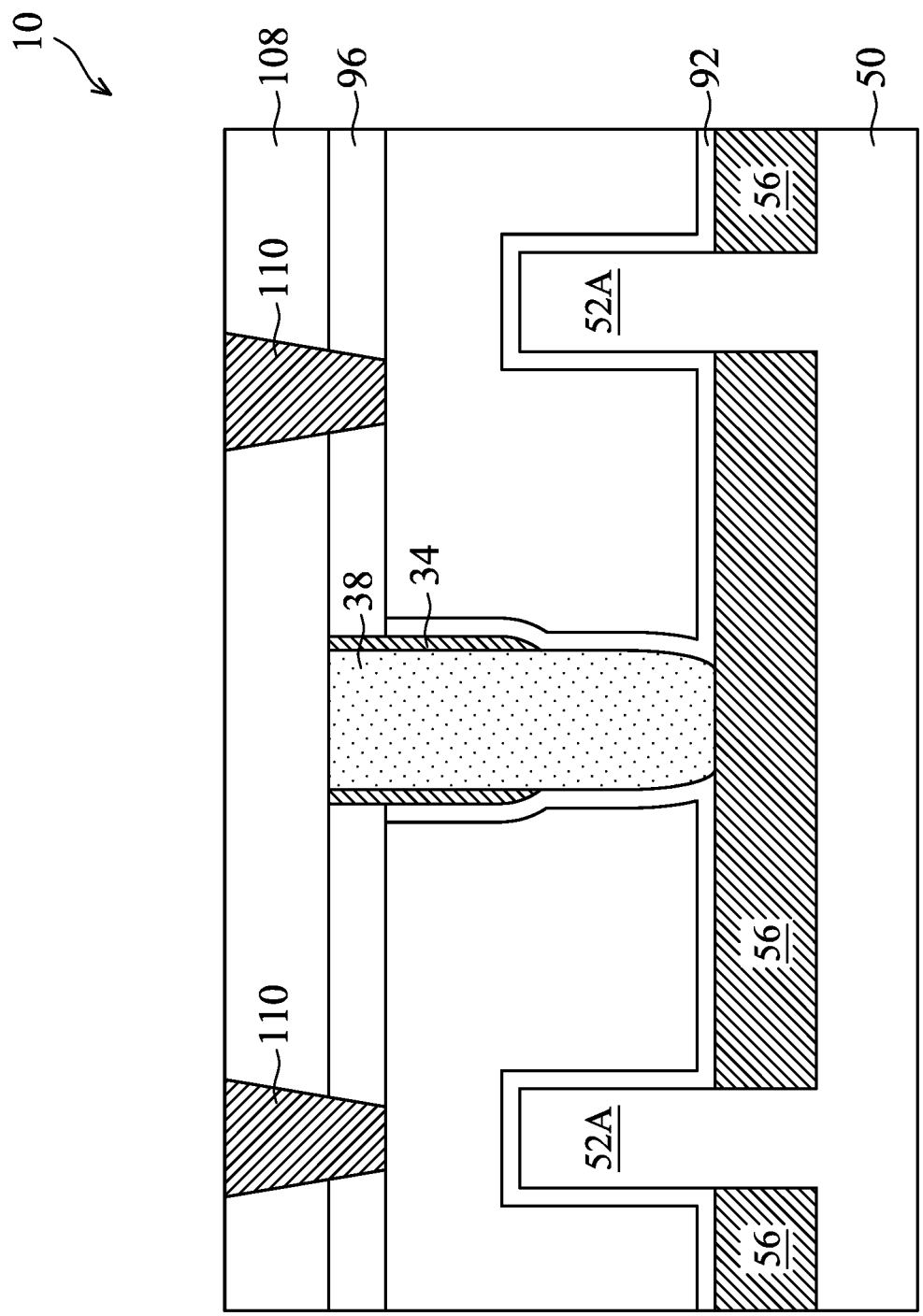
Figure 32A:
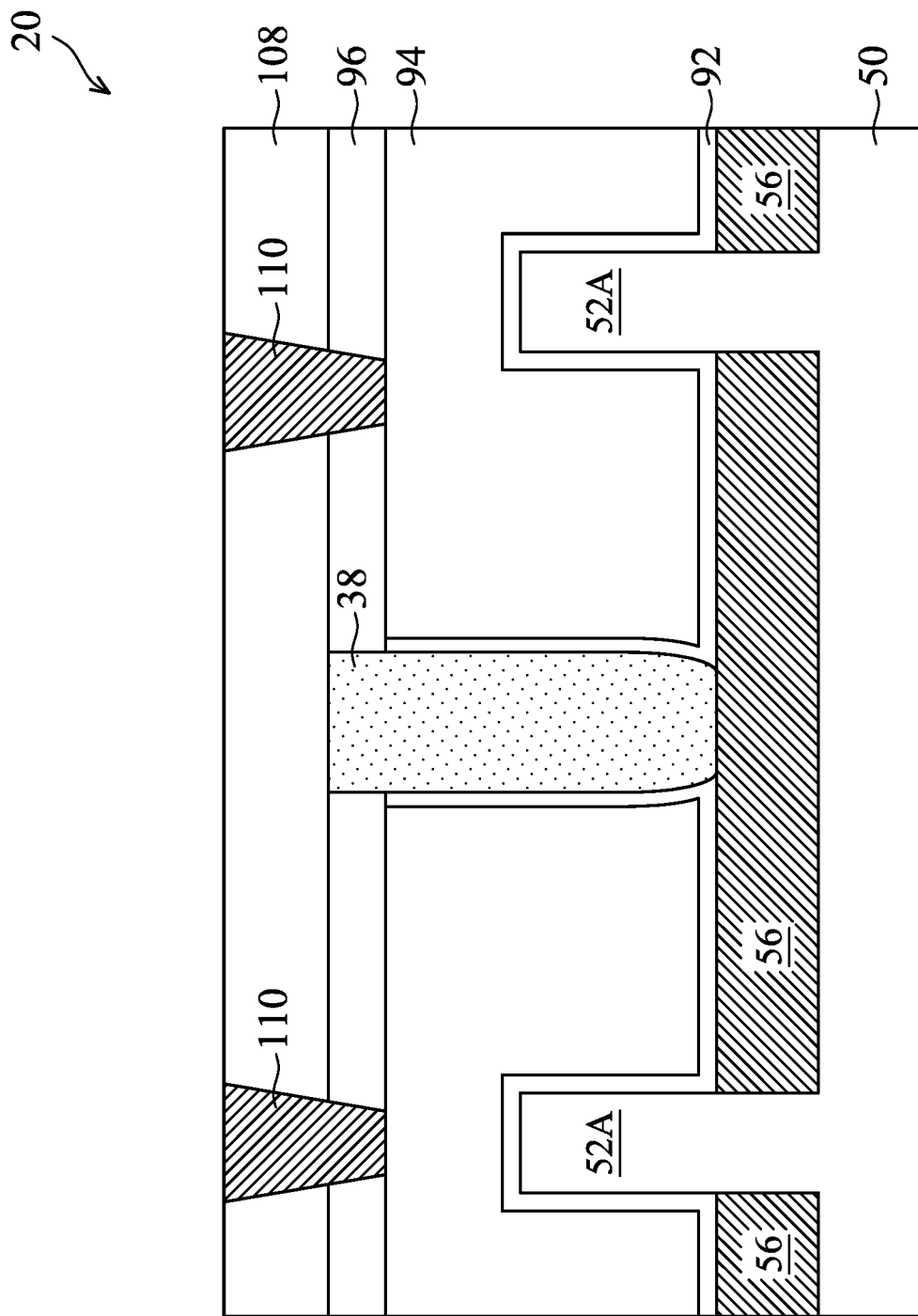
Figure 32B:
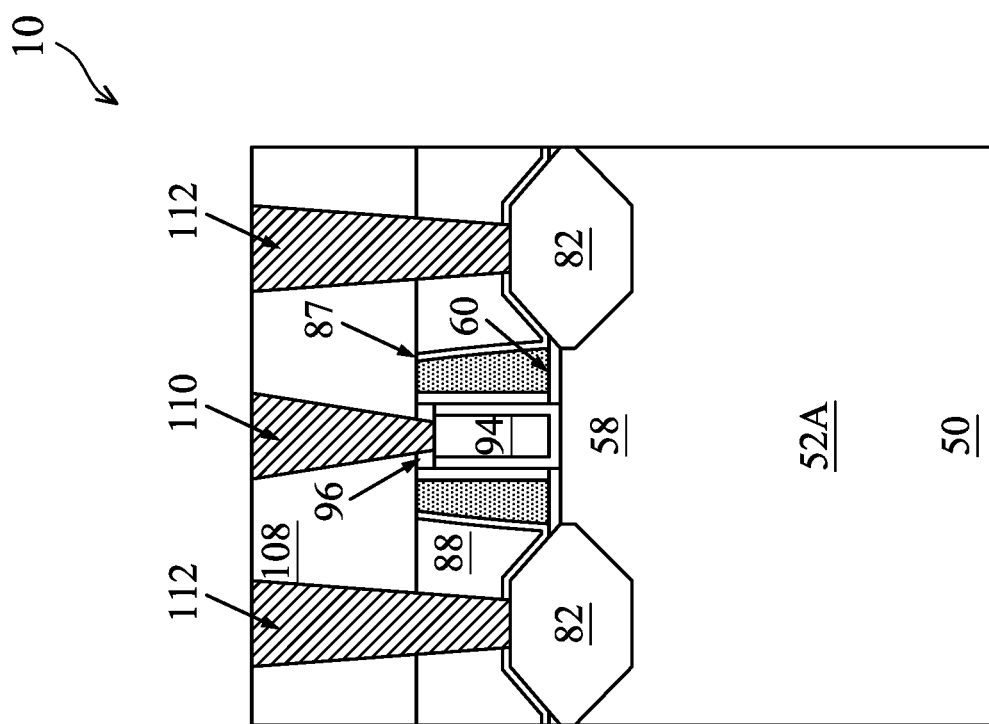

Also illustrated in FIGS. 29A and 29B, gate contacts 110 and source/drain contacts 112 are formed through the second ILD 108 and the first ILD 88 in accordance with some embodiments. FIGS. 30A and 30B illustrate an analogous step in embodiments where the passivation regions 34 are removed. FIGS. 31A and 31B illustrate an analogous stage of manufacturing in the device 20 where the dummy fin 52' is omitted, and FIGS. 32A and 32B illustrate an analogous stage of manufacturing in the device 20 where the dummy fin 52' is omitted and the passivation regions 34 are also removed. Openings for the source/drain contacts 112 are formed through the first and second ILDs 88 and 108, and openings for the gate contact 110 are formed through the second ILD 108 and the gate mask 96. The openings may be formed using acceptable photolithography and etching techniques. A liner, such as a diffusion barrier layer, an adhesion layer, or the like, and a conductive material are formed in the openings. The liner may include titanium, titanium nitride, tantalum, tantalum nitride, or the like. The conductive material may be copper, a copper alloy, silver, gold, tungsten, cobalt, aluminum, nickel, or the like. A planarization process, such as a CMP, may be performed to remove excess material from a surface of the ILD 108. The remaining liner and conductive material form the source/drain contacts 112 and gate contacts 110 in the openings. An anneal process may be performed to form a silicide at the interface between the epitaxial source/drain regions 82 and the source/drain contacts 112. The source/drain contacts 112 are physically and electrically coupled to the epitaxial source/drain regions 82, and the gate contacts 110 are physically and electrically coupled to the gate electrodes 106. The source/drain contacts 112 and gate contacts 110 may be formed in different processes, or may be formed in the same process. Although shown as being formed in the same cross-sections, it should be appreciated that each of the source/drain contacts 112 and gate contacts 110 may be formed in different cross-sections, which may avoid shorting of the contacts.

The above embodiments describe the dielectric material 38 being formed prior to the gate stacks 92/94. In other embodiments, the gate stacks (e.g., comprising gate dielectric 92 and gate electrodes 94) may be formed prior to forming the dielectric material 38. For example, FIGS. 33A through 36D illustrate intermediate cross-sectional views of forming the dielectric material after the gate stacks 92/94 using a metal gate cut process, for example. In FIGS. 33A through 36B, figures that end in "A" are illustrated along the respective cross-section A-A of FIGS. 1A and 1B, and Figures that end in "B" are illustrated along the respective cross-section D-D of FIGS. 1A and 1B. FIGS. 36C and 36D illustrate top-down views. FIGS. 33A through 36D illustrate similar processes as those described above with respect to FIGS. 17A through 20D where like reference numerals indicate like elements formed using like processes.

Figure 33B:
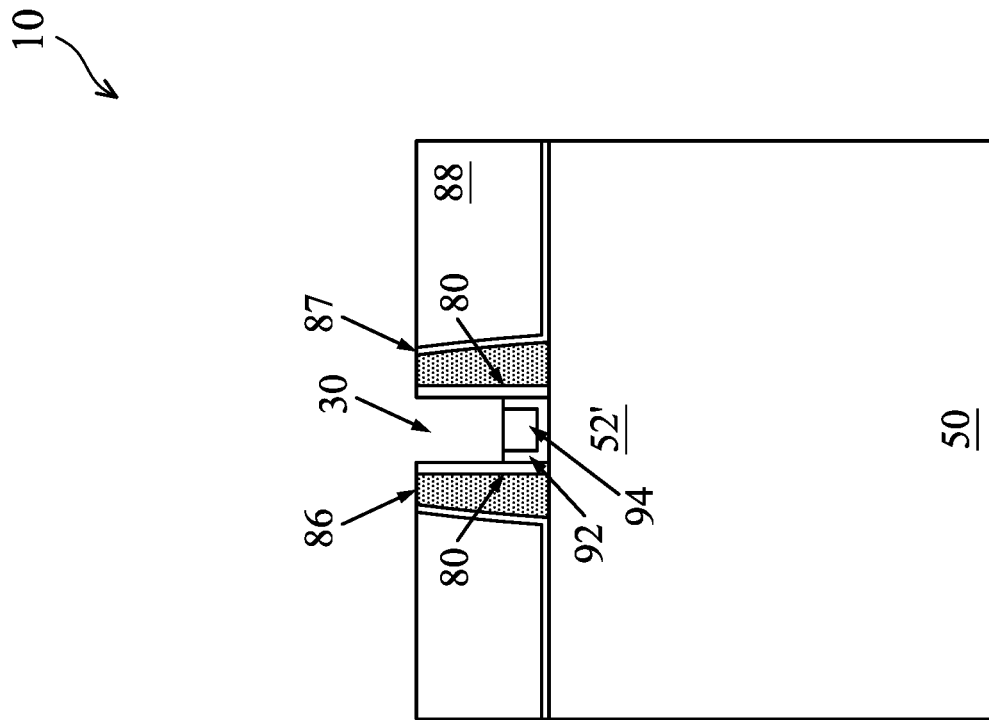
Figure 33A:
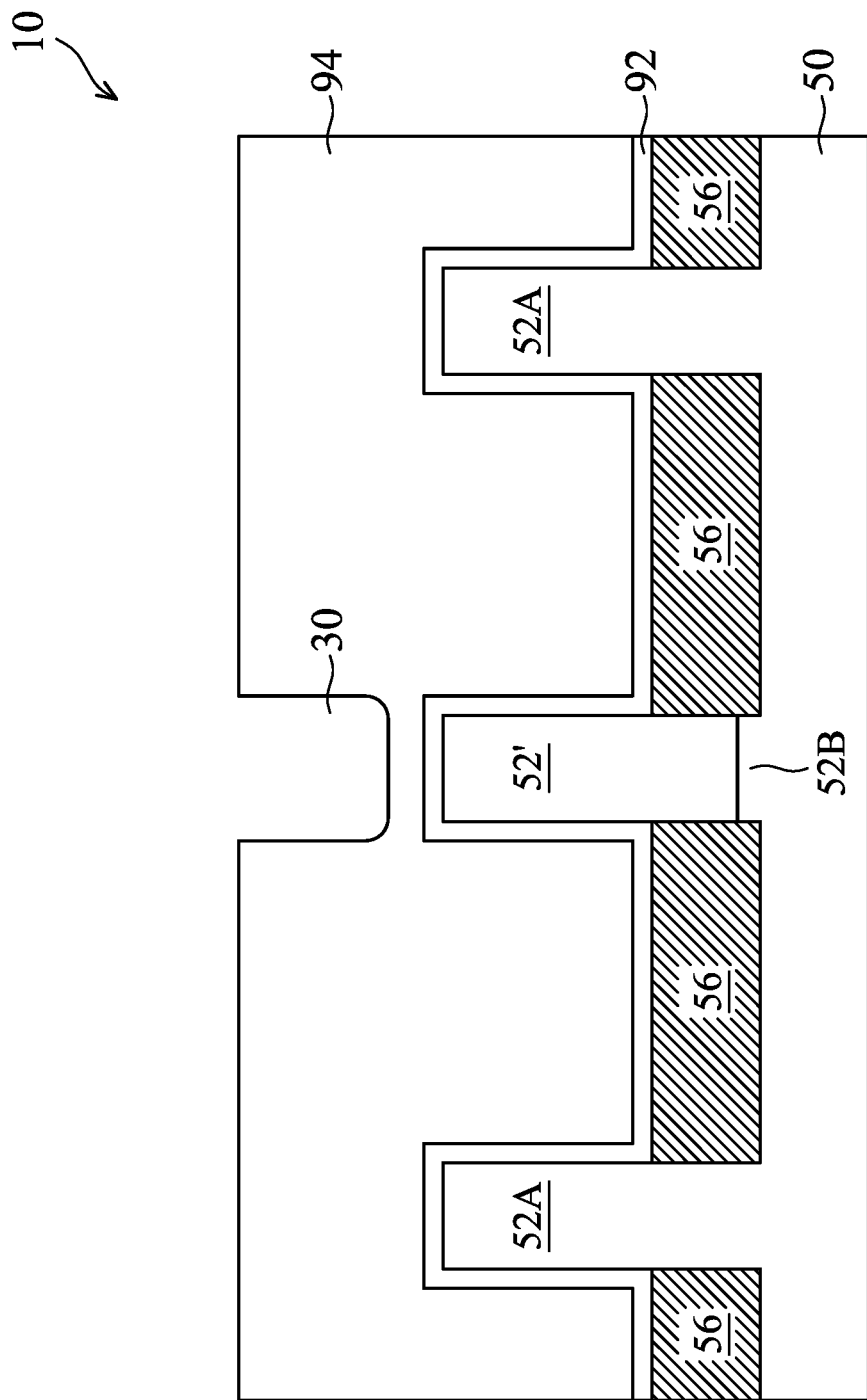

In FIGS. 33A and 33B, the gate stack 92/94 may be etched to define an opening (e.g., as described above with respect to FIGS. 17A and 17B). In embodiments with a dummy fin 52', the opening 30 may be formed directly over the dummy fin 52'.

Figure 34A:
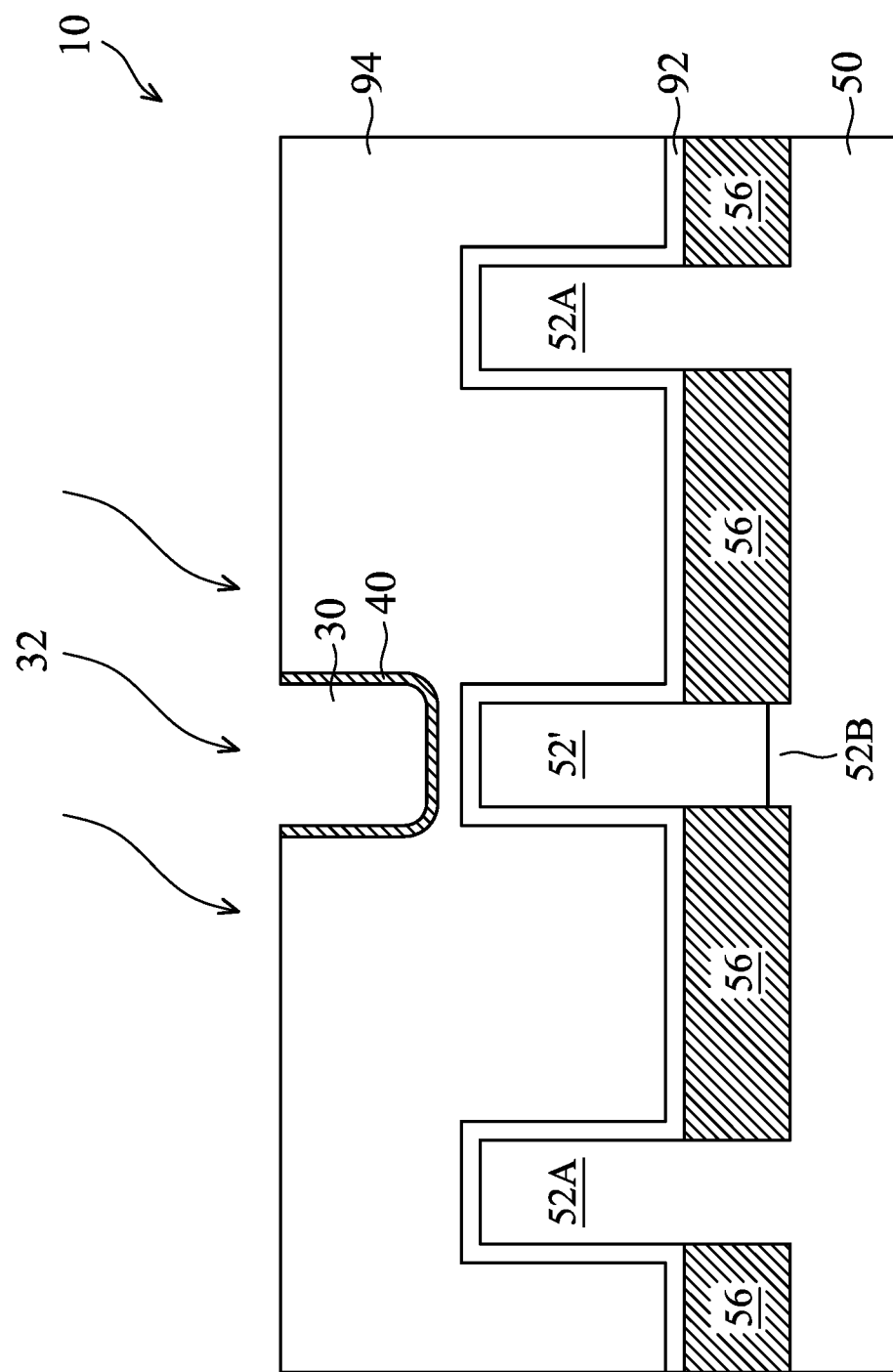
Figure 34B:
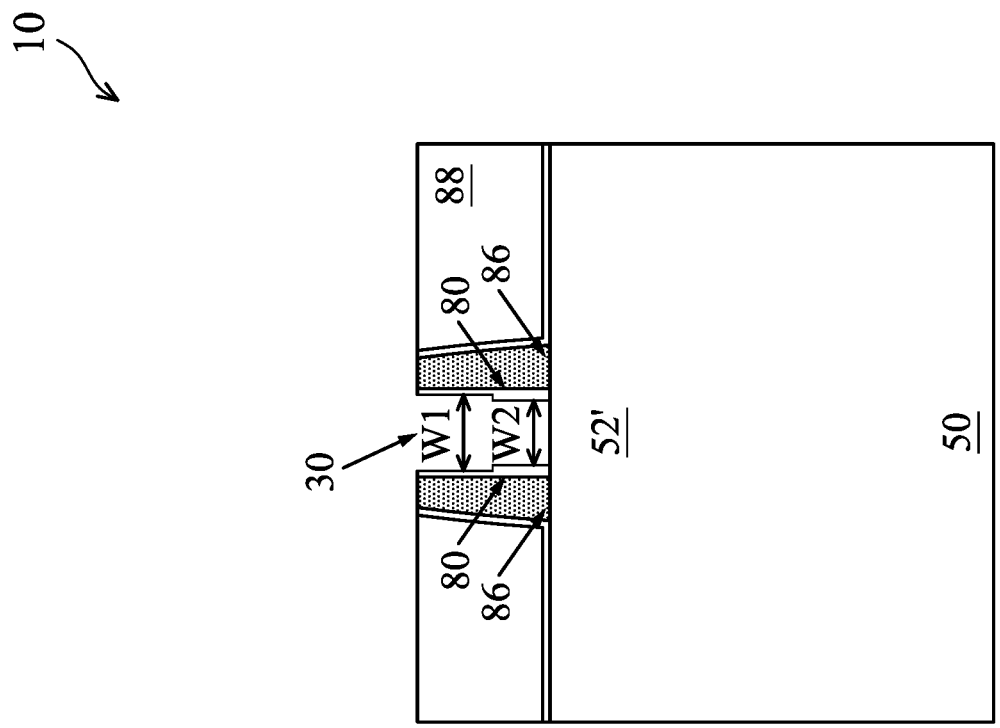
Figure 35B:
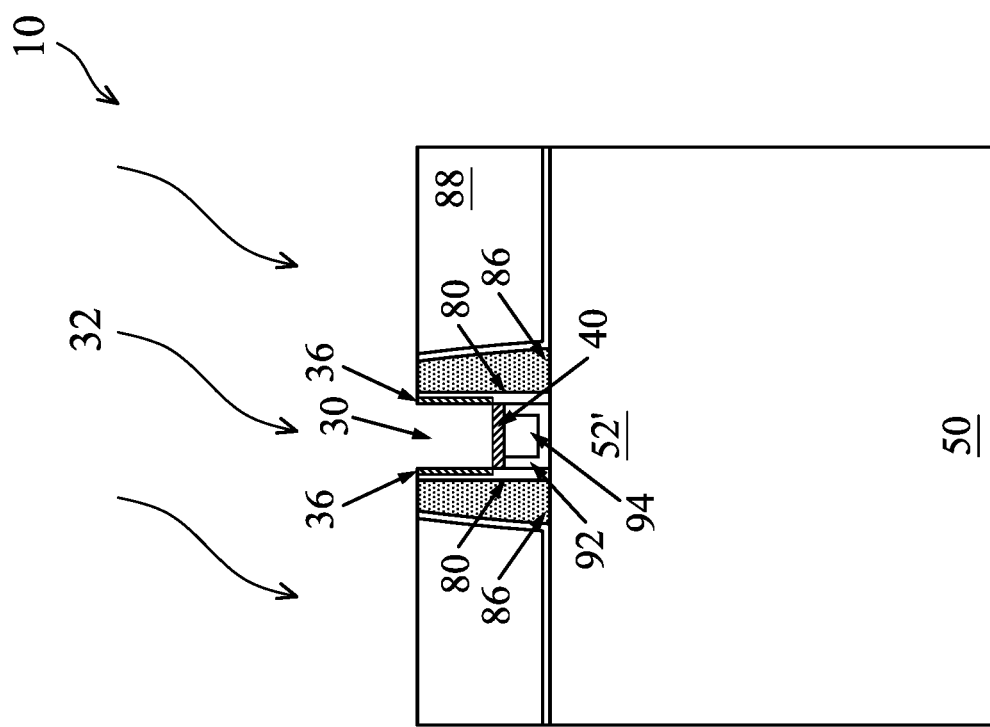
Figure 35A:
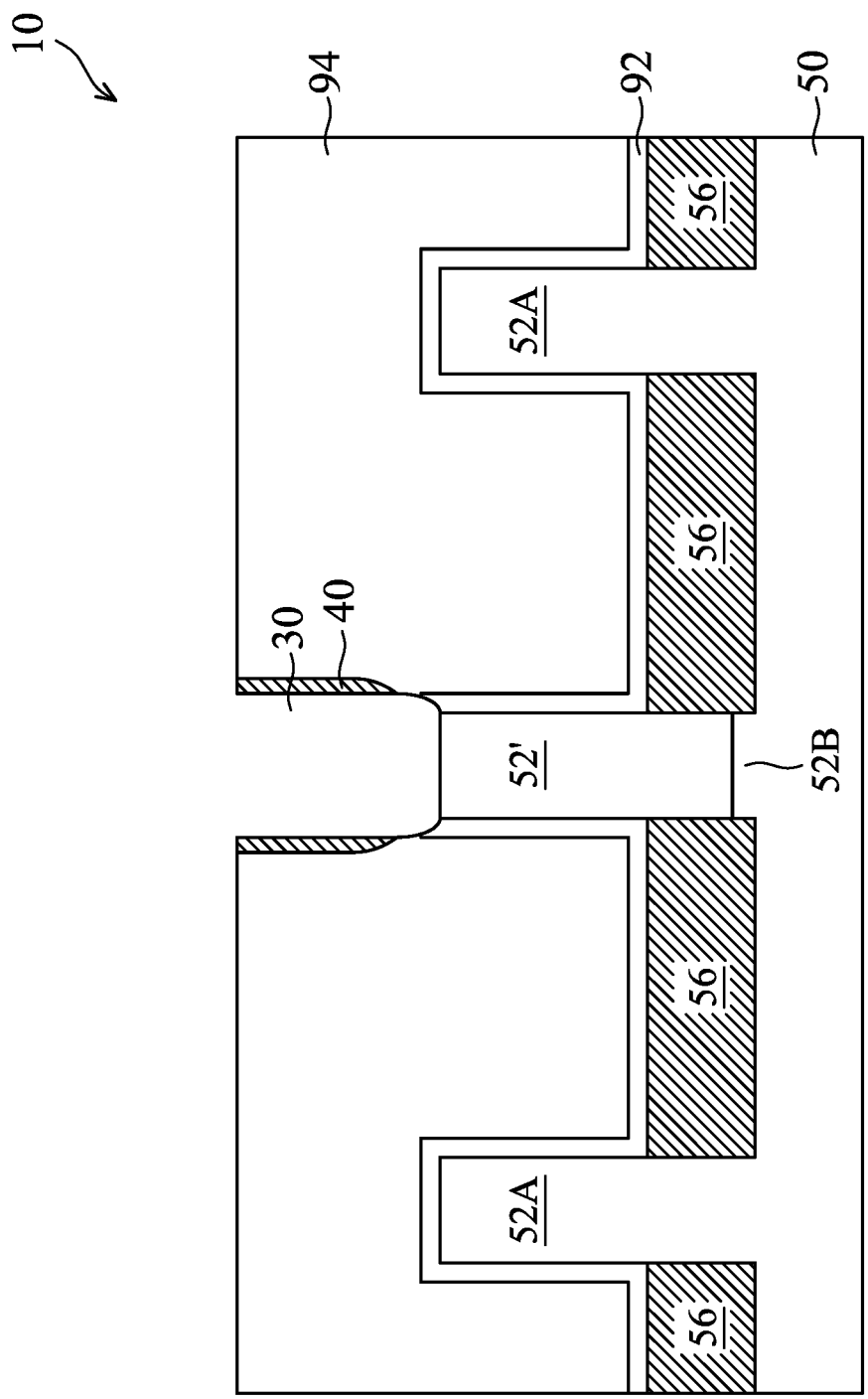

One or more cycles of a treatment process (e.g., as described above with respect to FIGS. 18A and 18B) and an etching process (e.g., as described above with respect to FIGS. 19A and 19B) may be applied to the opening 30 until a dummy fin 52' or an STI region 56 is exposed. FIGS. 34A and 34B illustrate the treatment process, and FIGS. 35A and 35B illustrate the etching process. As a result of the treatment process(es) of FIGS. 34A and 34B, passivation regions 40 may be formed in the gate electrodes 94. The passivation regions 40 may comprise a material of the gate electrode 94 and an element used during the treatment process(es). For example, the passivation regions 40 may comprise a metal oxide, a metal nitride, or the like.

Figure 36A:
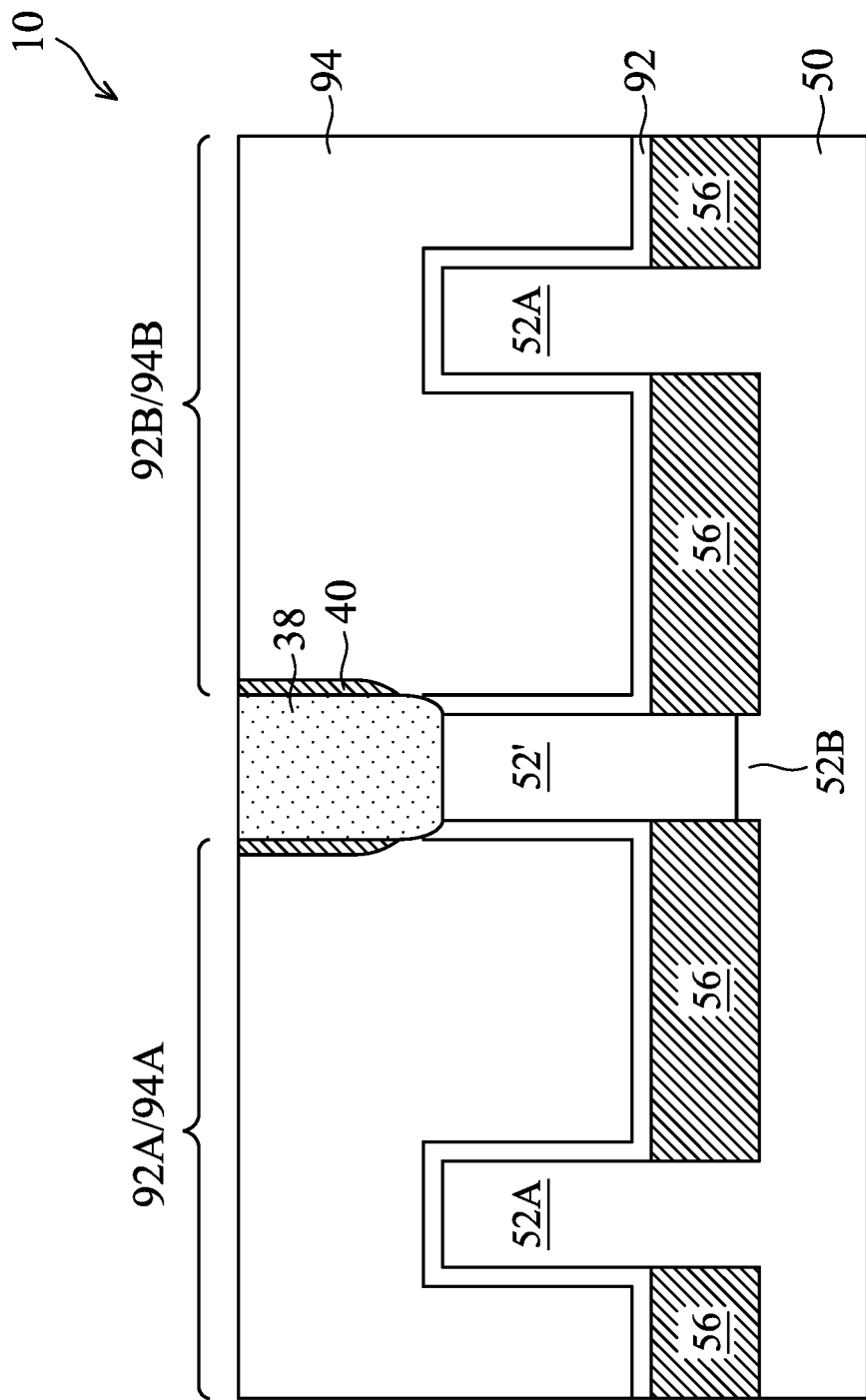
Figure 36D:
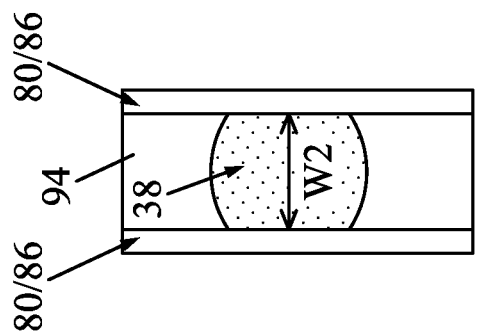
Figure 36C:
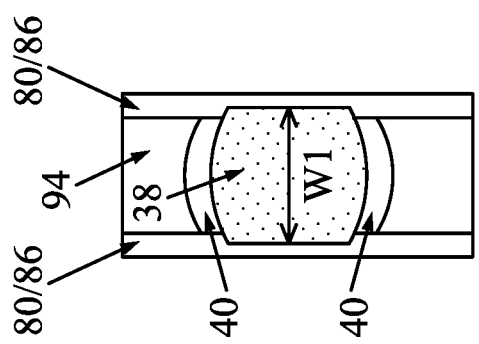
Figure 36B:
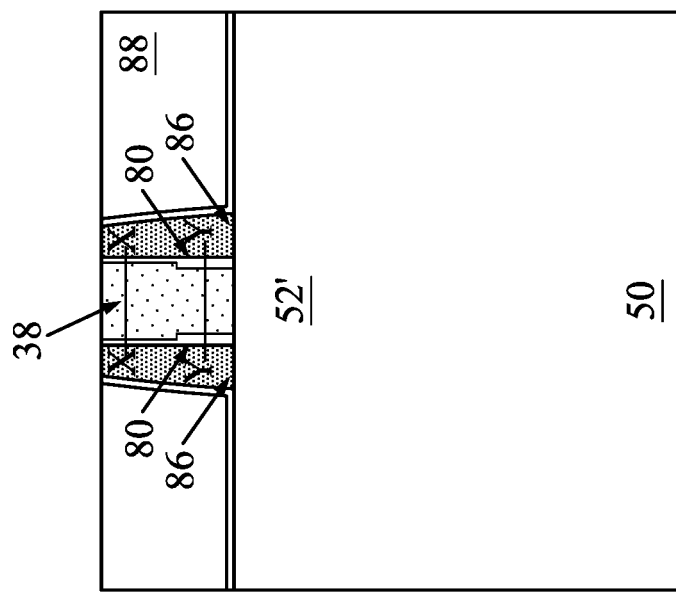

In FIGS. 36A and 36B, a dielectric material 38 may then be deposited in the opening 30 (e.g., as described above with respect to FIGS. 20A through 20D). The dielectric material 38 and the dummy fin 52' (if present) separate the gate stacks 92A/94A and 92B/94B of adjacent transistor devices. For example, the gate stack 92A/94A is arranged and separated from the gate stack 92B/94B in a channel width direction by the dielectric material 38 and the dummy fin 52' (if present). The passivation regions 40 may have a uniform material composition throughout and be disposed on sidewalls of the dielectric material 38. For example, the passivation regions 40 may separate portions of the dielectric material 38 from the gate electrode 94. FIG. 36C illustrates a top-down view of an upper portion of the dielectric material (e.g., taken along line X-X of FIG. 36B), and FIG. 36D illustrates a top-down view of a lower portion of the dielectric material 38 (e.g., taken along line Y-Y of FIG. 36B). As illustrated, the upper portion of the dielectric material 38 may have a width W1 that is wider than a width W2 of the lower portion of the dielectric material 38.

Figure 37A:
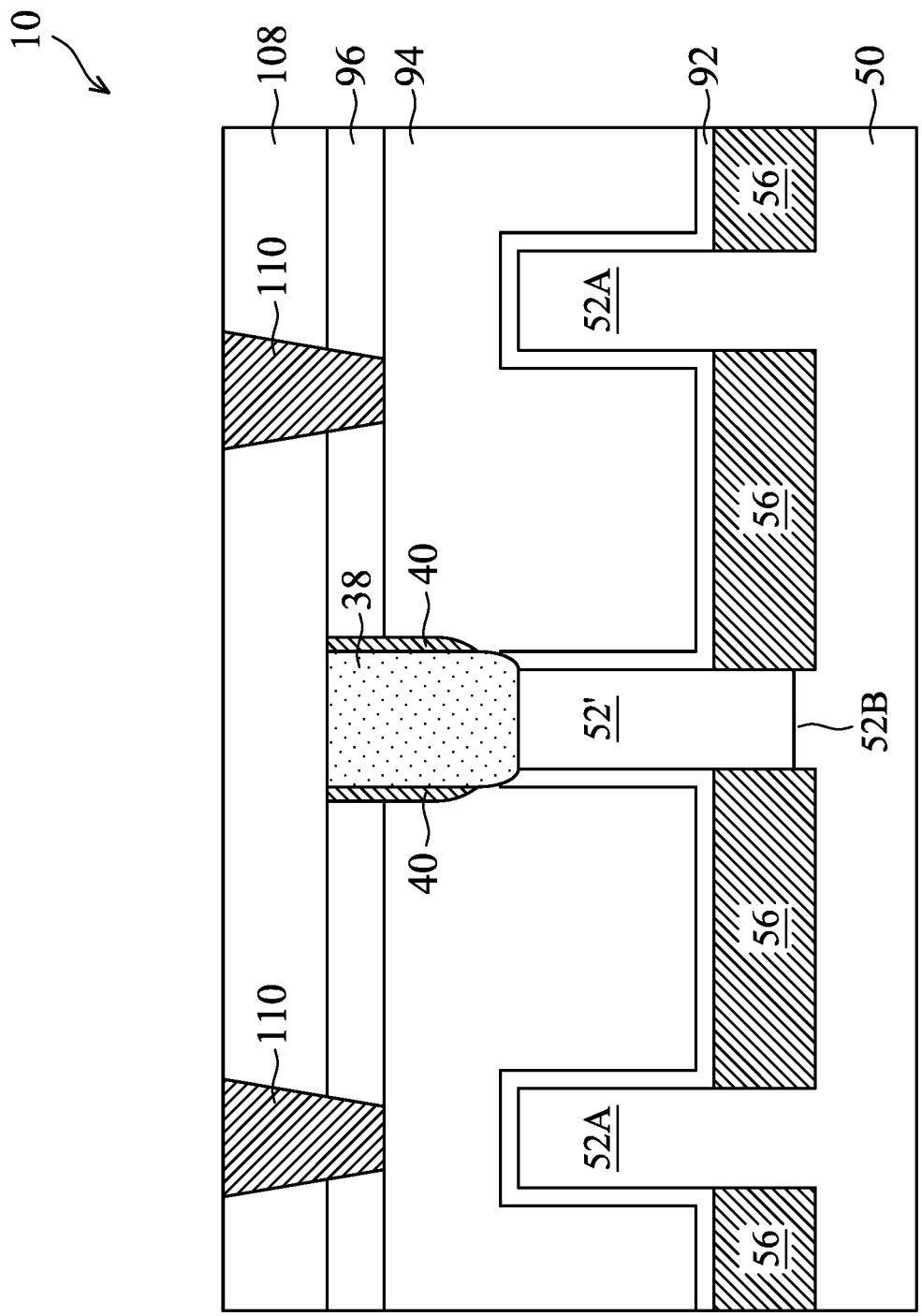
Figure 38A:
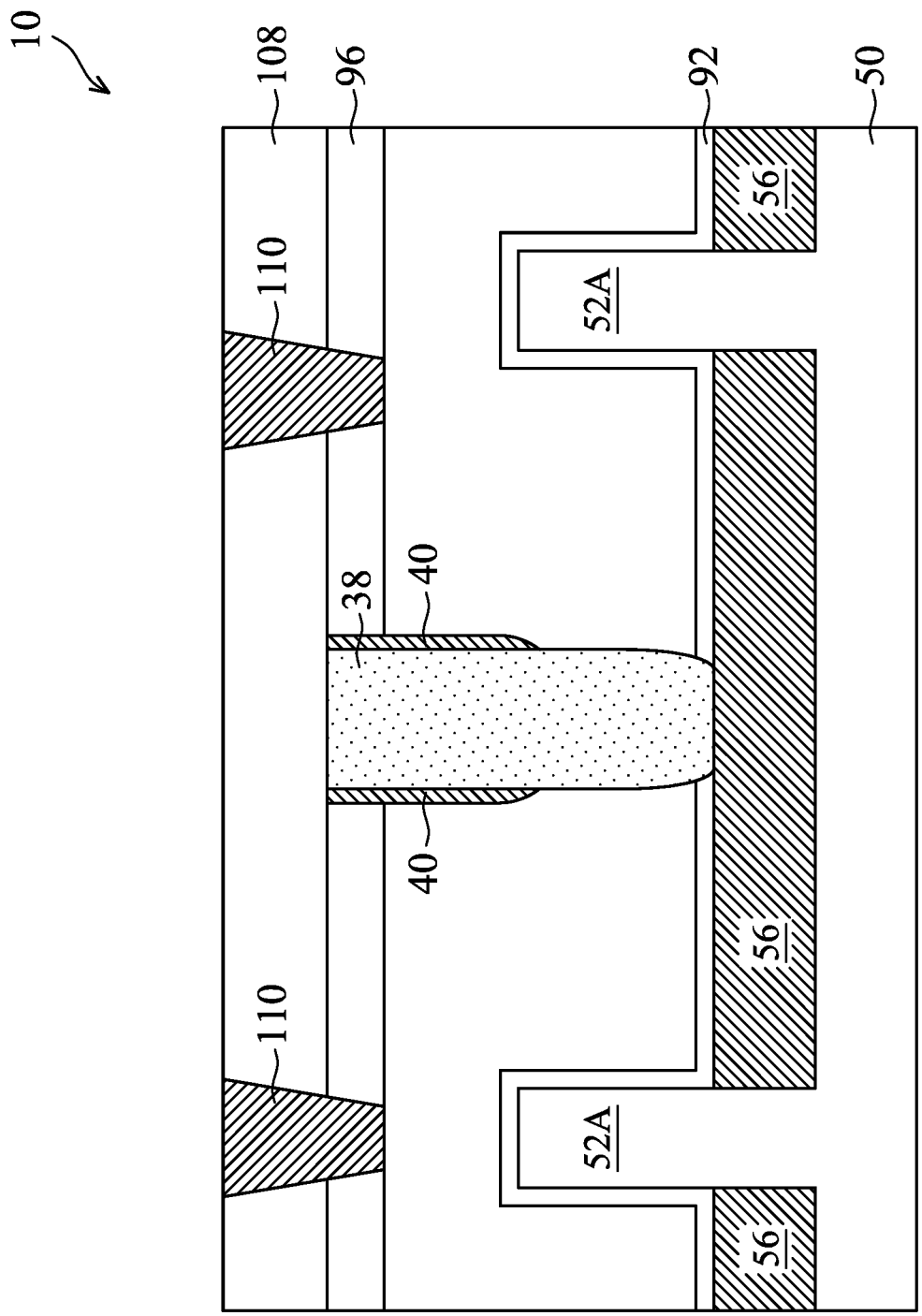

Similar processes as described above with respect to FIGS. 28A through 29B may be applied to recess the gate stack 92/94, form a gate mask layer 96 over the recessed gate stack 92/94, and form contacts to the transistor. The resulting structure is illustrated in FIGS. 37A and 37B. FIGS. 38A and 38B illustrate an alternative embodiment where the dummy fin 52' is excluded and the dielectric material 38 is formed after the gate stacks 92/94.

The disclosed FinFET embodiments could also be applied to nanostructure devices such as nanostructure (e.g., nanosheet, nanowire, gate-all-around, or the like) field effect transistors (NSFETs). In an NSFET embodiment, the fins are formed by patterning a stack of alternating layers of channel layers and sacrificial layers. Embodiments may include between two and ten channel layer/sacrificial layer pairs, for example. In some embodiments, a width of the stack may be in a range of about 30 Å to about 5000 Å, such as in a range of about 30 Å to about 3000 Å. The dummy gate stacks and source/drains are formed in a similar manner as described above. After the dummy gate stacks are removed, the sacrificial layers can be partially or fully removed in the channel regions. The replacement gate structures are formed in a similar manner as described above and will partially or completely surround the channel layers in the channel region of the NSFET devices. The ILDs and contacts to the gate structures and source/drains are formed in a similar manner as described above. A nanostructure device can be formed as disclosed in U.S. Patent Application Publication 2016/0365414, which is incorporated herein by reference in its entirety.

In various embodiments, a dielectric material may be used to separate metal gates of adjacent transistors. The dielectric material may be formed by patterning an opening in a dummy gate stack or a metal gate stack and filling the dielectric material in the opening. An upper portion of the opening may be widened, thereby improving a gap fill window of the dielectric material and reducing manufacturing defects. Further a lower portion of the opening may not be widened, and an effective gate width of the adjacent gate stacks may be maintained. In some embodiments, widening the upper portion of the opening may be achieved one or more cycles of treatment and etching processes. Accordingly, an atomic layer etch type process may be achieved to control effective gate width and enlarge the dielectric material gap fill window. Manufacturing defects can be reduced, and device performance can be improved.

In some embodiments, a device includes a semiconductor substrate and a first gate stack over the semiconductor substrate, the first gate stack being between a first gate spacer and a second gate spacer. The device further includes a second gate stack over the semiconductor substrate between the first gate spacer and the second gate spacer and a dielectric material separating the first gate stack from the second gate stack. The dielectric material is at least partially between the first gate spacer and the second gate spacer, a first width of an upper portion of the dielectric material is greater than a second width of a lower portion of the dielectric material, and a third width of an upper portion of the first gate spacer is less than a fourth width of a lower portion of the first gate spacer. In some embodiments, a fifth width of an upper portion of the second gate spacer is less than a sixth width of a lower portion of the second gate spacer. In some embodiments, the device further comprises a passivation region between the upper portion of the dielectric material and the first gate stack. In some embodiments, the passivation region comprises a metal oxide or a metal nitride. In some embodiments, the device further includes a dummy fin under the dielectric material, the dummy fin separating the first gate stack from the second gate stack. In some embodiments, the dielectric material extends to and contacts a shallow trench isolation (STI) region. In some embodiments, the dielectric material has sloped sidewalls. In some embodiments, the dielectric material has straight sidewalls that are perpendicular to a major surface of the semiconductor substrate. In some embodiments, the upper portion of the dielectric material is above the first gate spacer and the second gate spacer. In some embodiments, the upper portion of the first gate spacer contacts a sidewall of the upper portion of the dielectric material. In some embodiments, the first width is greater than a distance between a first sidewall of the first gate stack and a second sidewall of the first gate stack, the distance is measured along a channel length direction of the first gate stack.

In some embodiments, a device includes a first transistor at a top surface of a semiconductor substrate, the first transistor comprising: a first channel region; and a first gate stack over and along sidewalls of the first channel region; a second transistor at the top surface of the semiconductor substrate, the second transistor comprising: a second channel region; and a second gate stack over and along sidewalls of the second channel region; a dielectric material separating the first gate stack from the second gate stack in a channel width direction of the first transistor, the dielectric material comprising: a first portion having a first width; and a second portion over the first portion, the second portion having a second width greater than the first width; and a first passivation region between the second portion of the dielectric material and the first gate stack. In some embodiments, the device further includes a first gate spacer along first sidewalls of the first transistor, the second transistor, and the dielectric material; and a second gate spacer along second sidewalls of the first transistor, the second transistor, and the dielectric material. In some embodiments, the device further includes a dummy fin under and adjoining the dielectric material, the dummy fin separating the first gate stack from the second gate stack in the channel width direction of the first transistor.

In some embodiments, a method includes etching an opening in a gate stack, the opening exposing sidewalls of gate spacers, and the gate spacers being disposed on sidewalls of the gate stack; performing a treatment process in the opening, wherein the treatment process defines: a first passivation region in the sidewalls of the gate spacers; and a second passivation region in the gate stack; extending the opening through the gate stack using an etch process, the etching process removes the first passivation region; and after extending the opening through the gate stack, filling the opening with a dielectric material. In some embodiments, the gate stack comprises a metal gate electrode. In some embodiments, the gate stack is a dummy gate stack, and the method further comprises after filling the opening with the dielectric material, replacing the gate stack with a second gate stack. In some embodiments, extending the opening through the gate stack comprises exposing a dummy fin. In some embodiments, the etching process is a directional etch process. In some embodiments, the etching process is a selective etch that removes the first passivation region at a greater rate than the second passivation region.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A device comprising:
a semiconductor substrate;
a first gate stack over the semiconductor substrate;
a second gate stack over the semiconductor substrate;
an isolation structure between and contacting the first gate stack and the second gate stack, a first width of an upper portion of the isolation structure is greater than a second width of a lower portion of the isolation structure, the first width and the second width each being measured along a first cross-section perpendicular to a lengthwise dimension of the first gate stack, the first width being measured at a topmost surface of the isolation structure in the first cross-section, and the second width being measured at a bottommost surface of the isolation structure in the first cross-section; and
a first gate spacer on a first sidewall of the isolation structure, wherein a third width of a first upper portion of the first gate spacer is less than a fourth width of a first lower portion of the first gate spacer, the third width and the first width are each being measured along the first cross-section.

2. The device of claim 1, wherein the first upper portion of the first gate spacer contacts the isolation structure, wherein a second upper portion of the first gate spacer contacts the first gate stack, and wherein a fifth width of the second upper portion of the first gate spacer is greater than the third width, the fifth width being measured along a second cross-section perpendicular to the lengthwise dimension of the first gate stack and parallel to the first cross-section.

3. The device of claim 2, wherein the first lower portion of the first gate spacer contacts the isolation structure, wherein a second lower portion of the first gate spacer contacts the first gate stack, and wherein a sixth width of the second lower portion of the first gate spacer is equal to the fourth width, the sixth width being measured along the second cross-section.

4. The device of claim 3, wherein the fifth width is equal to the sixth width.

5. The device of claim 1, wherein the isolation structure comprises:
 a dielectric material contacting the first gate stack and the second gate stack.

6. The device of claim 5, wherein the isolation structure further comprises a passivation material between a sidewall of the dielectric material and the first gate stack.

7. The device of claim 5, wherein the dielectric material extends to a top surface of a shallow trench isolation (STI) region.

8. The device of claim 5, wherein the isolation structure further comprises:
 a dummy fin, wherein the dielectric material extends to a top surface of the dummy fin.

9. A device comprising:
 a first transistor at a top surface of a semiconductor substrate, the first transistor comprising a first gate stack;
 a second transistor at the top surface of the semiconductor substrate, the second transistor comprising a second gate stack;
 a dielectric material separating the first gate stack from the second gate stack in a channel width direction of the first transistor, the dielectric material comprising:
  a first portion having a first width measured in the channel width direction; and
  a second portion over the first portion, the second portion having a second width greater than the first width, the second width being measured in the channel width direction;
 a first passivation region between the second portion of the dielectric material that has the second width and the first gate stack; and
 a gate spacer on a sidewall of the dielectric material, wherein an upper portion of the gate spacer has a third width less than a fourth width of a lower portion of the gate spacer.

10. The device of claim 9, wherein the upper portion of the gate spacer is in physical contact with the second portion of the dielectric material, and the lower portion of the gate spacer is in physical contact with the first portion of the dielectric material.

11. The device of claim 9, wherein the first passivation region separates the second portion of the dielectric material from the first gate stack in the channel width direction of the first transistor, and the gate spacer is disposed in a cross-sectional view that is perpendicular to the channel width direction.

12. The device of claim 9 further comprising a second passivation region between the second portion of the dielectric material and the second gate stack.

13. The device of claim 9, wherein the first passivation region comprises oxygen or nitrogen.

14. The device of claim 13, wherein the first passivation region further comprises silicon.

15. The device of claim 13, wherein a gate electrode of the first gate stack comprises a metal, the first passivation region further comprises the metal.

16. A device comprising:
 a semiconductor substrate;
 first and second gate spacers on the semiconductor substrate, wherein a top surface of the first gate spacer is narrower than a bottom surface of the first gate spacer;
 a first gate stack between the first and second gate spacers;
 a second gate stack between the first and second gate spacers; and
 a dielectric material isolating the first gate stack from the second gate stack, the dielectric material being further disposed between the first gate spacer and the second gate spacer, a top surface of the dielectric material being wider than a bottom surface of the dielectric material.

17. The device of claim 16, wherein the dielectric material contacts the first gate stack and the second gate stack at the top surface of the dielectric material.

18. The device of claim 16 further comprising a passivation region between the dielectric material and the first gate stack.

19. The device of claim 16, wherein the dielectric material extends to a top surface of a shallow trench isolation (STI) region.

20. The device of claim 16 further comprising a dummy fin on a top surface of the semiconductor substrate, wherein the dielectric material extends to a top surface of the dummy fin.

* * * * *